United States Patent
Azami et al.

(10) Patent No.: US 6,750,792 B2
(45) Date of Patent: Jun. 15, 2004

(54) SERIAL-TO-PARALLEL CONVERSION CIRCUIT, AND SEMICONDUCTOR DISPLAY DEVICE EMPLOYING THE SAME

(75) Inventors: Munehiro Azami, Atsugi (JP); Mitsuaki Osame, Atsugi (JP); Yutaka Shionoiri, Atsugi (JP); Shou Nagao, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/320,491

(22) Filed: Dec. 17, 2002

(65) Prior Publication Data

US 2003/0122695 A1 Jul. 3, 2003

Related U.S. Application Data

(62) Division of application No. 09/493,682, filed on Jan. 28, 2000, now Pat. No. 6,512,469.

(30) Foreign Application Priority Data

Jan. 28, 1999 (JP) .......................................... 11-019427
Mar. 23, 1999 (JP) .......................................... 11-077872

(51) Int. Cl.[7] .............................................. H03M 9/00
(52) U.S. Cl. ..................... 341/100; 341/101; 327/415; 345/502
(58) Field of Search ................. 341/100, 101; 327/407, 415; 345/502

(56) References Cited

U.S. PATENT DOCUMENTS

| | | | |
|---|---|---|---|
| 3,885,167 A | * 5/1975 | Berglund | ..................... 327/416 |
| 5,101,202 A | * 3/1992 | Chaisemartin et al. | ...... 341/100 |
| 5,168,270 A | 12/1992 | Masumori et al. | |
| 5,218,363 A | * 6/1993 | LeCroy et al. | ............... 341/100 |

(List continued on next page.)

FOREIGN PATENT DOCUMENTS

| | | |
|---|---|---|
| EP | 0 458 169 | 11/1991 |
| EP | 0 759 664 | 2/1997 |
| EP | 0 938 074 | 1/1998 |
| EP | 0 843 418 | 5/1998 |
| EP | 0 921 517 | 8/1998 |
| FR | 2 729 528 | 7/1996 |
| JP | 07-130652 | 5/1995 |
| JP | 07-135318 | 5/1995 |
| JP | 08-078329 | 3/1996 |
| JP | 10-092576 | 4/1997 |
| JP | 11-167373 | 6/1999 |
| JP | 11-231798 | 8/1999 |
| TW | 329005 | 4/1998 |
| WO | WO 90/13148 | 4/1990 |

OTHER PUBLICATIONS

Hermann Schenk et al., "Polymers for Light Emitting Diodes," EuroDisplay 99 The 19th International Display Research Conference Proceedings, Sep. 6–9, 1999, pp. 33–37.

Furue et al., "Characteristics and Driving Scheme of Polymer–Stabilized Monostable FLCD Exhibiting Fast Response Time and High Contrast Ratio with Gray–Scale Capability," SID 98 Digest, pp. 782–785.

Yoshida et al., "A Full–Color Thresholdless Antiferroelectric LCD Exhibiting Wide Viewing Angle With Fast Response Time," SID 97 Digest, pp. 841–844.

(List continued on next page.)

*Primary Examiner*—Howard L. Williams
(74) *Attorney, Agent, or Firm*—Eric J. Robinson; Robinson Intellectual Property Law Office, P.C.

(57) ABSTRACT

In a serial-to-parallel conversion (SPC) circuit for digital data which converts the digital data serially inputted, into parallel digital data, and which outputs the parallel digital data; clock signals at frequencies which are, at the highest, ½ of the frequency of the input digital data are employed for operating the SPC circuit, whereby the SPC circuit is improved in power dissipation, stability and reliability.

8 Claims, 29 Drawing Sheets

U.S. PATENT DOCUMENTS

| | | | |
|---|---|---|---|
| 5,247,190 A | | 9/1993 | Friend et al. |
| 5,396,236 A | * | 3/1995 | Ueda .......................... 345/656 |
| 5,399,502 A | | 3/1995 | Friend et al. |
| 5,563,597 A | | 10/1996 | McCartney |
| 5,594,569 A | | 1/1997 | Konuma et al. |
| 5,643,826 A | | 7/1997 | Ohtani et al. |
| 5,648,277 A | | 7/1997 | Zhang et al. |
| 5,721,545 A | | 2/1998 | Poplevine |
| 5,774,079 A | | 6/1998 | Zirngibl |
| 5,923,962 A | | 7/1999 | Ohtani et al. |
| 6,018,305 A | | 1/2000 | Kikuchi et al. |
| 6,097,323 A | | 8/2000 | Koga et al. |
| 6,175,885 B1 | | 1/2001 | Marbot et al. |
| 6,177,891 B1 | | 1/2001 | Nakamura |
| 6,184,808 B1 | | 2/2001 | Nakamura |
| 6,420,988 B1 | | 7/2002 | Azami et al. |
| 6,512,469 B1 | * | 1/2003 | Azami et al. ................ 341/100 |

OTHER PUBLICATIONS

Inui et al., "Thresholdless Antiferroelectricity in Liquid Crystals and Its Application to Displays," J. Mater. Chem., 1966, 6(4), pp. 671–673.

Azami et al., "Translation of FPD Intelligence 1999," pp. 76–79, Oct. 15, 1999, vol. 11.

English Abstract of PCT Patent No. WO 97/32295, Published: Sep. 4, 1997.

Koyama et al., "A 4.0–in. Poly Si TFT–LCD with Integrated 6–bit Digital Data Driver Using CGS Technology", pp. 29–32, Jul. 1, 1999. AM–LCD '99.

Ohtani et al., "LP–B: Late–News Poster: A 60–in. HDTV Rear–Projector with Continuous–Grain–Silicon Technology", pp. 467–470, May 1, 1998, SID 98 Digest.

Matsueda et al., "30.1: A 6–bit–Color VGA Low–Temperature Poly–Si TFT–LCD with Integrated Digital Data Drivers", pp. 879–882, Jan. 1, 1998, SID 98 Digest.

Koyama et al., "30.2: A 4.5 in. Full–Color VGA Poly TFT–LCD with Integrated Drivers", pp. 883–886, Jan. 1, 1998, SID 98 Digest.

Osame et al., "40.1: A 2.6–in. poly–Si TFT–LCD HDTV Display with Monolithic Integrated 8–bit Digital Data Drivers", pp. 1059–1062, Jan. 1, 1998, SID 98 Digest.

Azami et al., "4.1: A 2.6–in. DTV TFT–LCD with Area–Reduced Integrated 8–bit Digital Data Drivers Using 400–Mobility CGS Technology", pp. 6–9, Jan. 1, 1999, SID 99 Digest.

Matsueda et al., "4.2: Low–Temperature Poly–Si TFT–LCD with Integrated 6–bit Digital Data Drivers", pp. 21–24, Jan. 1, 1996, SID 96 Digest.

Specification, Claims, Drawings and Abstract of U.S. application Ser. No. 09/206,297 entitled Signal Dividing Circuit and Semiconductor Device filed Dec. 7, 1998.

Specification, Claims, Drawings and Abstract of U.S. application Ser. No. 09/162,230 entitled Semiconductor Display Device and Method of Driving the Same filed Sep. 29, 1998.

* cited by examiner

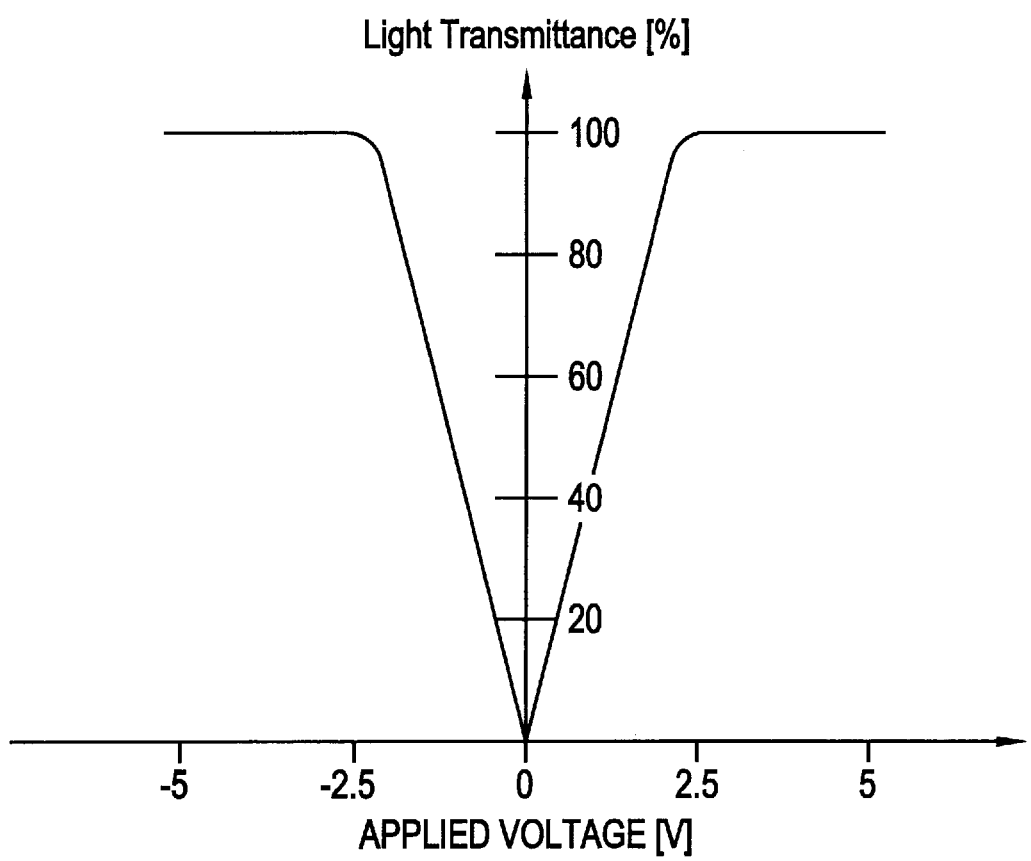

SERIAL-TO-PARALLEL CONVERSION CIRCUIT, AND SEMICONDUCTOR DISPLAY DEVICE EMPLOYING THE SAME

This application is a division of previously filed application Ser. No. 09/493,682 filed Jan. 28, 2000, now U.S. Pat. No. 6,512,469 B1, from which priority is claimed under 35 U.S.C. §120.

BACKGROUND OF THE INVENTION

1. Field of the Invention

The present invention relates to a serial-to-parallel conversion (SPC) circuit for converting the serial digital data into the parallel digital data. It also relates to a semiconductor device including the SPC circuit.

2. Description of the Related Art

An example of a semiconductor device whose input signals are digital data, is a liquid crystal display device of active matrix type. In recent years, the active matrix type liquid crystal display device has come to be constructed of a plurality of TFTs (thin film transistors) formed from polycrystalline silicon, and to be unitarily formed with an active matrix circuit for displaying an image and driver circuits for driving the active matrix circuit.

A serial-to-parallel conversion (SPC) circuit for digital data receives the inputs of digital data (hereinbelow, termed "input digital data") as the input signals, and feeds the source signal line driver circuit of the active matrix type liquid crystal display device with digital data modified by temporally expanding the pulse length of the input digital data (the pulse length may be expanded any times, but it is most commonly expanded n times where letter n denotes a natural number of at least 2). The temporal expansion of the pulse length of the input digital data to n times is nothing but lowering the frequency of the input digital data to 1/n.

The SPC circuit for digital data has significance as stated below. The digital data to be inputted to the active matrix type liquid crystal display device are ordinarily at several tens MHz, but the digital data at one hundred and several tens MHz might be generalized in compliance with recent requirements for a higher definition, a higher resolution and more gradations.

Nevertheless, the TFTs included in the source signal line driver circuit of the active matrix type liquid crystal display device have had performances insufficient for processing the digital data of such a higher frequency, and they have been incapable of operating or have had difficulty in reliability. It is accordingly indispensable to lower the frequency of the input digital signals down to the degree at which the source signal line driver circuit is capable of operating to perfection. In this regard, the SPC circuit for digital data functions to lower the frequency of the input digital data. Incidentally, the scale of the SPC circuit for digital data is smaller as compared with that of the source signal line driver circuit, and a clock signal within the SPC circuit is less liable to become "dull" (as a signal delay at the rise or fall of the pulse of the clock signal), so that the SPC circuit can be driven at a higher speed.

As stated above, the SPC circuit for digital data can be driven faster than the source signal line driver circuit etc. The faster operation of the SPC circuit, however, has been somewhat objectionable in the points of reliability and stability in complying with the recent requirements for a higher definition, a higher resolution and more gradations.

An example of the SPC circuit for digital data having hitherto been used by the inventors is an SPC circuit for digital data disclosed in Japanese Patent Application Laid-open No. 11-231798 (1999), assigned to the same assignee as that of the present application. The Japanese Patent Application corresponds to a U.S. patent application Ser. No. 09/206,297 and a European Patent Application Laid-open No. 0 921 517 A.

The exemplified SPC circuit for digital data necessitates for its operation a clock signal at the same frequency as that of the input digital data. By way of example, in order to convert the serially inputted digital data of 80 MHz into eight parallel digital data, the SPC circuit is normally fed with the clock signal of 80 MHz. The operation has been problematic in power dissipation, stability, reliability, etc.

SUMMARY OF THE INVENTION

The present invention has been made in view of the above problems, and has for its object to provide a novel serial-to-parallel conversion (SPC) circuit for digital data that is excellent in power dissipation, stability and reliability.

The constructions of an SPC circuit and a semiconductor display device including the SPC circuit, according to the present invention, will be summarized below.

According to the present invention; a serial-to-parallel conversion (SPC) circuit for digital data converts the digital data inputted serially at m Hz into $2^y$ parallel digital data of $(m \cdot 2^{-y})$ Hz and outputs the $2^y$ parallel digital data (where letter m denotes a positive number, and letter y denotes a natural number), the serial-to-parallel conversion circuit for digital data operates with a plurality of clock signals of, at the highest, (m/2) Hz.

In this manner, the SPC circuit of the present invention is permitted to operate with the clock signals at frequencies of, at the highest, ½ of the frequency of the digital data to-be-inputted.

By the way, in this specification, the frequencies of clock signals and digital signals will be often stipulated, but they shall be rough frequencies that cover equivalent frequencies.

Also, according to the present invention; a serial-to-parallel conversion (SPC) circuit for digital data converts the digital data inputted serially at m Hz into $2^y$ parallel digital data of $(m \cdot 2^{-y})$ Hz and outputs the $2^y$ parallel digital data (where letter m denotes a positive number, and letter y denotes a natural number), the serial-to-parallel conversion circuit for digital data operates with a plurality of clock signals of, at the highest, (m/2) Hz and at the lowest, $(m \cdot 2^{-y})$ Hz.

Besides, according to the present invention: a serial-to-parallel conversion (SPC) circuit for digital data converts digital data of respective bits of the x-bit digital data inputted serially at m Hz into $2^y$ parallel digital data of $(m \cdot 2^{-y})$ Hz and outputs the $2^y$ parallel digital data (where letter m denotes a positive number, and letters x and y denote natural numbers); the serial-to-parallel conversion circuit for digital data comprises x SPC/bit circuits to which the digital data of the respective bits of said x-bit digital data are inputted, each of said SPC/bit circuits includes first stage through y-th stage circuits, the y-th stage circuit lowers the frequency of $2^{y-1}$ digital data inputted serially to ½ and converts the $2^{y-1}$ digital data into the $2^y$ parallel digital data.

In addition, according to the present invention: a serial-to-parallel conversion (SPC) circuit for digital data converts digital data of respective bits of the x-bit digital data inputted serially at m Hz into $2^y$ parallel digital data of $(m \cdot 2^{-y})$ Hz and outputs the $2^y$ parallel digital data (where letter m denotes a positive number, and letters x and y denote natural numbers); the serial-to-parallel conversion circuit for digital data comprises x SPC/bit circuits to which the digital data of the respective bits of said x-bit digital data are inputted, each of said SPC/bit circuits includes basic units in a number indicated by Formula (1) given below, each of said basic units in the number indicated by Formula (1) lowers a frequency of digital data inputted serially to ½ and converts the digital data inputted serially into two parallel digital data.

$$\sum_{k=1}^{y} 2^{k-1} \qquad (1)$$

Yet in addition, according to the present invention: a semiconductor display device having an active matrix circuit in which pixel TFTs are arranged in a matrix shape, a source signal line driver circuit and a gate signal line driver circuit which drive the active matrix circuit, and a serial-to-parallel conversion circuit for digital data which converts the digital data inputted serially at m Hz into $2^y$ parallel digital data of $(m \cdot 2^{-y})$ Hz and outputs the $2^y$ parallel digital data (where letter m denotes a positive number, and letter y denotes a natural number); the semiconductor display device operates with a plurality of clock signals of, at the highest, (m/2) Hz.

Further, according to the present invention: a semiconductor display device having an active matrix circuit in which pixel TFTs are arranged in a matrix shape, a source signal line driver circuit and a gate signal line driver circuit which drive the active matrix circuit, and a serial-to-parallel conversion circuit for digital data which converts the digital data inputted serially at m Hz into $2^y$ parallel digital data of $(m \cdot 2^{-y})$ Hz and outputs the $2^y$ parallel digital data (where letter m denotes a positive number, and letter y denotes a natural number); the semiconductor display device operates with a plurality of clock signals of, at the highest, (m/2) Hz and at the lowest, $(m \cdot 2^{-y})$ Hz.

Still further, according to the present invention: a semiconductor display device having an active matrix circuit in which pixel TFTs are arranged in a matrix shape, a source signal line driver circuit and a gate signal line driver circuit which drive the active matrix circuit, and a serial-to-parallel conversion circuit for digital data which converts digital data of respective bits of the x-bit digital data inputted serially at m Hz into $2^y$ parallel digital data of $(m \cdot 2^{-y})$ Hz and outputs the parallel digital data (where letter m denotes a positive number, and letter y denotes a natural number); the serial-to-parallel conversion circuit for digital data includes x SPC/bit circuits to which the digital data of the respective bits of said x-bit digital data are inputted, each of said SPC/bit circuits includes first stage through y-th stage circuits, the y-th stage circuit lowers a frequency of the $2^{y-1}$ digital data inputted serially to ½ and converts the $2^{y-1}$ digital data into the $2^y$ parallel digital data.

Yet further, according to the present invention: a semiconductor display device having an active matrix circuit in which pixel TFTs are arranged in a matrix shape, a source signal line driver circuit and a gate signal line driver circuit which drive the active matrix circuit, and a serial-to-parallel conversion circuit for digital data which converts digital data of respective bits of the x-bit digital data inputted serially at m Hz into $2^y$ parallel digital data of (m·2−y) Hz and outputs the $2^y$ parallel digital data (where letter m denotes a positive number, and letters x and y denote natural numbers); the serial-to-parallel conversion circuit for digital data includes x SPC/bit circuits to which the digital data of the respective bits of said x-bit digital data are inputted, each of said SPC/bit circuits includes basic units in a number indicated by Formula (1) given below, each of said basic units in the number indicated by Formula (1) lowers a frequency of digital data inputted serially to ½ and converts the digital data inputted serially into two parallel digital data.

$$\sum_{k=1}^{y} 2^{k-1} \qquad (1)$$

BRIEF DESCRIPTION OF THE DRAWINGS

FIG. 24 is a graph showing the applied voltage—light transmittance characteristics of a thresholdless mixed antiferroelectric liquid crystal;

PREFERRED EMBODIMENTS OF THE INVENTION

Now, a serial-to-parallel conversion (SPC) circuit for digital data according to the present invention will be described in conjunction with embodiments. The SPC circuit of the present invention, however, shall not be restricted to the ensuing embodiments.
(Embodiment 1)

Figure 1:
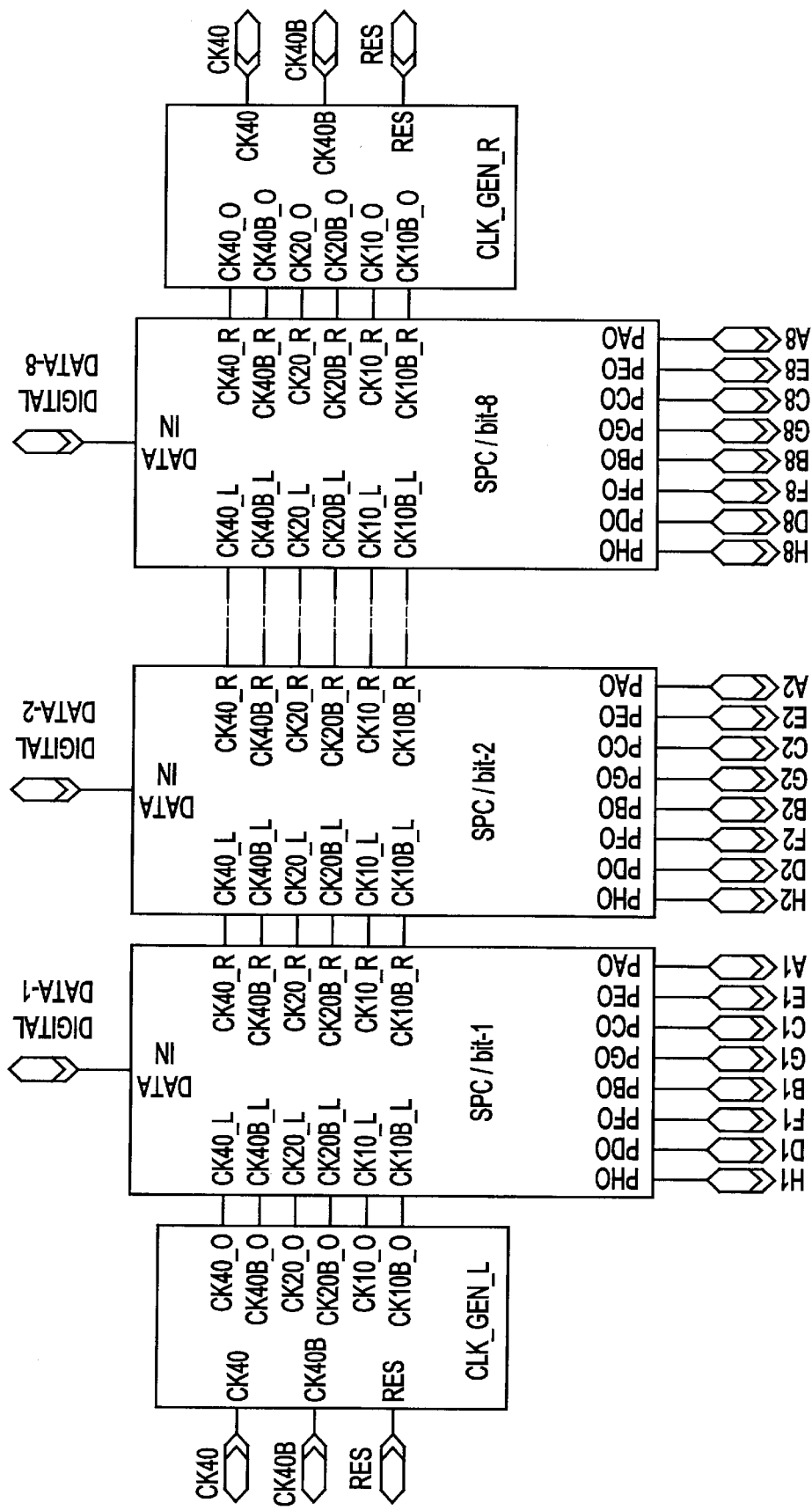
FIG. 1 is a block diagram of a serial-to-parallel conversion (SPC) circuit for digital data in Embodiment 1.

One embodiment of the serial-to-parallel conversion (SPC) circuit for digital data according to the present invention will be described with reference to FIG. 1. In FIG. 1, the circuit arrangement of the SPC circuit for 8-bit digital data in this embodiment is illustrated by a block diagram. The SPC circuit for 8-bit digital data in this embodiment converts digital data of 8 bit (DIGITAL DATA-1 (LSB) through DIGITAL DATA-8 (MSB)) serially inputted at 80 MHz into parallel, and outputs eight parallel digital data of 10 MHz per bit.

In the SPC circuit of this embodiment shown in FIG. 1, symbols CLK_GEN_L and CLK_GEN_R denote clock generator circuits, each of which generates a plurality of clock signals required for the operation of the SPC circuit. The clock generator circuits CLK_GEN_L and CLK_GEN_R may be either parts of the SPC circuit of the present invention or the external circuits thereof. In this embodiment, a clock signal of 40 MHz (CK40) and an inverted clock signal (CK40B) being the inverted signal of the former signal are inputted to each of the clock generator circuits CLK_GEN_L and CLK_GEN_R from outside the SPC circuit. In this manner, the frequency of the clock signal may be ½ of the frequency (80 MHz in this embodiment) of the digital data that are externally inputted. This is one of the features of the SPC circuit of the present invention.

In addition, a reset signal (RES) is fed to the clock generator circuits CLK_GEN_L and CLK_GEN_R. The operation of the SPC circuit of this embodiment is started by the pulse inputs of the reset signal.

Each of the clock generator circuits CLK_GEN_L and CLK_GEN_R generates clock signals of 20 MHz and 10 MHz on the basis of the clock signal of 40 MHz externally inputted, and it feeds the generated clock signals and the inverted clock signals thereof to an SPC/bit circuit to be explained later. A clock signal of 40 MHz is delivered from the output node CK40_O of each of the clock generators CLK_GEN_L and CLK_GEN_R shown in FIG. 1, while the inverted clock signal thereof is delivered from the output node CK40B_O. In addition, the clock signal of 20 MHz is delivered from the output node CK20_O of each generator, and the inverted clock signal thereof from the output node CK20B_O. Further, the clock signal of 10 MHz is delivered from the output node CK10_O of each generator, and the inverted clock signal thereof from the output node CK10B_O By the way, in this embodiment, the two clock generators CLK_GEN_L and CLK_GEN_R are employed, but only one of them may well be used.

The SPC/bit circuit is a circuit corresponding to one-bit of the digital data. In this embodiment, eight SPC/bit circuits (SPC/bit-1 circuit through SPC/bit-8 circuit) are included in the SPC circuit for the digital data. Since the SPC circuit of this embodiment deals with the digital data of 8 bits (DIGITAL DATA-1 (LSB) through DIGITAL DATA-8 (MSB)), the bit data (DIGITAL VIDEO-1 through DIGITAL VIDEO-8) of the digital data are respectively inputted to the SPC/bit-1 circuit through SPC/bit-8 circuit.

The SPC/bit circuit converts the digital data serially inputted at 80 MHz per bit into parallel and outputs eight parallel digital data at 10 MHz, on the basis of the clock signals (CK40, CK40B, CK20, CK20B, CK10 and CK10B) fed from the clock generator CLK_GEN.

Figure 2:
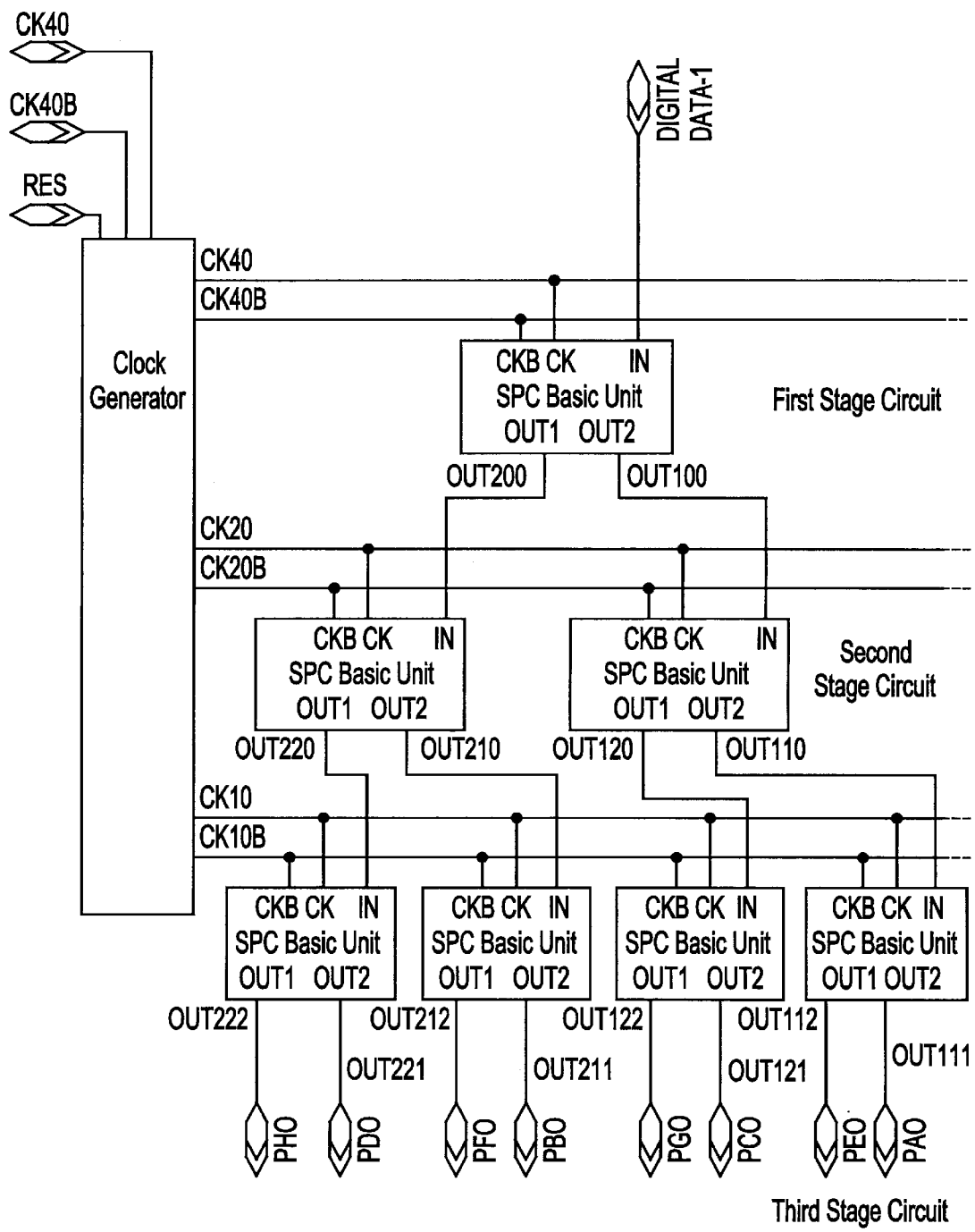
FIG. 2 is a diagram showing the circuit arrangements of a clock generator and an SPC/bit circuit in the SPC circuit of Embodiment 1.

Here, the SPC/bit circuit that is the constituent of the SPC circuit of this embodiment will be described with reference to FIG. 2. FIG. 2 illustrates the clock generator CLK_GEN_L and the SPC/bit-1 circuit to which the least significant bit of the digital data (DIGITAL DATA-1) is inputted, in the SPC circuit of this embodiment. Incidentally, each of the SPC/bit circuits to which the digital data (DIGITAL DATA-2 through DIGITAL DATA-8) are respectively inputted is substantially the same as the SPC/bit-1 circuit shown in FIG. 2.

As shown in FIG. 2, in this embodiment, the SPC/bit-1 circuit has a first stage circuit (Stage 1), a second stage circuit (Stage 2) and a third stage circuit (Stage 3).

The SPC/bit-1 circuit includes seven SPC basic units. More specifically, the first stage circuit includes one SPC basic unit, the second stage circuit includes two SPC basic units, and the third stage circuit includes four SPC basic units.

The SPC basic unit of the first stage circuit is fed with the clock signal of 40 MHz (CK40) and the inverted clock signal thereof (CK40B) from the clock generator CLK_GEN_L or CLK_GEN_R. The digital data of 80 MHz is inputted to the input node (IN) of the SPC basic unit of the first stage from outside the SPC circuit. The 8-bit digital data of 80 MHz of the least significant bit (DIGITAL DATA-1) is inputted from outside to the input node (IN) of the SPC basic unit of the first stage circuit of the SPC/bit-1 circuit shown in FIG. 2. Digital data of 40 MHz are delivered from the output nodes OUT1 and OUT2 of the SPC basic unit of the first stage circuit to the respectively corresponding input nodes (IN) of the two SPC basic units of the second stage circuit.

The two SPC basic units of the second stage circuit are fed with the clock signal of 20 MHz (CK20) and the inverted clock signal thereof (CK20B) from the clock generator CLK_GEN_L or CLK_GEN_R. Digital data of 20 MHz are delivered from the output nodes OUT1 and OUT2 of the SPC basic units of the second stage circuit to the respectively corresponding input nodes (IN) of the four SPC basic units of the third stage circuit.

The four SPC basic units of the third stage circuit are fed with the clock signal of 10 MHz (CK10) and the inverted clock signal thereof (CK10B) from the clock generator CLK_GEN_L or CLK_GEN_R. Digital data of 10 MHz are delivered from the output nodes OUT1 and OUT2 of the respective SPC basic units of the third stage circuit.

By the way, operations similar to the above are performed also in the SPC/bit-2 through SPC/bit-8 circuits to which the digital data (DIGITAL DATA-2 through DIGITAL DATA-8) of the remaining seven bits are respectively inputted, so that the digital data of 10 MHz are delivered from the output nodes OUT1 and OUT2 of the respective SPC basic units of the third stage circuits of all the SPC/bit circuits.

Figure 3:
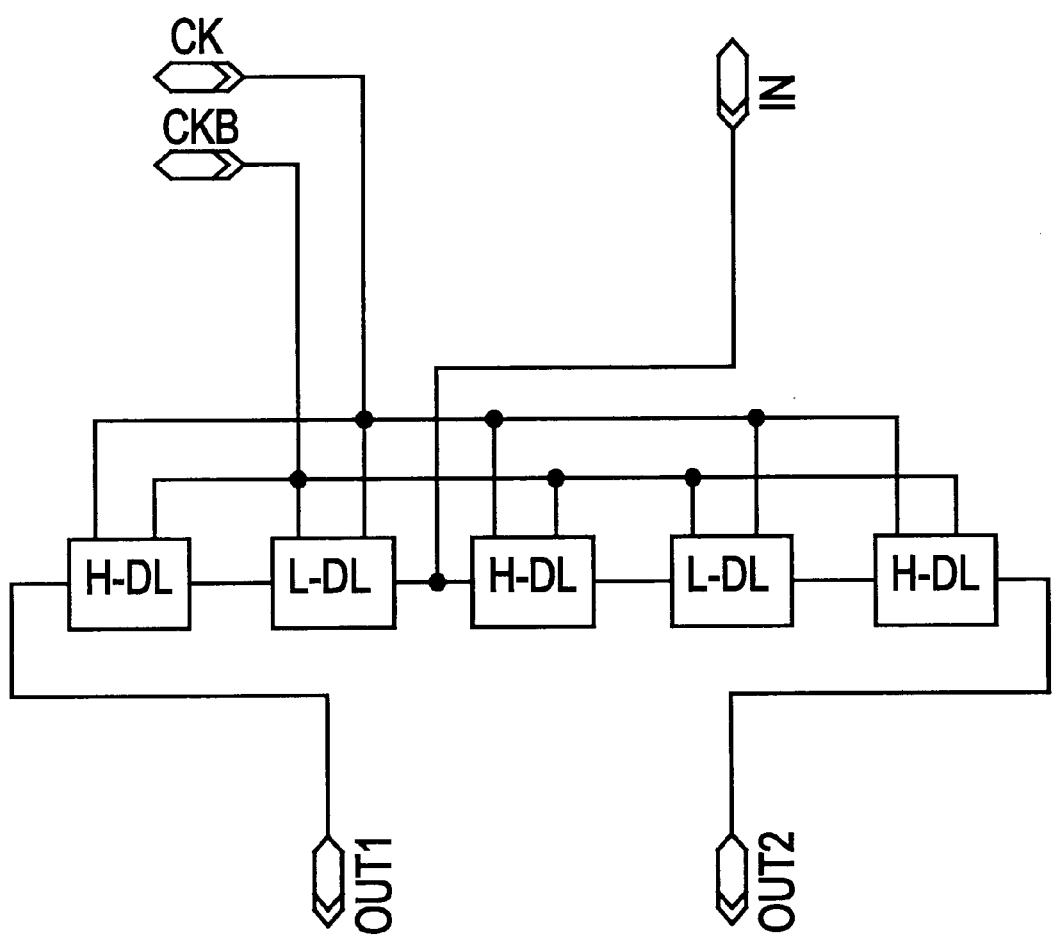
FIG. 3 is a diagram showing the circuit arrangement of an SPC basic unit in the SPC circuit of Embodiment 1.

Here, the circuit arrangement of the SPC basic unit constituting the SPC/bit circuit of the SPC circuit of this embodiment will be described with reference to FIG. 3. In FIG. 3, the circuit arrangement of one SPC basic unit is illustrated in blocks. Here in this embodiment, any of the SPC basic units has the arrangement just as shown in FIG. 3. Since, however, the SPC basic units of the respective stage circuits differ in their operating frequencies, they may well be configured of transistors having different characteristics.

In the SPC basic unit shown in FIG. 3, symbols H-DL and L-DL denote latch circuits called "D-latch circuits". The latch circuit H-DL is the D-latch circuit that latches an input signal (IN) when an inputted latch signal is Hi (high), whereas the latch circuit L-DL is the D-latch circuit that latches an input signal (IN) when the inputted latch signal is Lo (low).

Here, the circuit arrangements of the D-latch circuits H-DL and L-DL in this embodiment will be described with reference to FIGS. 4A, 4B and 4C. It is also allowed, however, to employ D-latch circuits other than those illustrated in FIGS. 4A, 4B and 4C.

Figure 4A:
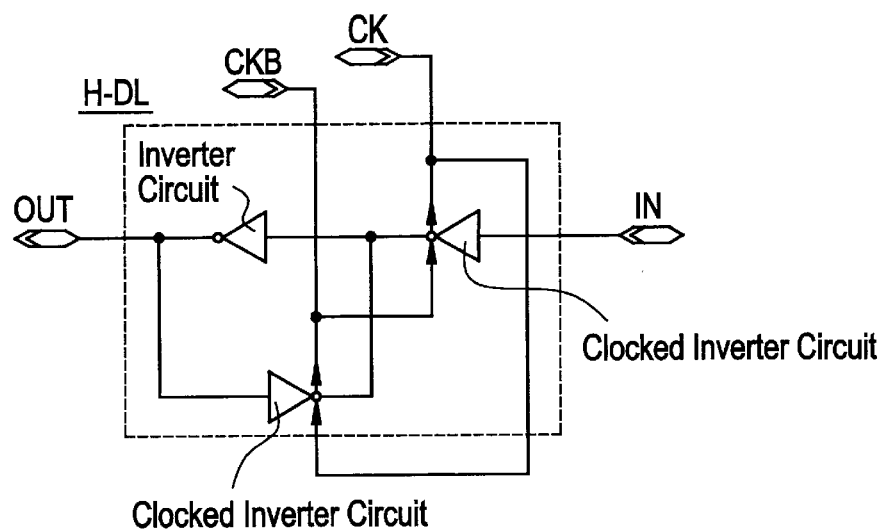
FIGS. 4A, 4B and 4C are diagrams showing the circuit arrangements of D-latch circuits in the SPC circuit of Embodiment 1.
Figure 4B:
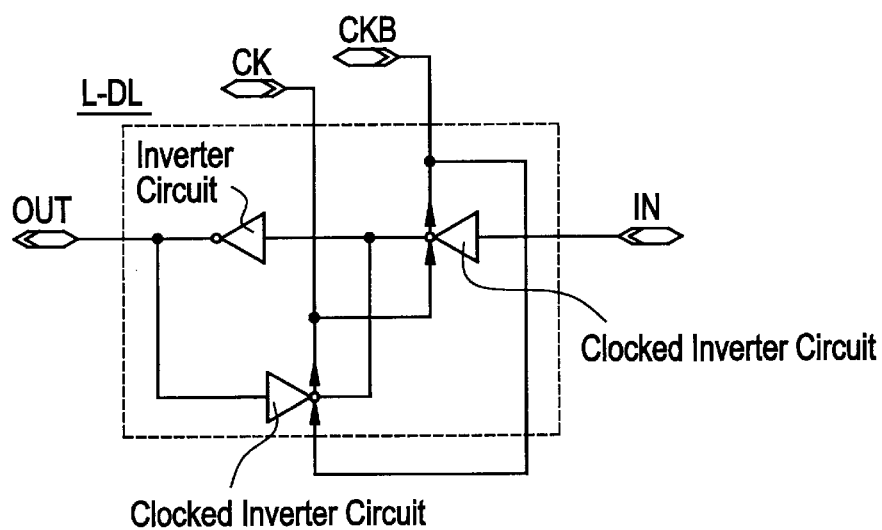
Figure 4C:
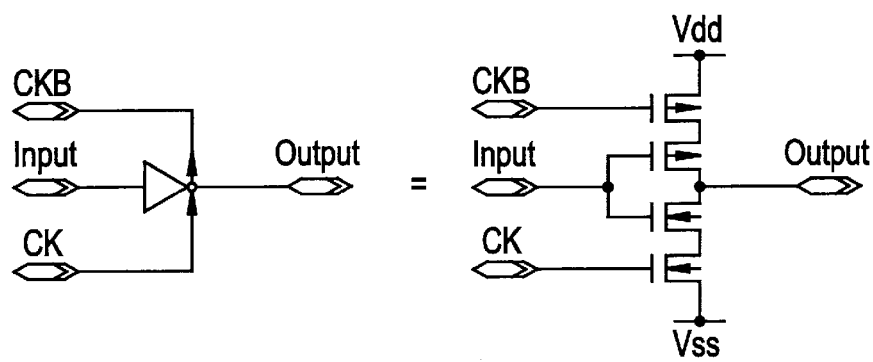

The D-latch circuit H-DL is shown in FIG. 4A, while the D-latch circuit L-DL is shown in FIG. 4B. Each of the D-latch circuits H-DL and L-DL includes two clocked inverter circuits and one inverter circuit. The "clocked inverter circuit" is an inverter circuit that operates on the basis of a clock signal and the inverted clock signal thereof which are inputted. The circuit diagrams of the clocked inverter circuits in this embodiment are illustrated in FIG. 4C.

The clock signal (CK) and the inverted clock signal (CKB) thereof are inputted to each of the D-latch circuits H-DL and L-DL. In this embodiment, the clock signal (CK) corresponds to the latch signal in the D-latch circuits H-DL and L-DL. In addition, the D-latch circuit H-DL latches an input signal received from an input node IN and delivers an output signal from an output node OUT when the clock signal (CK) is Hi. On the other hand, the D-latch circuit L-DL latches an input signal received from an input node IN and delivers an output signal from an output node OUT when the clock signal (CK) is Lo.

Here, the operation of the SPC circuit for the digital data in this embodiment will be described in detail with reference to FIG. 1 and FIG. 2 and the timing chart of FIG. 5. In the timing chart of FIG. 5, the clock signal (CK40) of 40 MHz (being also the clock signal of 40 MHz which is inputted from the clock generators CLK_GEN_L and CLK_GEN_R to the SPC/bit circuits), the inverted signal (CK40B) thereof and the reset signal (RES) are shown as the signals which are inputted to the clock generators CLK_GEN_L and CLK_GEN_R.

Figure 5:
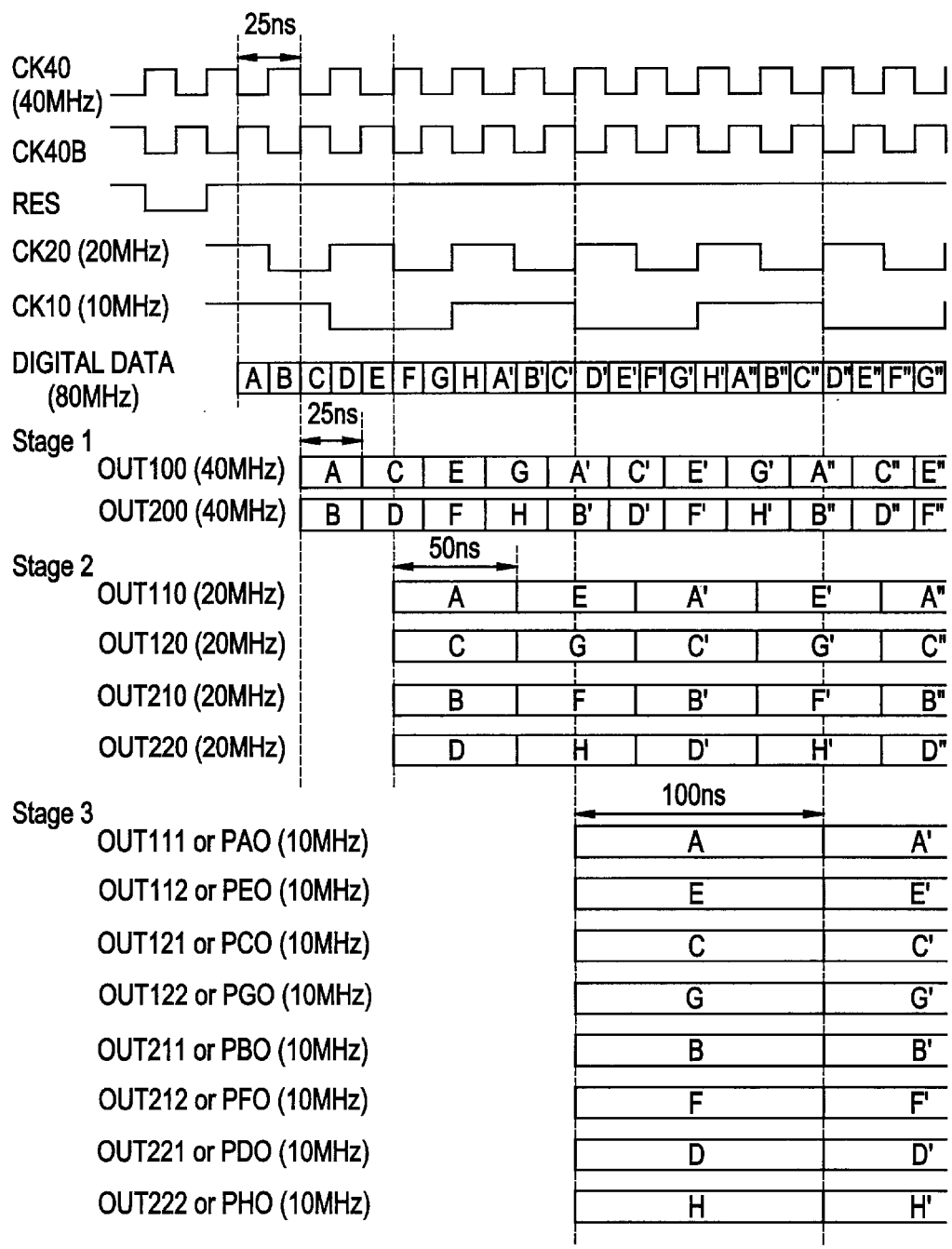
FIG. 5 is a timing chart for explaining the operation of the SPC circuit of Embodiment 1.

Besides, the clock signal (CK20) of 20 MHz and the clock signal (CK10) of 10 MHz which are inputted from the clock generators CLK_GEN to the SPC/bit circuits are shown in the timing chart of FIG. 5.

Also shown are the least significant bits (A, B, C, ..., A', B', C', ..., and A", B", C", ...) of the serial 8-bit digital data of 80 MHz, which are respectively inputted to the SPC/bit-1 circuit through SPC/bit-8 circuit. By the way, the data length of one digital data item (for example, the data item A) is 12.5 nsec.

Further, the digital signals which are delivered from the output nodes OUT100 and OUT200 (Stage 1) of each SPC/bit circuit, the output nodes OUT110, OUT120, OUT210 and OUT220 (Stage 2) thereof, and the output nodes OUT111 (PAO), OUT112 (PEO), OUT121 (PCO), OUT122 (PGO), OUT211 (PBO), OUT212 (PFO), OUT221 (PDO) and OUT222 (PHO) (Stage 3) thereof are shown in the timing chart of FIG. 5.

As shown in the timing chart of FIG. 5, the SPC basic unit of each stage lowers the frequency of the inputted digital data to ½ (in other words, it doubles the data length), and it sequentially converts the inputted digital data into two parallel digital signals.

More specifically, first of all, the SPC basic unit of Stage 1 of each SPC/bit circuit converts the digital data inputted serially at 80 MHz, into parallel digital data of 40 MHz, which are respectively delivered from the output nodes OUT100 and OUT200 to the corresponding input nodes (IN) of the two SPC basic units of Stage 2. By way of example, the SPC basic unit of Stage 1 converts the digital data (A and B each having the data length of 12.5 nsec) inputted serially at 80 MHz, into the two parallel digital data of 40 MHz (A and B each having a data length of 25 nsec).

Secondly, the two SPC basic units of Stage 2 of each SPC/bit circuit convert the digital data inputted serially at 40 MHz., into parallel digital data of 20 MHz, which are respectively delivered from the output nodes OUT110 and OUT120 and those OUT210 and OUT220 to the four SPC basic units of Stage 3. By way of example, the SPC basic unit of Stage 2 converts the digital data (A and C each having the data length of 25 nsec) inputted serially at 40 MHz, into the two parallel digital data of 20 MHz (A and C each having a data length of 50 nsec).

Further, the four SPC basic units of Stage 3 of each SPC/bit circuit convert the digital data inputted serially at 20 MHz, into parallel digital data of 10 MHz, which are respectively delivered from the output nodes OUT111 (PAO) and OUT112 (PEO), those OUT121 (PCO) and OUT122 (PGO), those OUT211 (PBO) and OUT212 (PFO), and those OUT221 (PDO) and OUT222 (PHO). By way of example, the SPC basic unit of Stage 3 converts the digital data (A and E each having the data length of 50 nsec) inputted serially at 20 MHz, into the two parallel digital data of 10 MHz (A and E each having a data length of 100 nsec).

Accordingly, the digital data of 10 MHz are respectively delivered from the output nodes PAO, PBO, PCO, PDO, PEO, PFO, PGO and PHO.

The above operations are performed in all the SPC/bit circuits, with the result that the 8-bit digital data of 80 MHz inputted serially are converted into the eight parallel 8-bit digital data of 10 MHz.

Incidentally, this embodiment has been described concerning the case where the serial-to-parallel conversion circuit for digital data according to the present invention converts the serial 8-bit digital data of 80 MHz into the eight parallel 8-bit digital data of 10 MHz. The serial-to-parallel conversion circuit of the present invention, however, is applicable without being restricted to this case.

The serial-to-parallel conversion circuit for digital data according to the present invention can convert the digital data inputted serially at m Hz, into $2^y$ parallel digital data of $(m \cdot 2^{-y})$ Hz, so as to output the parallel digital data. Here, letter m denotes a positive number, and letter y denotes a natural number. It is to be understood that, in this case, the serial-to-parallel conversion circuit of the present invention can operate with a plurality of clock signals at or below (m/2) Hz.

Herein, frequencies which are, at the highest, (m/2) Hz and at the lowest, $(m \cdot 2^{-y})$ Hz are employed for the plurality of clock signals.

Besides, in a case where the digital data to be dealt with by the serial-to-parallel conversion circuit of the present invention are of x bit, SPC/bit circuits to which the digital data of the respective bits of the x-bit digital data are inputted consist of the x SPC/bit circuits of SPC/bit-1 circuit through SPC/bit-x circuit. In addition, each of the SPC/bit circuits includes SPC basic units in the number indicated by Formula (1) given below. Here, letter x denotes a natural number of at least 2.

[Formula 1]

$$\sum_{k=1}^{y} 2^{k-1} \tag{1}$$

In more detail, the first stage circuit includes one SPC basic unit, the second stage circuit includes two SPC basic units, the k-th stage circuit includes $2^{k-1}$ SPC basic units, and the y-th stage circuit includes $2^{y-1}$ SPC basic units. Here, letter k denotes a natural number of one to y inclusive.

The digital data of the respective bits of the x-bit digital data are inputted to the corresponding SPC/bit circuits. The k-th stage circuit of each of the SPC/bit circuits lowers the frequency of $2^{k-1}$ digital data inputted serially, to ½, and the k-th stage circuit converts the $2^{k-1}$ digital data inputted serially into $2^k$ parallel digital data. The $2^k$ parallel digital data are outputted to the corresponding SPC basic units of the (k+1)th stage circuit being the posterior stage. Incidentally, the stage circuit of the final stage delivers corresponding bit digital data as the outputs of the SPC circuit.

As explained above, the serial-to-parallel conversion circuit for digital data according to the present invention is not restricted by any of the frequency of the digital data, the number of bits thereof, and the dividing number thereof.

Moreover, the serial-to-parallel conversion circuit of the present invention requires only the clock signals of the frequency that is, at the highest, half of the frequency of the digital data to-be-inputted. Therefore, the serial-to-parallel conversion circuit of the present invention is more excellent in stability, reliability and power dissipation as compared with the circuit in the prior art.

(Embodiment 2)

There will now be described another embodiment of the serial-to-parallel conversion (SPC) circuit for digital data according to the present invention. The SPC circuit in this embodiment is such that the function of rearranging digital data is added to the SPC circuit in Embodiment 1. The remaining construction is the same as in Embodiment 1.

Figure 6:
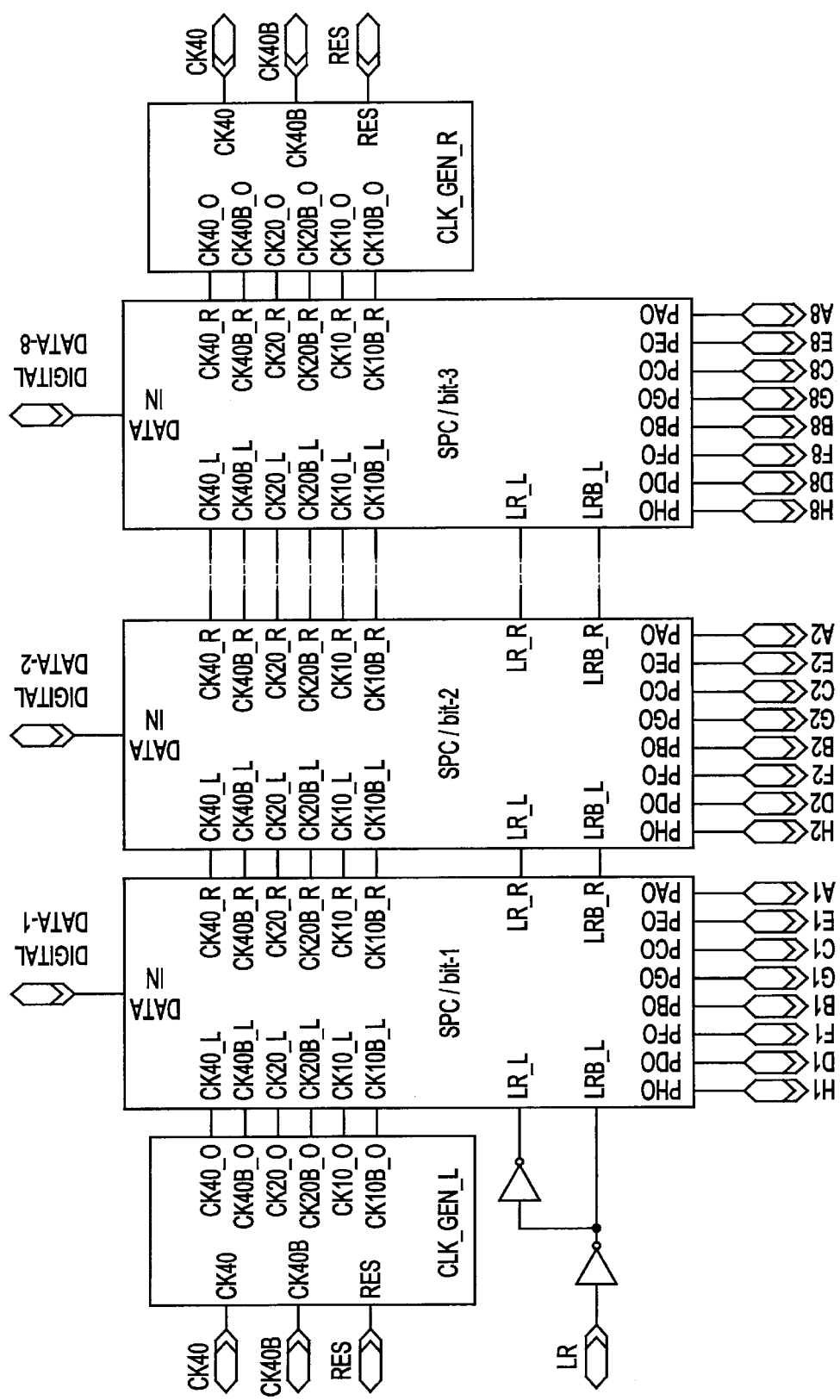
FIG. 6 is a block diagram of a serial-to-parallel conversion (SPC) circuit for digital data in Embodiment 2.

Reference will be had to FIG. 6, in which the circuit arrangement of the SPC circuit for digital data in this embodiment is illustrated by a block diagram. Also in this embodiment, the digital data of 8-bit are dealt with as in Embodiment 1. Likewise to the SPC circuit in Embodiment 1, the SPC circuit for the 8-bit digital data in this embodiment converts the digital data of 8-bit (DIGITAL DATA-1 (LSB) through DIGITAL DATA-8 (MSB)) serially inputted at 80 MHz into parallel and outputs eight parallel digital data of 10 MHz per bit.

As shown in FIG. 6, in the SPC circuit of this embodiment, a digital data rearrangement signal (LR) and the inverted signal thereof (LRB) for incarnating the digital data rearranging function are respectively fed to the input nodes LR_L and LRB_L of each of SPC/bit circuits.

Figure 7:
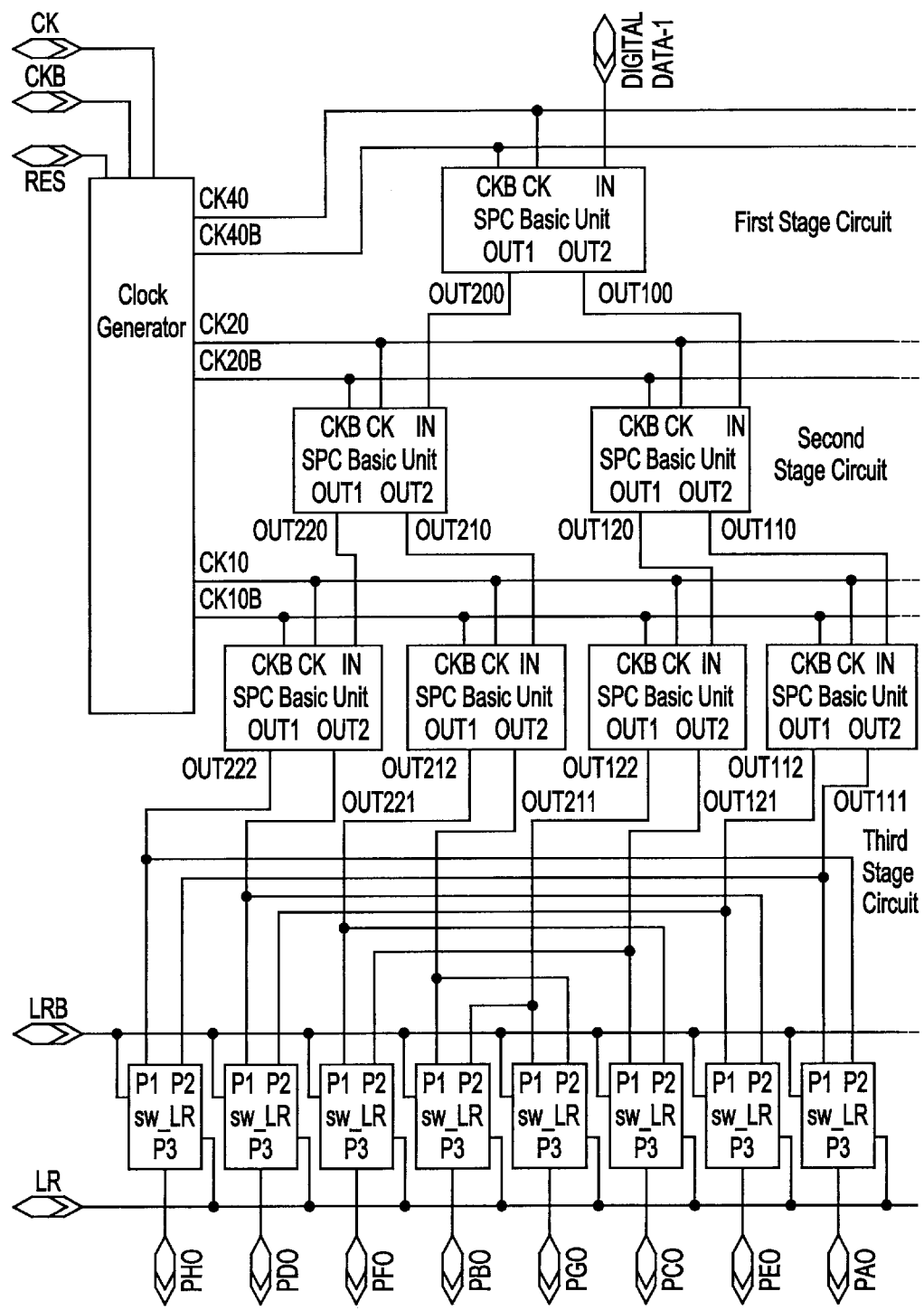
FIG. 7 is a diagram showing the circuit arrangements of a clock generator and an SPC/bit circuit in the SPC circuit of Embodiment 2.

Here, the SPC/bit circuit that is the constituent of the SPC circuit of this embodiment will be described with reference to FIG. 7. FIG. 7 illustrates a clock generator CLK_GEN_L and the SPC/bit-1 circuit to which the least significant bit of the digital data (DIGITAL DATA-1) is inputted, in the SPC circuit of this embodiment. Incidentally, each of the SPC/bit circuits to which the digital data (DIGITAL DATA-2 through DIGITAL DATA-8) are respectively inputted is substantially the same as the SPC/bit circuit shown in FIG. 6.

As shown in FIG. 7, in this embodiment, the SPC/bit-1 circuit includes seven SPC basic units and eight digital data rearrangement switches SW_LR. The connections of the seven SPC basic units are the same as in Embodiment 1.

Figure 8:
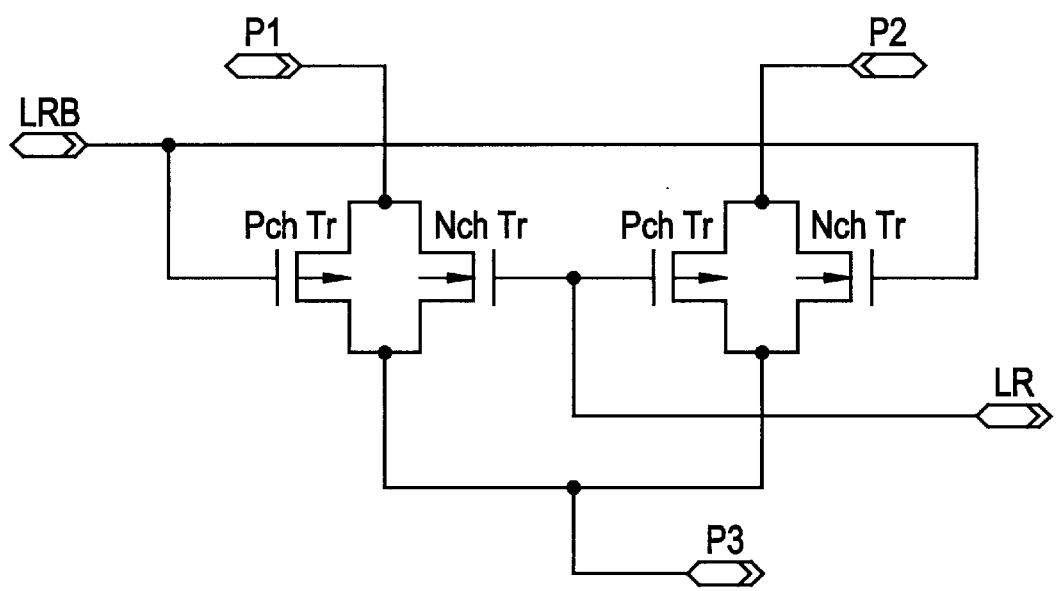
FIG. 8 is a diagram showing the circuit arrangement of a digital data rearrangement switch in the SPC circuit of Embodiment 2.

Here, the circuit diagram of the digital data rearrangement switch SW_LR in this embodiment is illustrated in FIG. 8. In this embodiment, the switch SW_LR includes two analog switches each of which is configured of a P-channel transistor (Pch Tr) and an N-channel transistor (Nch Tr). The digital data rearrangement switch SW_LR in this embodiment can deliver the signal of either an input node P1 or an input node P2 from an output node P3 in accordance with the signals LR and LRB received as inputs.

When LR=Hi (high) and LRB=Lo (low) hold, the digital data rearrangement switch SW_LR outputs the digital data inputted to the node P1, from the node P3. On the other hand, when LR=Lo and LRB=Hi hold, the digital data rearrangement switch SW_LR outputs the digital data inputted to the node P2, from the node P3.

Figure 9:
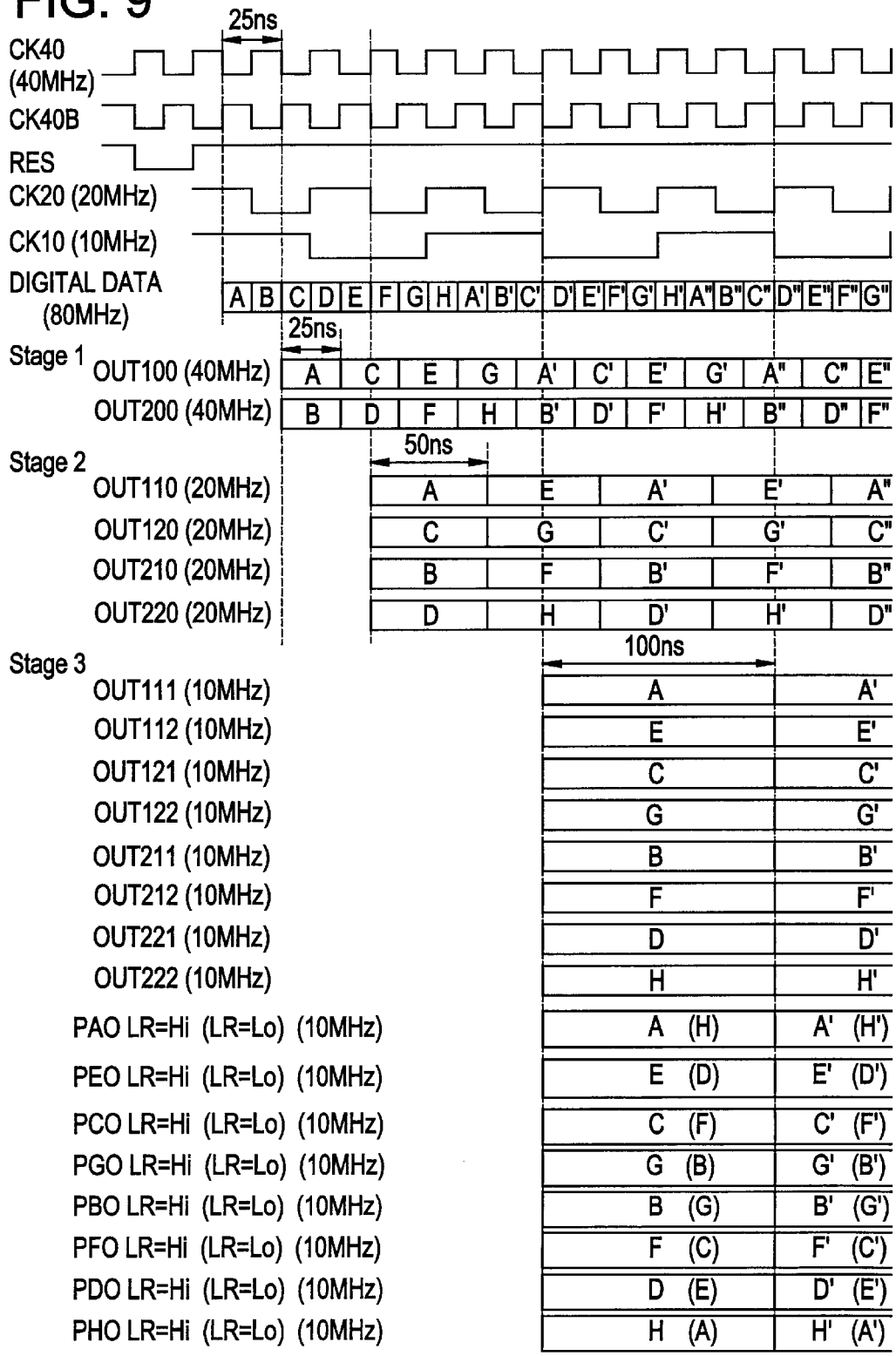
FIG. 9 is a timing chart for explaining the operation of the SPC circuit of Embodiment 2.

The operation of the SPC circuit for the digital data in this embodiment will be described with reference to the timing chart of FIG. 9. The output signals of the SPC basic units down to the signals of the output nodes OUT111, OUT112, OUT121, OUT122, OUT211, OUT212, OUT221 and OUT222 of the SPC basic units of the third stage circuit are the same as in Embodiment 1, which shall therefore be referred to.

The SPC basic units of the third stage circuit of each SPC/bit circuit convert the digital data inputted serially at 20 MHz, into parallel digital data of 10 MHz, which are respectively delivered from the output nodes OUT111 and OUT112, those OUT121 and OUT122, those OUT211 and OUT212, and those OUT221 and OUT222.

When the signals inputted to the digital data rearrangement switches SW_LR are LR=Hi and LRB=Lo, these switches output the digital data inputted to the nodes P1, from the nodes P3. As shown in the timing chart of FIG. 9, therefore, the digital data A, E, C, G, B, F, D and H are respectively delivered from the output nodes PAO, PEO, PCO, PGO, PBO, PFO, PDO and PHO.

When the signals inputted to the digital data rearrangement switches SW_LR are LR=Lo and LRB=Hi, these switches output the digital data inputted to the nodes P2, from the nodes P3. As bracketed and shown in the timing chart of FIG. 9, therefore, the digital data H, D, F, B, G, C, E and A are respectively delivered from the output nodes PAO, PEO, PCO, PGO, PBO, PFO, PDO and PHO.

The above operations are performed in all the SPC/bit circuits, with the result that the 8-bit digital data of 80 MHz inputted serially are converted into the eight parallel 8-bit digital data of 10 MHz.

In this manner, the digital data to be outputted from the serial-to-parallel conversion circuit can be rearranged by controlling the signal LR that is inputted to the digital data rearrangement switches SW_LR.

Here in this embodiment, the digital data to be outputted from the serial-to-parallel conversion (SPC) circuit are rearranged by controlling the signal LR that is inputted to the digital data rearrangement switches. It is also possible, however, to carry out a method in which the digital data to be inputted from outside the SPC circuit are rearranged beforehand, whereupon the rearranged data are inputted to the SPC circuit. This method is useful especially for an aspect of performance in which the digital data rearrangement switches are not included as in the SPC circuit of Embodiment 1.

(Embodiment 3)

In this embodiment, there will be described a case where the serial-to-parallel conversion (SPC) circuit for digital data in Embodiment 1 or 2 explained above is applied to a driver circuit for a liquid crystal display device of active matrix type.

Figure 10:
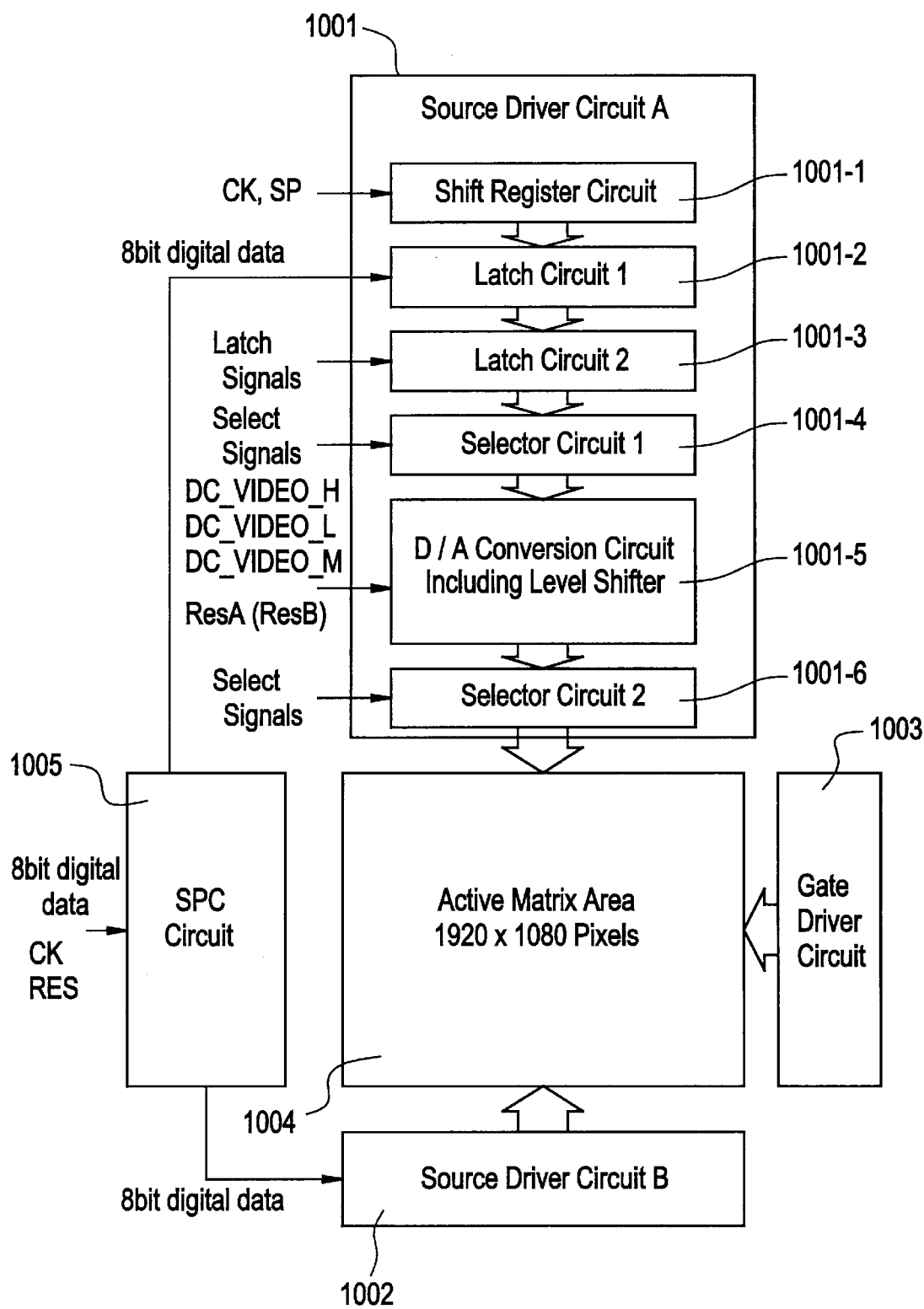
FIG. 10 is a block diagram of an active matrix type liquid crystal display device in Embodiment 3 as employs the serial-to-parallel conversion (SPC) circuit for digital data according to the present invention.

Reference will be had to FIG. 10, which is the schematic block diagram of the active matrix type liquid crystal display device in this embodiment. Numeral 1001 designates a source signal line driver circuit A, while numeral 1002 designates a source signal line driver circuit B. Numeral 1003 indicates a gate signal line driver circuit. Besides, numeral 1004 indicates an active matrix circuit. Shown at numeral 1005 is the SPC circuit for digital data, which is furnished with the digital data rearranging function explained in Embodiment 2 before.

The source signal line driver circuit A 1001 includes a shift register circuit (shift register circuit which has 240 stages×2) 1001-1, a latch circuit 1 (latch circuit which latches 960×8 digital data) 1001-2, a latch circuit 2 (latch circuit which latches 960×8 digital data) 1001-3, a selector circuit 1 (selector circuit which selects 240 digital data) 1001-4, a D/A (digital-to-analog) conversion circuit (D/A conversion circuit which converts 240 digital data, and which shall also been termed "DAC") 1001-5, and a selector circuit 2 (selector circuit which selects 240 digital data) 1001-6. Further, this driver circuit A 1001 includes a buffer circuit and a level shifter circuit (neither of which is shown). Besides, in order to facilitate the description, a level shifter circuit shall be included in the DAC 1001-5.

A clock signal (CK) and a start pulse (SP) are inputted to the shift register circuit 1001-1. Inputted to the latch circuit 1 (1001-2) are eight parallel 8-bit digital data whose frequency has been lowered to 10 MHz by the SPC circuit 1005. Latch signals are inputted to the latch circuit 2 (1001-3). Select signals are inputted to the selector circuit 1 (1001-4). Inputted to the D/A conversion circuit 1001-5 are a high-potential supply voltage (DC_VIDEO_H), a low-potential supply voltage (DC_VIDEO_L), an offset supply voltage (DC_VIDEO_M) and reset pulses (ResA and ResB). In addition, select signals are inputted to the selector circuit 2 (1001-6).

The source signal line driver circuit B 1002 has the same construction as that of the source signal line driver circuit A 1001. Incidentally, the source signal line driver circuit A 1001 feeds video signals (gradation voltage signals) to odd-numbered source signal lines, while the source signal line driver circuit B 1002 feeds video signals to even-numbered source signal lines.

By the way, in the active matrix type liquid crystal display device of this embodiment, the two source signal line driver circuits A and B are disposed so as to vertically hold the active matrix circuit 1004 therebetween for reasons of circuit layout. However, if possible in point of the circuit layout, only one source signal line driver circuit may well be disposed.

Meanwhile, the gate signal line driver circuit 1003 includes a shift register circuit, a buffer circuit, a level shifter circuit, etc. (none of which is shown).

The active matrix circuit 1004 has pixels in the number of 1920×1080 (laterally×vertically). Pixel TFTs (thin film transistors) are allocated to the respective pixels. The source signal line and a gate signal line are electrically connected to the source region and gate electrode of each of the pixel TFTs, respectively. In addition, a pixel electrode is electrically connected to the drain region of each pixel TFT. Each pixel TFT controls the feed of the video signal (gradation voltage) to the pixel electrode electrically connected thereto. The video signals (gradation voltages) are fed to the respective pixel electrodes, and the voltages are applied to a liquid crystal that is sandwiched in between the pixel electrodes and a counter electrode, whereby the liquid crystal is driven.

In this embodiment, 8-bit digital data of 80 MHz are inputted to the serial-to-parallel conversion (SPC) circuit 1005 from outside the liquid crystal display device. The SPC circuit 1005 converts the 8-bit digital data of 80 MHz externally inputted, and it feeds the eight parallel digital data of 10 MHz to the source signal line driver circuits A and B.

Here, the operations of the active matrix type liquid crystal display device in this embodiment will be described in succession.

First, the operation of the source signal line side driver circuit A 1001 will be explained. The clock signal (CK) and the start pulse (SP) are inputted to the shift register circuit 1001-1. This shift register circuit 1001-1 generates timing signals sequentially on the basis of the clock signal (CK) and the start pulse (SP), and feeds the timing signals sequentially to the circuits of posterior stages through a buffer circuit etc. (not shown).

The timing signals from the shift register circuit 1001-1 are buffered by the buffer circuit etc. Each of the source signal lines to which the timing signals are fed, has a large load capacitance (parasitic capacitance) because a large number of circuits or elements are connected thereto. The buffer circuit is disposed in order to prevent the rise or fall of each of the timing signals from becoming "dull" due to the large load capacitance.

Subsequently, the timing signals buffered by the buffer circuit are fed to the latch circuit 1 (1001-2). This latch circuit 1 (1001-2) has 960 stages of sub latch circuits each of which processes 8-bit digital data. When fed with the timing signals, the latch circuit 1 (1001-2) sequentially accepts the 8-bit digital data fed from the SPC circuit 1005 of the present invention and holds them therein.

The time period in which the digital data are completely written into the sub latch circuits of all the stages of the latch circuit 1 (1001-2) is called the "line period". That is, in case of forward scanning, the line period is a time interval from the point of time at which the operation of writing the digital data into the sub latch circuit of the leftmost stage in the latch circuit 1 (1001-2) is started, to the point of time at which the operation of writing the digital data into the sub latch circuit of the rightmost stage is ended. In actuality, a time period obtained by adding a horizontal flyback period to the above line period is sometimes called the "line period".

After the end of one line period, the latch signal is fed to the latch circuit 2 (1001-3) in agreement with the operation timing of the shift register circuit 1001-1. At this moment, the digital data written and held in the latch circuit 1 (1001-2) are concurrently sent to the latch circuit 2 (1001-3), and they are written and held in the sub latch circuits of all the stages of the latch circuit 2 (1001-3).

The digital data fed from the SPC circuit 1005 of the present invention are sequentially written again into the latch circuit 1 (1001-2) having sent the held digital data to the latch circuit 2 (1001-3), on the basis of the timing signal from the shift register circuit 1001-1.

During one line period of the second cycle, the digital data written and held in the latch circuit 2 (1001-3) are sequentially selected by the selector circuit 1 (1001-4) and fed to the D/A conversion circuit (DAC) 1001-5. Here in this embodiment, the selector circuit 1 (1001-4) has sub selector circuits each of which corresponds to four of the source signal lines.

Incidentally, regarding the selector circuit, it is also possible to employ one disclosed in Japanese Patent Application Laid-open No. 11-167373 (1999), assigned to the same assignee as that of the present application. The Japanese Patent Application corresponds to a U.S. patent application Ser. No. 09/162,230 and a European Patent Application Laid-open No. 0 938 074 A.

The selector circuit 1 (1001-4) selects and outputs the digital data corresponding to the four source signal lines, every ¼ of one line scanning period (horizontal scanning period) and in accordance with the inputted select signal.

In the selector circuit 1 (1001-4) in this embodiment, one sub selector circuit is disposed every fourth source signal line. Thus, the 8-bit digital data fed from the latch circuit 2 (1001-3) to the corresponding source signal lines are selected every ¼ of one line scanning period.

The 8-bit digital data selected by the selector circuit 1 (1001-4) are fed to the DAC 1001-5. In this embodiment, any D/A conversion circuit may be employed, but it is favorable to employ a D/A conversion circuit disclosed in Japanese Patent Application No. 10-344732 (1998), assigned to the same assignee as that of the present application.

Analog data (gradation voltages) outputted from the D/A conversion circuit 1001-5 are selected and fed to the source signal lines every ¼-line period by the selector circuit 2 (1001-6), in the same manner as by the foregoing selector circuit 1 (1001-4).

The analog data fed to the source signal lines are fed to those source regions of the pixel TFTs of the active matrix circuit 1004 which are connected to the source signal lines.

The source signal line driver circuit B 1002 has the same construction as that of the source signal line driver circuit A 1001 explained before. This driver circuit B 1002 feeds analog data to the even-numbered source signal lines.

The gate signal line driver circuit 1003 includes a buffer circuit (not shown) which is fed with timing signals from a shift register (not shown), and it feeds the timing signals to the corresponding gate signal lines (scanning lines). The gate electrodes of the pixel TFTs for one horizontal line are connected to each of the gate signal lines, and all the pixel TFTs for one horizontal line need to be simultaneously turned ON. Therefore, the buffer circuit employed has a large current capacity.

In this way, the corresponding pixel TFTs are switched by the scanning signals from the gate signal line driver circuit 1003, and they are fed with the analog data (gradation voltages) from the source signal line driver circuits A (1001) and B (1002), whereby liquid crystal molecules are driven.

When the serial-to-parallel conversion (SPC) circuit for digital data according to the present invention is applied to the active matrix type liquid crystal display device as in this embodiment, the digital data of higher frequency can be processed.

Here will be described an example of a process for fabricating the active matrix type liquid crystal display device including the SPC circuit of the present invention as described in this embodiment. In this embodiment, the liquid crystal display device is exemplified by one in which a plurality of TFTs are formed on a substrate having an insulating surface and in which the active matrix circuit, the source signal line driver circuits, the gate signal line driver circuit, the SPC circuit of the present invention, and other peripheral circuits are formed on the same substrate. The process for fabricating such an example is illustrated in FIGS. 11A–11E, FIGS. 12A–12C, FIGS. 13A–13E and FIGS. 14A–14C. By the way, in the ensuing examples, there will be explained a state where one pixel TFT of the active matrix circuit is formed simultaneously with a CMOS (complementary MOS transistor) circuit which is the basic circuit of the other circuits (source signal line driver circuits, gate signal line driver circuit, SPC circuit and other peripheral circuits). Also, in the ensuing examples, fabricating steps will be explained concerning a case where each of a P-channel TFT and an N-channel TFT includes one gate electrode in the CMOS circuit, but a CMOS circuit based on TFTs each including a plurality of gate electrodes, such as TFTs of double gate type or triple gate type, can be similarly fabricated. Besides, in the ensuing examples, the pixel TFT will be explained as a double-gate N-channel TFT, but it may well be replaced with a TFT of single gate type, the triple gate type, or the like.

Figure 11A:
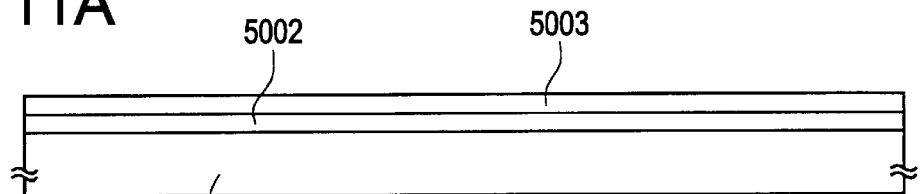
FIGS. 11A through 11E are sectional views showing an example of a process for fabricating the active matrix type liquid crystal display device of Embodiment 3.

Reference will be had to FIG. 11A. First, a quartz substrate 5001 is prepared as a substrate having an insulating surface. A silicon substrate formed with a thermal oxidation film can be used instead of the quartz substrate. It is also allowed here to employ a method in which an amorphous silicon film is once formed on the quartz substrate, and in which it is thermally oxidized entirely into an insulating film. Further, it is allowed to employ a quartz substrate, ceramics substrate or silicon substrate that is formed with a silicon nitride film as an insulating film. Subsequently, an underlying film 5002 is formed. In this embodiment, silicon oxide ($SiO_2$) is used for the underlying film 5002. At the next step, an amorphous silicon film 5003 is formed. The amorphous silicon film 5003 is regulated so that its final thickness (thickness which is attained considering a film decrease after thermal oxidation) may become 10 through 75 nm (preferably 15 through 45 nm, and more preferably 25 nm).

By the way, in forming the amorphous silicon film 5003, it is important to thoroughly control the concentrations of impurities in the film. In case of this embodiment, in the amorphous silicon film 5003, C (carbon), N (nitrogen) and O (oxygen) are impurities, which hinder the later crystallization of the amorphous film. Both the concentrations of the impurities C and N are controlled so as to become below $5 \times 10^{18}$ atoms/cm$^3$ (typically, at most, $5 \times 10^{17}$ atoms/cm$^3$, and preferably, at most, $2 \times 10^{17}$ atoms/cm$^3$), while the concentration of the impurity O (oxygen) is controlled so as to become below $5 \times 10^{19}$ atoms/cm$^3$ (typically, at most, $1 \times 10^{18}$ atoms/cm$^3$, and preferably, at most, $5 \times 10^{17}$ atoms/cm$^3$). The reason therefor is that the impurities existing at higher concentrations exert evil effects in the later crystallization and form a cause for degrading the quality of a crystallized film. Here in this specification, the concentrations of the impurity elements in the film are defined as the minimum values of the measured results of SIMS (secondary ion mass spectrometry).

In order to obtain the above construction, a low-pressure thermal CVD furnace for use in this embodiment should desirably be routinely subjected to dry cleaning so as to clean a film-forming chamber. The dry cleaning may be carried out in such a way that ClF$_3$ (chlorine fluoride) gas at 100 through 300 sccm is caused to flow within the furnace heated to about 200 through 400° C., whereupon the film-forming chamber is cleaned by fluorine produced by thermodecomposition.

Incidentally, the inventors have found out that, in a case where the temperature of the interior of the furnace is set at 300° C. and where the flow rate of the ClF$_3$ gas is set at 300 sccm, adherent matter (principally composed of silicon) being about 2 µm thick can be completely removed in 4 hours.

Also, the concentration of hydrogen in the amorphous silicon film 5003 is a very important parameter, and a film of better crystallinity seems to be produced when the hydrogen content is suppressed low. Therefore, the formation of the amorphous silicon film 5003 should favorably be done by low-pressure thermal CVD. It is also possible to employ plasma CVD by optimizing conditions for the film formation.

Subsequently, the step of crystallizing the amorphous silicon film 5003 is carried out. A technique disclosed in a Japanese Patent Application Laid-open No. 7-130652 (1995) is adopted as an expedient for the crystallization. The Japanese Patent Application corresponds to a U.S. Pat. No. 5,643,826 and a U.S. Pat. No. 5,923,962. Although the expedient of either of Embodiments 1 and 2 described in the Japanese Patent Application may be relied on, the technical contents stated in Embodiment 2 in the Japanese Patent Application (detailed in the Japanese Patent Application Laid-open No. 8-78329(1996)) should favorably be utilized in this embodiment.

The technique disclosed in the Japanese Patent Application Laid-open No. 8-78329 is such that a mask insulating film 5004 for selecting regions, which are to be doped with a catalyst element, is first formed to a thickness of 150 nm. The mask insulating film 5004 has a plurality of openings in order to introduce the catalyst element. The positions of crystal regions can be determined by those of the openings.

Figure 11B:
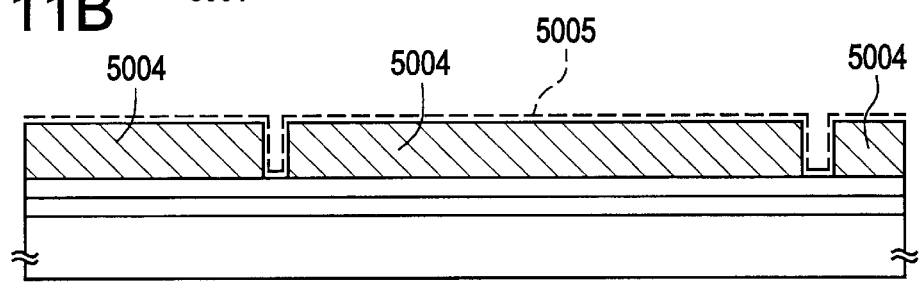

Besides, as the catalyst element that assists in the crystallization of the amorphous silicon film 5003, the resulting substrate is coated by spin coating with a solution containing nickel (ethanol solution of nickel acetate) 5005. Apart from the element nickel, any of cobalt (Co), iron (Fe), palladium (Pd), germanium (Ge), platinum (Pt), copper (Cu), gold (Au), etc. is usable as the catalyst element (FIG. 11B).

Also, ion implantation or plasma doping which utilizes a resist mask can be employed for the step of doping with the catalyst element. In this case, it is facilitated to diminish the occupying area of each region that is to be doped, and to control the growth distance of each lateral growth region that will be explained later. Therefore, such a technique is effective to construct microcircuitry.

After the end of the step of doping with the catalyst element, the resulting substrate is dehydrogenated at 450° C. for one hour or so. Thereafter, the amorphous silicon film 5003 is crystallized by subjecting the resulting substrate to a heat treatment at a temperature of 500 through 960° C. (typically 550 through 650° C.) in an inactive atmosphere, a hydrogen atmosphere or an oxygen atmosphere for 4 through 24 hours. In this embodiment, the heat treatment is conducted at 600° C. in a nitrogen atmosphere for 12 hours.

Figure 11C:
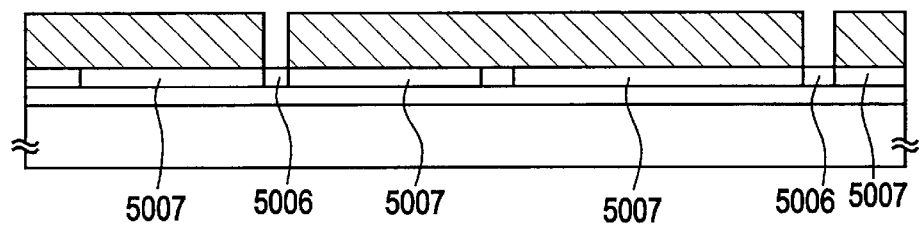

On this occasion, the crystallization of the amorphous silicon film 5003 proceeds preferentially from nuclei which have appeared in regions 5006 doped with the catalyst element Ni, thereby to form crystal regions 5007 each being made of a polycrystalline silicon film which has grown substantially in parallel with the substrate plane of the substrate 5001. The crystal regions 5007 are called the "lateral growth regions". Since the lateral growth region has individual crystals aggregated in a comparatively uniform state, it has the merit of being excellent in crystallinity as a whole (FIG. 11C).

Incidentally, the amorphous silicon film 5003 can also be crystallized by coating its whole surface with the nickel acetate solution without employing the mask insulating film 5004.

Figure 11D:
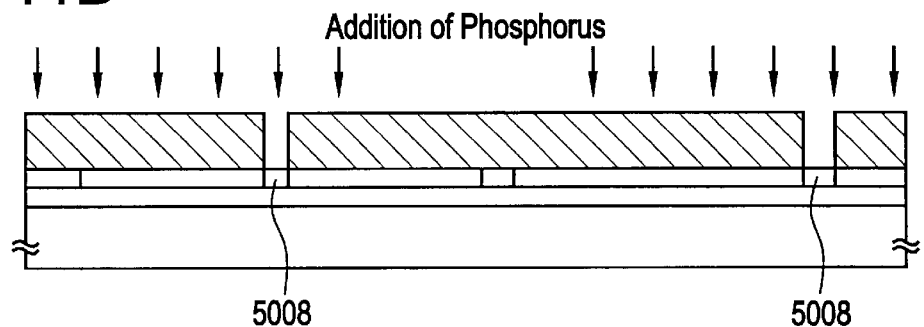

Reference will be had to FIG. 11D, which illustrates a process for gettering the catalyst element. First, the selected parts of the resulting substrate are doped with phosphorus ions. The doping with the dopant phosphorus is performed in the state in which the mask insulating film 5004 is formed. Then, only those parts 5008 of the polycrystalline silicon films 5007 which are not covered with the mask insulating film 5004 are doped with the dopant phosphorus (these parts shall be called the "phosphorus-doped regions 5008"). On this occasion, the acceleration voltage of the doping and the thickness of the mask 5004 made of an oxide film are optimized lest the dopant phosphorus should punch through the mask insulating film 5004. Although the mask insulating film 5004 need not always be the oxide film, advantageously the oxide film does not form a cause for contamination even in direct touch with any active layer.

The dose of the dopant phosphorus may be on the order of $1 \times 10^{14}$ through $2 \times 10^{15}$ ions/cm$^2$. In an example of this embodiment, the dopant phosphorus was introduced at a dose of $2 \times 10^{15}$ ions/cm$^2$ by the use of an ion doping equipment.

Incidentally, the acceleration voltage of the ion doping was set at 10 keV. With the acceleration voltage of 10 keV, the dopant phosphorus can hardly pass through the mask insulating film being 150 nm thick.

Figure 11E:
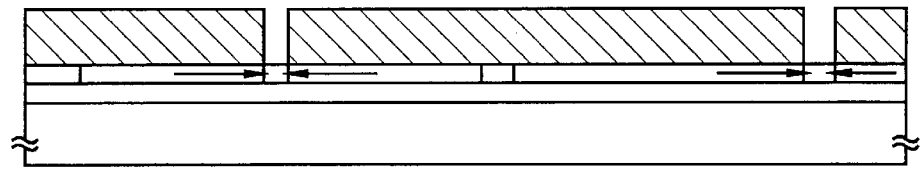

Reference will now be had to FIG. 11E. Subsequently, the resulting substrate is thermally annealed in a nitrogen atmosphere of 600° C. for 1 through 12 hours (in this embodiment, for 12 hours), thereby to getter the element nickel. Thus, as indicated by arrows in FIG. 11E, the element nickel is drawn toward the dopant phosphorus. At the temperature of 600° C., phosphorus atoms hardly migrate within the films 5007, but nickel atoms can migrate distances of, at least, several hundred µm or so. From this fact, it can be understood that phosphorus is one of elements most suited to getter nickel.

Figure 12A:
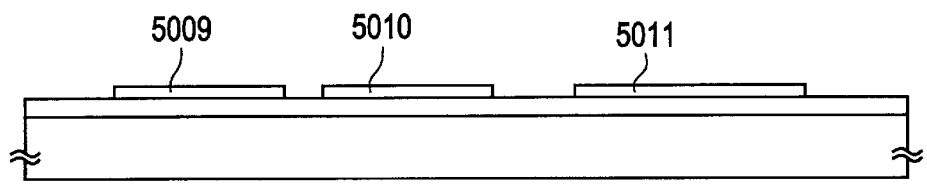
FIGS. 12A, 12B and 12C are sectional views showing the example of the process for fabricating the active matrix type liquid crystal display device of Embodiment 3.

Next, the step of patterning the polycrystalline silicon films 5007 will be explained with reference to FIG. 12A. On this occasion, the phosphorus-doped regions 5008 into which the element nickel has been gettered are prevented from remaining. In this way, active layers 5009, 5010 and 5011, which are the polycrystalline silicon films hardly containing the element nickel, are obtained. The active layers 5009, 5010 and 5011 being the polycrystalline silicon films thus obtained serve as the active layers of the TFTs later.

Figure 12B:
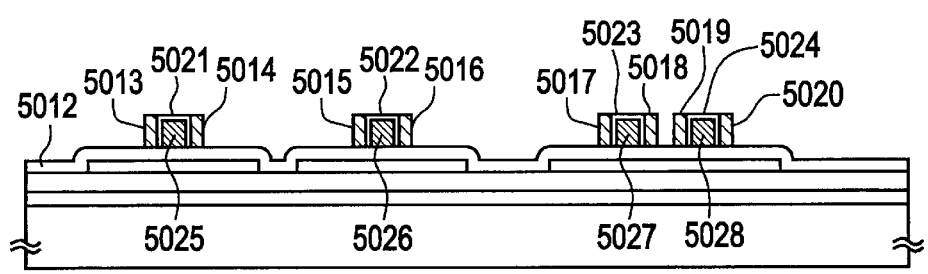
Figure 12C:
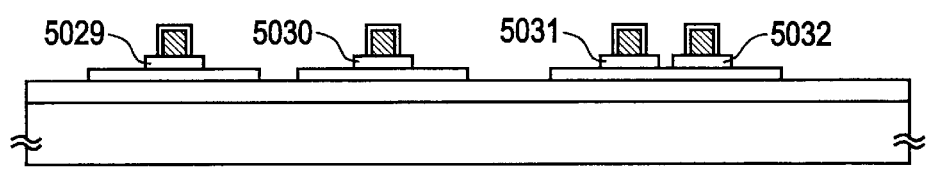

Referring to FIG. 12B, the active layers 5009, 5010 and 5011 are overlaid with a gate insulating film 5012 which is made of an insulating film containing silicon, and which is formed to a thickness of 70 nm. Besides, a heat treatment is conducted at 800 through 1100° C. (preferably 950 through 1050° C.) in an oxidizing atmosphere, thereby to form thermal oxidation films (not shown) at the interfaces between the active layers 5009, 5010 and 5011 and the gate insulating film 5012.

Incidentally, the gate insulating film 5012 which corresponds to the portions of the SPC circuit of the present invention, the driver circuits, etc. requiring high-speed operations may well be thinned in such a way that, after this gate insulating film 5012 has been formed, it is partly removed, followed by the further formation of a gate insulating film.

In addition, the heat treatment for gettering the catalyst element (the process for gettering the catalyst element) may well be conducted at this stage. In that case, the atmosphere of the heat treatment is caused to contain a halogen element, and the effect of gettering the catalyst element by the halogen element is utilized. Herein, in order to satisfactorily attain the gettering effect based on the halogen element, the heat treatment should favorably be carried out at a temperature exceeding 700° C. At temperatures of and below 700° C., it is apprehended that a halogen compound in the treatment atmosphere will become difficult of decomposition, failing to attain the gettering effect. In this case, typically usable as a gas that contains the halogen element is at least one species selected from among halogen containing compounds such as HCl, HF, $NF_3$, HBr, $Cl_2$, $ClF_3$, $BCl_2$, $F_2$, and $Br_2$. At this step, in case of using the compound HCl by way of example, it is considered that the element nickel in the active layers will be gettered under the action of chlorine, to turn into volatile nickel chloride, which will vapor away into the atmospheric air. Further, in the case where the process for gettering the catalyst element is carried out using the halogen element, it may well be performed after the removal of the mask insulating film 5004 and before the patterning of the active layers. Still further, the gettering process for the catalyst element may well be performed after the patterning of the active layers. Yet further, any of such gettering processes may well be performed in combination.

Subsequently, an unshown metal film whose principal component is aluminum is formed and is patterned into the prototypes of later gate electrodes. In an example of this embodiment, an aluminum film containing 2 wt-% of scandium (Sc) was formed to a thickness of 400 nm.

Alternatively, the gate electrodes may well be formed from a polycrystalline silicon film that is doped with an impurity for bestowing a conductivity type.

Subsequently, porous anodic oxidation films 5013 through 5020, non-porous anodic oxidation films 5021 through 5024, and the gate electrodes 5025 through 5028 are formed by a technique disclosed in a Japanese Patent Application Laid-open No. 7-135318 (1995) (FIG. 12B). The Japanese Patent Application corresponds to a U.S. Pat. No. 5,648,277.

After the state of FIG. 12B has been obtained in this way, the gate insulating film 5012 is etched with a mask being the gate electrodes 5025 through 5028 and the porous anodic oxidation films 5013 through 5020. Subsequently, the porous anodic oxidation films 5013 through 5020 are removed to obtain the state of FIG. 12C. Incidentally, numerals 5029 through 5032 in FIG. 12C indicate gate insulating films after the work.

Figure 13A:
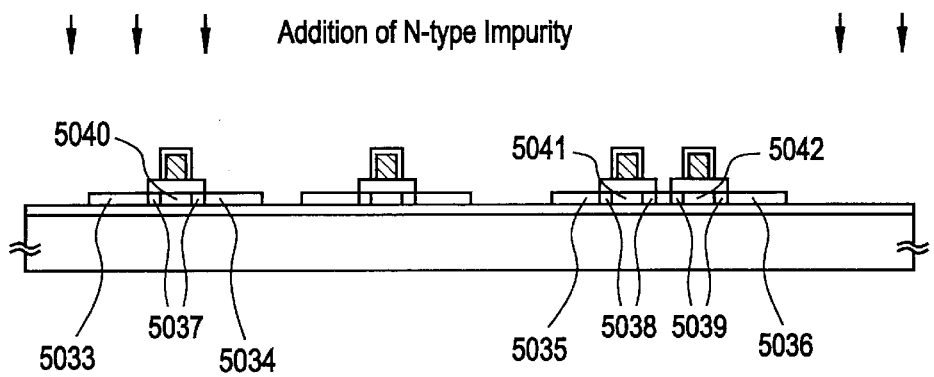
FIGS. 13A, 13B and 13C are sectional views showing the example of the process for fabricating the active matrix type liquid crystal display device of Embodiment 3.

Reference will now be had to FIG. 13(A), which illustrates the step of doping with an impurity element that bestows one conductivity type. The impurity element may be P (phosphorus) or As (arsenic) for the N-channel type, and B (boron) or Ga (gallium) for the P-channel type.

In this embodiment, each of the impurity doping steps for forming the N-channel and P-channel TFTs is divided into two substeps.

Initially, the impurity doping for forming the N-channel TFTs is carried out. The first substep of doping with the impurity phosphorus employed in this embodiment is performed at a high acceleration voltage of about 80 keV, thereby to form $n^-$ regions. The $n^-$ regions are regulated so as to exhibit a phosphorus concentration of $1\times10^{18}$ through $1\times10^{19}$ atoms/cm$^3$.

Further, the second substep of doping with the impurity is performed at a low acceleration voltage of about 10 keV, thereby to form $n^+$ regions. Since, on this occasion, the acceleration voltage is low, the gate insulating films 5029~5032 function as a mask. In addition, the $n^+$ regions are regulated so as to exhibit a sheet resistance of, at most, 500Ω (preferably, at most, 300Ω).

Formed via the above steps are the source region 5033 and drain region 5034 of the N-channel TFT constituting the CMOS circuit, the low-concentration impurity regions 5037 thereof, and the channel forming region 5040 thereof. Also settled are the source region 5035 and drain region 5036 of the N-channel TFT constructing the pixel TFT, the low-concentration impurity regions 5038, 5039 thereof, and the channel forming regions 5041, 5042 (FIG. 13A).

By the way, in the state shown in FIG. 13A, the active layers of the P-channel TFT constituting the CMOS circuit have the same configuration as those of the N-channel TFT.

Figure 13B:
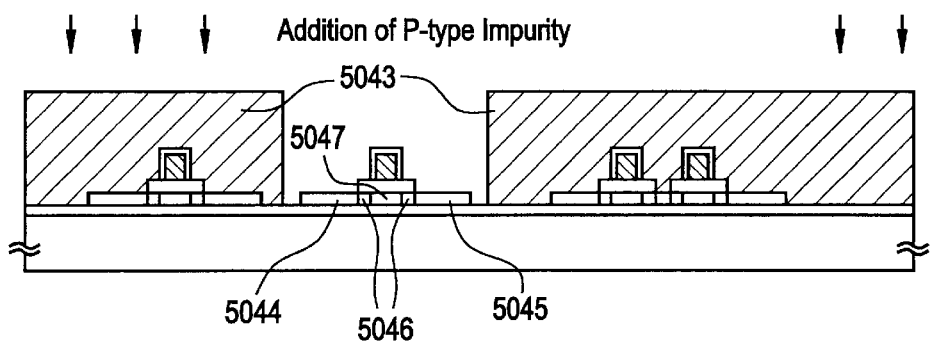

Subsequently, as shown in FIG. 13B, a resist mask 5043 is provided covering the N-channel TFTs, and the resulting substrate is doped with the ions of an impurity bestowing the P-type (boron is employed in this embodiment).

This step is also divided into the two substeps likewise to the foregoing step of doping with the impurity. Since, however, the N-channel type needs to be inverted into the P-channel type, the B ions are introduced at a concentration which is several times as high as the aforementioned concentration of doping with the P ions.

Thus, there are formed the source region 5045 and drain region 5044 of the P-channel TFT constituting the CMOS circuit, the low-concentration impurity regions 5046 thereof, and the channel forming region 5047 thereof (FIG. 13B).

Besides, in the case where the gate electrodes are formed from the polycrystalline silicon film doped with the impurity for bestowing the conductivity type, known sidewall structures may well be utilized for forming the low-concentration impurity regions.

Subsequently, the impurity ions are activated by the combination of furnace annealing, laser annealing, lamp annealing, etc. Simultaneously, the damages of the active layers suffered by the steps of doping are repaired.

Figure 13C:
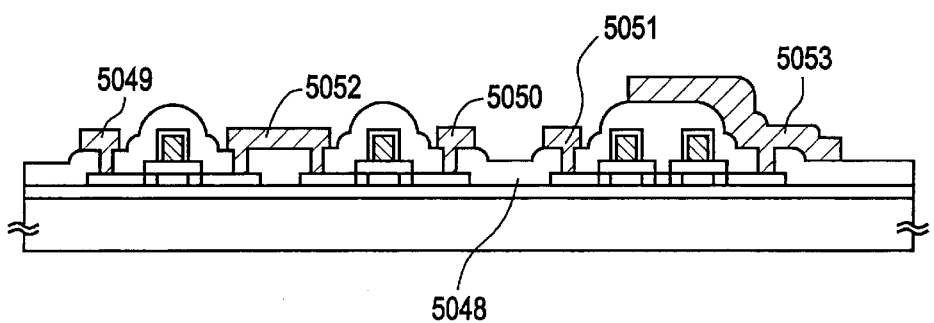

Referring now to FIG. 13C, a stacked film consisting of a silicon oxide film and a silicon nitride film is formed as a first interlayer insulating film 5048, and it is formed with contact holes. Thereafter, source electrodes and drain electrodes 5049 through 5053 are formed. Incidentally, it is also possible to employ an organic resin film as the first interlayer insulating film 5048.

Figure 14A:
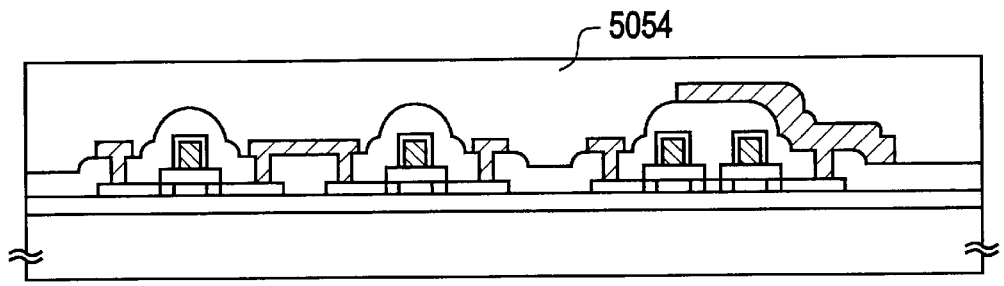
FIGS. 14A, 14B and 14C are sectional views showing the example of the process for fabricating the active matrix type liquid crystal display device of Embodiment 3.
Figure 14B:
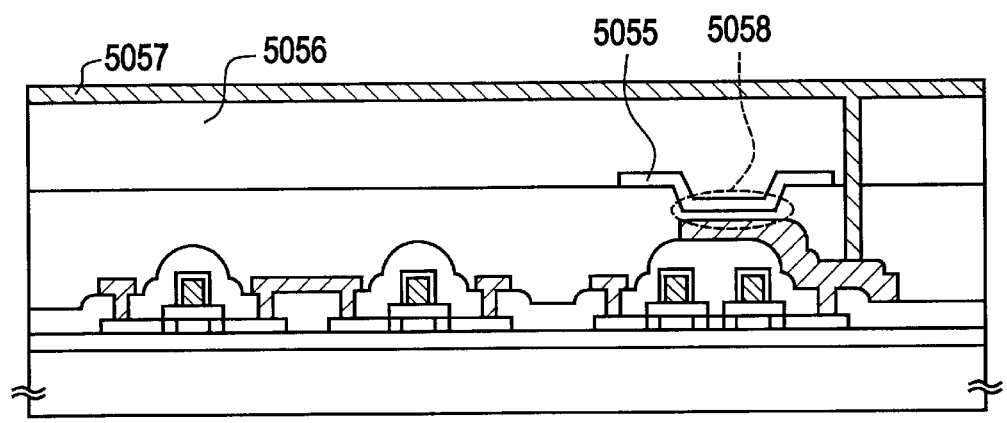
Figure 14C:
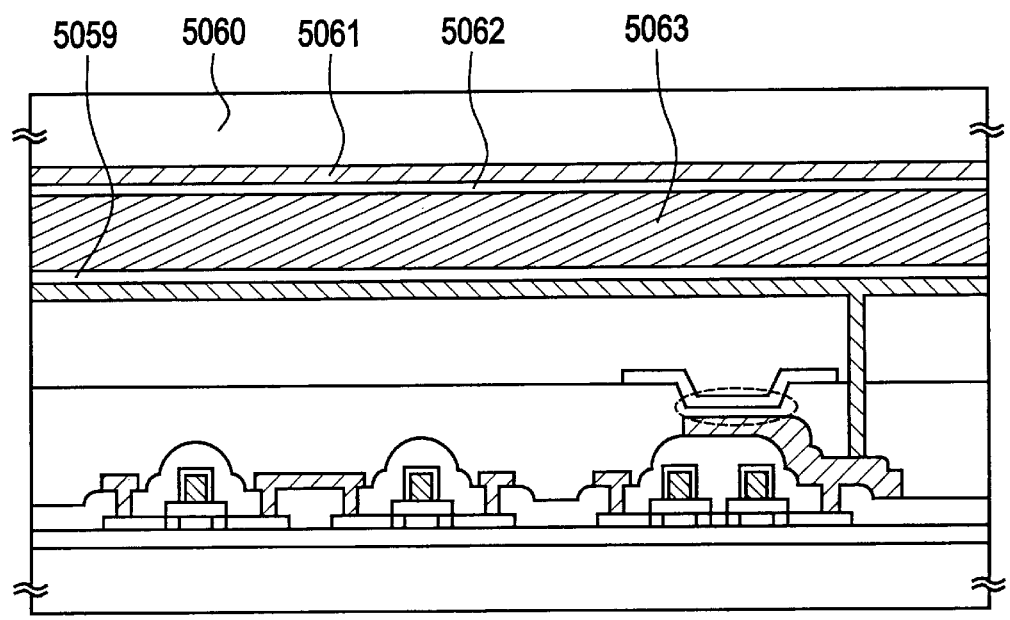

Reference will be had to FIGS. 14A, 14B and 14C. Subsequently, a second interlayer insulating film 5054 is formed of a silicon nitride film. At the next step, a third interlayer insulating film 5056 made of an organic resin film is formed to a thickness of 0.5 through 3 μm. Any of polyimide, acrylic resin, polyimidoamide, etc. is used for the organic resin film. Mentioned as the merits of the organic resin film are that a method for forming the film is easy, that the film can be readily thickened, that a parasitic capacitance can be lowered owing to the small dielectric constant of the organic resin, and that the flatness of the surface of the film is excellent. Incidentally, it is possible to employ an organic resin film other than mentioned above.

Subsequently, part of the third interlayer insulating film 5056 is etched, and a black matrix 5055 is formed over the drain electrode 5053 of the pixel TFT with the second interlayer insulating film 5054 interposed therebetween. In this embodiment, Ti (titanium) is used for the black matrix 5055. By the way, in this embodiment, a retention capacitance 5058 is formed between the pixel TFT and the black matrix 5055.

Subsequently, a contact hole is formed in the second interlayer insulating film 5054 as well as the third interlayer insulating film 5056, and a pixel electrode 5057 is formed to a thickness of 120 nm. Here, since this embodiment exemplifies the active matrix type liquid crystal display device of transmission type, a transparent conductive film of ITO (indium tin oxide) or the like is employed as a conductive film forming the pixel electrode 5057.

Subsequently, the whole substrate is heated in a hydrogen atmosphere of 350° C. for 1 through 2 hours so as to be entirely hydrogenized, whereby dangling bonds in the films (especially, in the active layers) are compensated for. Incidentally, the hydrogenization may well be done using hydrogen produced by turning a gas into plasma.

An active matrix substrate, in which the CMOS circuits and the pixel matrix circuit are formed on the identical substrate, is finished up via the above steps.

Next, there will be described a process for fabricating the active matrix type liquid crystal display device on the basis of the active matrix substrate prepared by the above steps.

An orientation film 5059 is formed on the active matrix substrate in the state of FIG. 14B. In this embodiment, polyimide is used for the orientation film 5059. Subsequently, a counter substrate is prepared. The counter substrate is configured of a glass substrate 5060, a counter electrode 5061 made of a transparent conductive film, and an orientation film 5062.

In an example of this embodiment, the orientation film 5062 was a polyimide film. After the orientation film had been formed, it was subjected to rubbing. By the way, in this example, polyimide having a comparatively wide pretilt angle was used for the orientation film.

Subsequently, the active matrix substrate and the counter substrate that have undergone the above steps are fastened to each other through sealing members (not shown), spacers (not shown), or the likes by a known cell assemblage step. Thereafter, a liquid crystal 5063 is poured between both the substrates, and the resulting structure is completely sealed with a sealant (not shown). In this embodiment, a nematic liquid crystal is used as the liquid crystal 5063.

Then, the active matrix type transmitting liquid crystal display device as shown in FIG. 14C is finished up.

Incidentally, the amorphous silicon film may well be crystallized using a laser beam (typically, excimer laser beam) instead of the method of crystallizing the amorphous silicon film as described in this embodiment.

Besides, another process may well be performed by replacing the use of the polycrystalline silicon film with the use of an SOI structure (SOI substrate) of "Smart Cut", "SIMOX", "ELTRAN" or the like.

Figure 19:
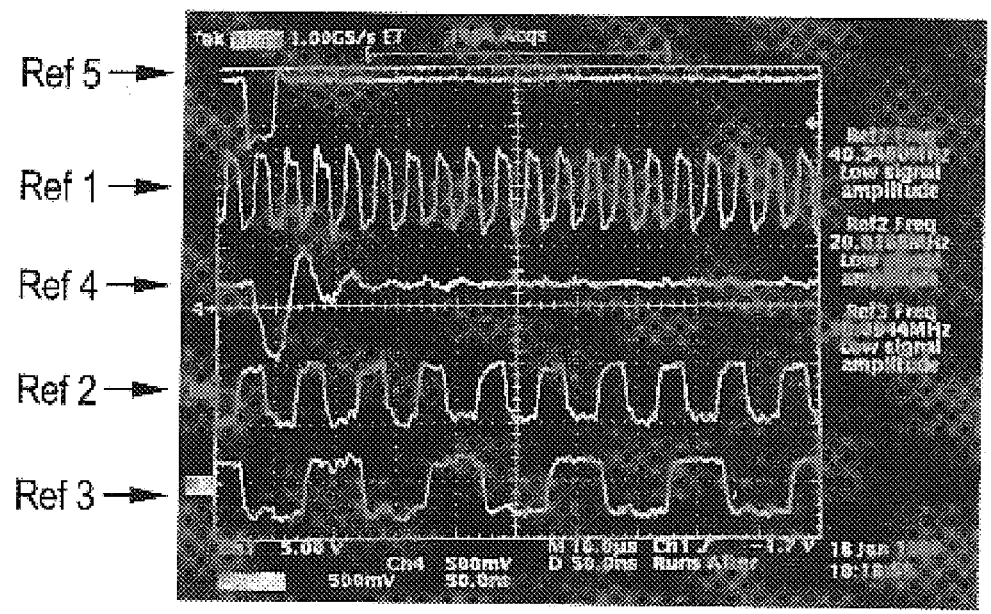
FIG. 19 is an oscillogram showing the operating waveform of the SPC circuit of the present invention manufactured by the fabricating process in Embodiment 3.

Here, the operating results of the active matrix type liquid crystal display device in this embodiment will be explained with reference to FIG. 19, FIGS. 20A, 20B and 20C. FIG. 19 illustrates an oscillogram obtained when the serial-to-parallel conversion (SPC) circuit for digital data in this embodiment was operated.

Shown in FIG. 19 are the output waveforms of clock signals from the clock generator CLK_GEN_L or CLK_GEN_R. In the figure, symbol Ref1 indicates the output waveform of the clock signal CK40_O (at about 40 MHz), symbol Ref2 indicates the output waveform of the clock signal CK20_O (at about 20 MHz), and symbol Ref3 indicates the output waveform of the clock signal CK10_O (at about 10 MHz). Incidentally, symbol Ref5 denotes a reset pulse (RES), while symbol Ref4 denotes the signal waveform obtained by actually measuring the reset pulse in the SPC circuit.

Figure 20A:
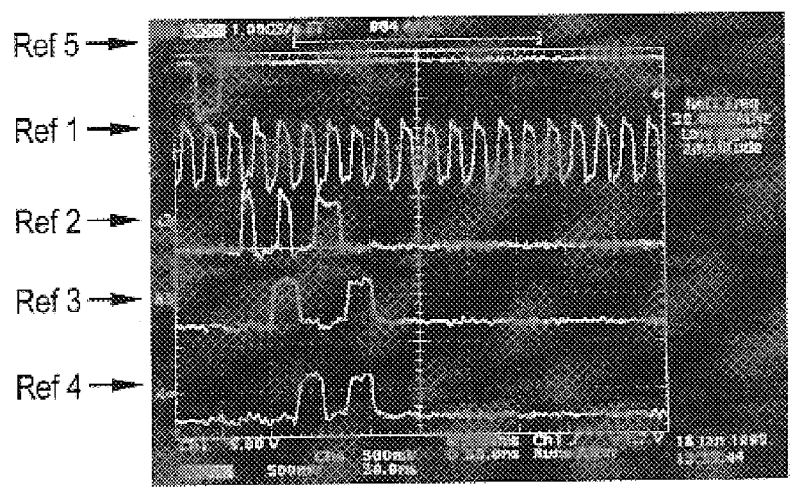
FIGS. 20A, 20B and 20C are oscillograms each showing the operating waveform of the SPC circuit of the present invention manufactured by the fabricating process in Embodiment 3.
Figure 20B:
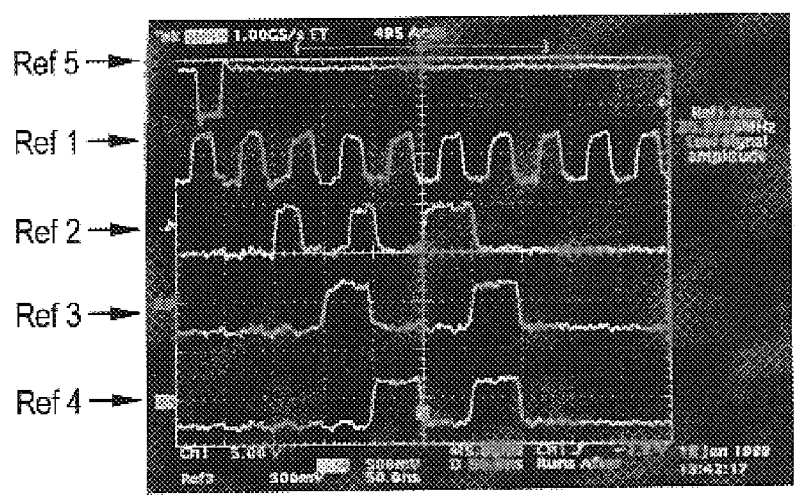
Figure 20C:
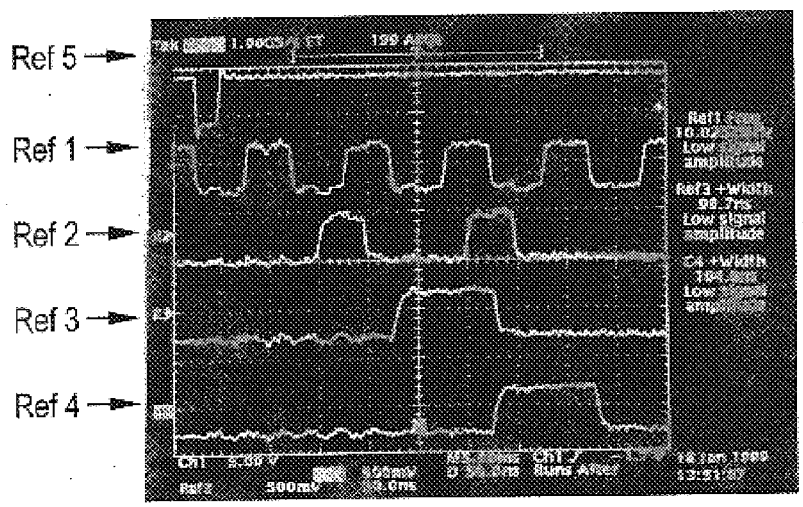

FIGS. 20A, 20B and 20C illustrate output waveforms in the SPC/bit-1 circuit to which the digital data of the least significant bit among the digital data of 8-bit are inputted.

Shown in FIG. 20A are the clock signal CK40 of about 40 MHz (Ref1) and the digital data of 80 MHz (Ref2) which are inputted to the SPC basic unit of the first stage (Stage 1) of the SPC/bit-1 circuit, and the two parallel digital data of 40 MHz (Ref3 and Ref3) which are respectively delivered from the output nodes OUT100 and OUT200 of the above SPC basic unit. Also, the reset pulse (Ref5) is shown.

The digital data of 80 MHz (Ref2) are fed to the input node IN of the SPC/bit-1 circuit. The 80-MHz digital data are serial digital data, which have levels Hi (high), Lo (low), Lo, Hi, Lo, Lo, Hi and Hi in succession from the leftmost pulse. Incidentally, the serial digital data of 80 MHz correspond to a case where, in the timing chart of FIG. 5, the data A, D, G and H indicated at the row DIGITAL DATA are of the level Hi, while the other data are of the level Lo.

From the digital data (Ref3 and Ref4) which are respectively delivered from the output nodes OUT100 and OUT200, the state is seen in which the inputted digital data (Ref2) have their frequency lowered to ½ (about 40 MHz) and are converted into the two parallel digital data (Ref3 and Ref4). This state is clarified by referring to the timing chart of FIG. 5 as to the sequence in which the Hi data A, D, G and H in the row DIGITAL DATA are delivered from the output nodes OUT100 and OUT200.

Shown in FIG. 20B are the clock signal CK20 of about 20 MHz (Ref1) and the digital data of 40 MHz (Ref2) which are inputted to the SPC basic unit of the second stage (Stage 2) of the SPC/bit-1 circuit, and the two parallel digital data of 20 MHz (Ref3 and Ref4) which are respectively delivered from the output nodes OUT110 and OUT120 of the above SPC basic unit. Also, the reset pulse (Ref5) is shown.

Also in FIG. 20B, from the digital data (Ref3 and Ref 4) which are respectively delivered from the output nodes OUT110 and OUT120, the state is seen in which the inputted digital data (Ref2) have their frequency lowered to ½ (about 20 MHz) and are converted into the two parallel digital data (Ref3 and Ref4).

Besides, shown in FIG. 20C are the clock signal CK10 of about 10 MHz (Ref1) and the digital data of 20 MHz (Ref2)

which are inputted to the SPC basic unit of the third stage (Stage 3) of the SPC/bit-1 circuit, and the two parallel digital data of 10 MHz (Ref3 and Ref4) which are respectively delivered from the output nodes OUT111 and OUT112 of the above SPC basic unit. Also, the reset pulse (Ref5) is shown.

Also in FIG. 20C, from the digital data (Ref3 and Ref4) which are respectively delivered from the output nodes OUT111 and OUT112, the state is seen in which the inputted digital data (Ref2) have their frequency lowered to ½ (about 10 MHz) and are converted into the two parallel digital data (Ref3 and Ref4).

As exemplified above, the serial-to-parallel conversion (SPC) circuit for digital data according to the present invention exhibited the stable operation in spite of the fact that the frequency of the inputted digital data was the higher frequency of about 80 MHz. In addition, the highest operating frequency of the SPC circuit of the present invention fabricated this time was 140 MHz (inputted digital data were at 140 MHz, and a clock signal was at 70 MHz).

(Embodiment 4)

In this embodiment, there will be described another example of a process for fabricating the active matrix type liquid crystal display device which includes the serial-to-parallel conversion (SPC) circuit for digital data according to the present invention as explained in Embodiment 3 above. Also in the example of this embodiment, a plurality of TFTs are formed on a substrate having an insulating surface, and the active matrix circuit, source signal line driver circuit, gate signal line driver circuit, SPC circuit of the present invention, and other peripheral circuits are formed on the identical substrate. Herein, an inverter circuit which is the basic arrangement of the CMOS circuit will be explained with reference to FIGS. 15A through 15E and FIGS. 16A through 16C.

Reference will be had to FIGS. 15A through 15E. A glass substrate, a plastics substrate, a ceramics substrate, or the like can be employed as a substrate 6001. It is also allowed to employ a silicon substrate or a metal substrate, typified by a stainless steel substrate, whose surface is formed with an insulating film such as silicon oxide film or silicon nitride film. Of course, a quartz substrate is usable.

An underlying film 6002 made of silicon nitride film, and an underlying film 6003 made of silicon oxide film are formed on that surface of the substrate 6001 on which the TFTs are to be formed. The underlying films are formed by plasma CVD or sputtering, and are provided in order to prevent any impurity harmful to the TFTs from diffusing from the substrate 6001 into semiconductor layers. For this purpose, the underlying film 6002 made of silicon nitride film may be formed to a thickness of 20 through 100 nm, typically 50 nm, while the subbing film 6003 made of silicon oxide film may be formed to a thickness of 50 through 500 nm, typically 150 through 200 nm.

Of course, it is also allowed to form only either the underlying film 6002 made of silicon nitride film or the underlying film 6003 made of silicon oxide film. In the example, the double-layer structure was the most desirable in consideration of the reliability of the TFTs.

The semiconductor layer to be formed in contact with the subbing film 6003 should desirably be made of a crystalline semiconductor which is produced in such a way that an amorphous semiconductor formed by a film forming method, such as plasma CVD, reduced-pressure CVD or sputtering, is crystallized by a solid-phase growth method based on laser crystallization or thermal annealing. It is also possible to apply a microcrystalline semiconductor, which is formed by the above film forming method. Semiconductor materials which are applicable here, include silicon (Si), germanium (Ge), a silicon-germanium alloy, and silicon carbide. In addition, compound semiconductor materials such as gallium arsenide are usable.

The semiconductor layer is formed to be 10 through 100 nm thick, typically 50 nm thick. An amorphous semiconductor film produced by plasma CVD contains hydrogen at a rate of 10 through 40 atoms %. In this regard, the amorphous semiconductor film should desirably be dehydrogenated to hydrogen content of 5 atoms % or less by performing the step of a heat treatment at 400 through 500° C. in advance of the step of crystallization. Besides, an amorphous silicon film may well be formed by another producing method such as sputtering or vapor deposition. In this case, impurity elements such as oxygen and nitrogen contained in the film should desirably be decreased sufficiently.

In addition, since the underlying films and the amorphous semiconductor film can be formed by the same film forming method, the underlying film 6002, the underlying film 6003 and further the semiconductor layer may be consecutively formed. After the respective films have been formed, their surfaces do not come into contact with the atmospheric air, so that the contamination of the surfaces can be prevented. As a result, one of causes for incurring dispersion in the characteristics of the TFTs can be eliminated.

The step of crystallizing the amorphous semiconductor film may be relied on a known technique of laser crystallization or thermal crystallization. It is also possible to employ a crystalline semiconductor film based on a technique of thermal crystallization employing a catalyst element. Further, when the crystalline semiconductor film formed by the technique of thermal crystallization employing the catalyst element is subjected to the step of gettering so as to remove the catalyst element, excellent TFT characteristics can be attained.

The crystalline semiconductor film thus formed is overlaid with a resist mask in accordance with known patterning by the use of a first photomask, and it is patterned into a first insular semiconductor layer (active layer) 6005 and a second insular semiconductor layer (active layer) 6004 by dry etching.

Figure 15A:
FIGS. 15A through 15E are sectional views showing the example of a process for fabricating the active matrix type liquid crystal display device of Embodiment 4.

Subsequently, the surfaces of the second insular semiconductor layer 6004 and the first insular semiconductor layer 6005 are covered with a gate insulating film 6006 whose principal component is silicon oxide or silicon nitride. The gate insulating film 6006 may be formed by plasma CVD or sputtering to a thickness of 10 through 200 nm, preferably 50 through 150 nm (FIG. 15A).

Besides, resist masks 6007 and 6008 which cover the channel forming regions of the second insular semiconductor layer 6004 and the first insular semiconductor layer 6005, respectively, are formed using a second photomask. On this occasion, a resist mask 6009 may well be formed in a region for forming a wiring line.

Figure 15B:
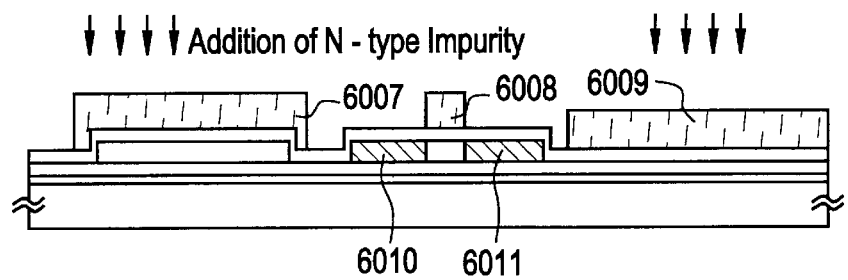

Thereafter, the step of forming second impurity regions is implemented by doping with an impurity element bestowing the n-conductivity type. Phosphorus (P), arsenic (As), antimony (Sb), etc. are known as impurity elements, which bestow the n-conductivity type on a crystalline semiconductor material Here in the example, the element phosphorus was employed, and ion doping with phosphine ($PH_3$) was used for the doping. Since, at this step, the element phosphorus is passed through the gate insulating film 6006 so as to dope the underlying semiconductor layer with this element, the acceleration voltage of the ion doping is set at a somewhat high voltage of 80 keV. The concentration of the element phosphorus to be introduced into the semiconductor layer as a dopant, should preferably be set within a range of $1\times10^{16}$ through $1\times10^{19}$ atoms/cm$^3$. Here, the concentration was set at $1\times10^{18}$ atoms/cm$^3$. Thus, regions 6010, 6011 doped with the element phosphorus were formed in the semiconductor layer. Parts of the second impurity regions formed here function as LDD regions (FIG. 15B).

In order to remove the resist masks, an alkaline releasing solution commercially available may well be used, but the use of ashing was effective in the example. The ashing is a method wherein plasma is generated in an oxidizing atmosphere, and wherein a hardened resist is exposed to the plasma so as to remove the resist. In the example, it was effective to add water vapor to oxygen in the atmosphere.

Figure 15C:
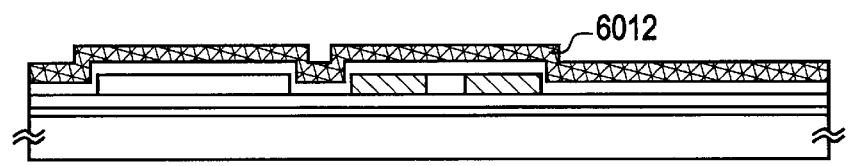

Thereafter, a first conductive layer 6012 is formed on the surface of the gate insulating film 6006. The first conductive layer 6012 is formed using an electrically conductive material whose principal component is an element selected from among elements Ta, Ti, Mo and W. Besides, the thickness of the first conductive layer 6012 may be set at 10 through 100 nm, preferably 150 through 400 nm (FIG. 15C).

It is possible to employ, for example, any of compounds such as WMo, TaN, MoTa, and WSi$_x$ (where 2.4<x<2.7 holds).

The conductive material such as Ta, Ti, Mo or W is higher in resistivity as compared with an element Al or Cu. In this example, however, the conductive material could be used without problem, subject to the largest area of about 100 cm$^2$ in relation to the area of the circuit to-be-fabricated.

Subsequently, resist masks 6013, 6014, 6015 and 6016 are formed using a third photomask. The resist mask 6013 serves to form the gate electrode of the p-channel TFT, and those 6015 and 6016 serve to form the gate wiring line and gate bus line thereof, respectively. Besides, the resist mask 6014 is formed covering the whole surface of the first insular semiconductor layer 6005, and it is provided as a mask for checking an impurity from being introduced into the semiconductor layer at the next step.

The unnecessary parts of the first conductive layer are removed by dry etching, thereby to form the second gate electrode 6017, gate wiring line 6019 and gate bus line 6020. Here in the example, ashing was effective to eliminate a residue remaining after the etching.

Thereafter, with the resist masks 6013, 6014, 6015 and 6016 left intact, the step of forming third impurity regions is performed in such a way that parts of the second insular semiconductor layer 6004 to form the p-channel TFT therein are doped with an impurity element bestowing the p-conductivity type. Boron (B), aluminum (Al) and gallium (Ga) are known as impurity elements, which bestow the p-conductivity type. Here in the example, the impurity element boron was employed, and ion doping was implemented with diborane (B$_2$H$_6$). Also in this case, the acceleration voltage of the ion doping is set at 80 keV so as to introduce the element boron at a concentration of $2\times10^{20}$ atoms/cm$^3$. Thus, the third impurity regions 6021, 6022 doped with the element boron at high concentrations are formed as illustrated in FIG. 15D.

Figure 15D:
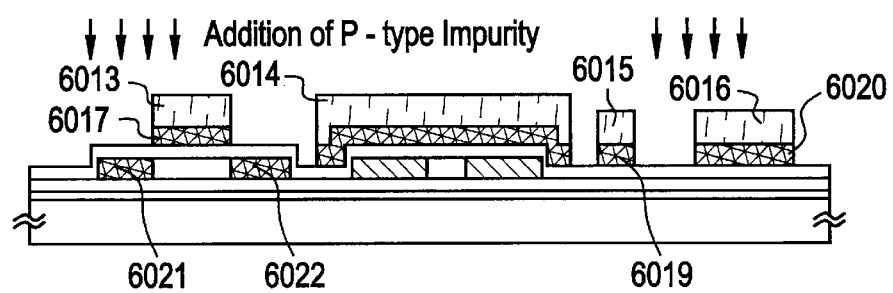
Figure 15E:
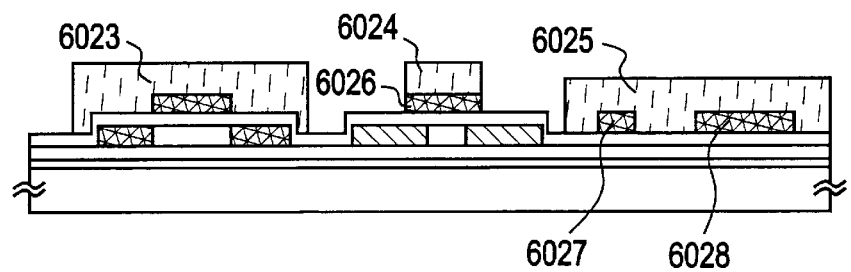

After the resist masks provided at the step of FIG. 15D have been removed, resist masks 6023, 6024 and 6025 are formed using a fourth photomask. The fourth photomask serves to form the gate electrode of the n-channel TFT, and the first gate electrode 6026 is formed by dry etching. On this occasion, the first gate electrode 6026 is formed so as to overlap parts of the second impurity regions 6010, 6011 through the gate insulating film (FIG. 15E).

Figure 16A:
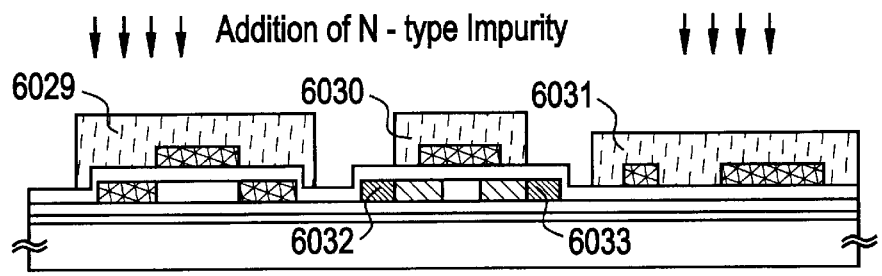
FIGS. 16A, 16B and 16C are views showing the example of the process for fabricating the active matrix type liquid crystal display device of Embodiment 4.

Besides, after the resist masks 6023, 6024 and 6025 have been completely removed, resist masks 6029, 6030 and 6031 are formed using a fifth photomask (refer to FIG. 16A). The resist mask 6030 is formed so as to cover the first gate electrode 6026 and also to overlap parts of the second impurity regions 6010, 6011. In other words, the resist mask 6030 serves to determine the offset magnitude of each LDD region.

Here, parts of the gate insulating film may well be removed using the resist mask 6030, thereby to previously denude the surface parts of the semiconductor layer in which first impurity regions are to be formed. With this contrivance, the next step of doping with an impurity element bestowing the n-conductivity type can be effectively performed.

Subsequently, the step of forming the first impurity regions is implemented by doping with the impurity element, which bestows the n-conductivity type. Thus, the first impurity region 6032 to serve as a source region and the first impurity region 6033 to serve as a drain region are formed. Here in the example, ion doping with phosphine (PH$_3$) was used for the doping. Since, also at this step, the element phosphorus is passed through the gate insulating film 6006 so as to dope the underlying semiconductor layer with this element, the acceleration voltage of the ion doping is set at 80 keV being somewhat high. The concentration of the element phosphorus in these regions is higher than at the step of doping with the first impurity element which bestows the n-conductivity type, and it should preferably be set at $1\times10^{19}$ through $1\times10^{21}$ atoms/cm$^3$. Here in the example, the concentration was set at $1\times10^{20}$ atoms/cm$^3$ (FIG. 16A).

Thereafter, a first interlayer insulating film 6034 and a second interlayer insulating film 6035 are formed on the surfaces of the gate insulating film 6006, first and second gate electrodes 6026, 6017, gate wiring line 6027 and gate bus line 6028. The first interlayer insulating film 6034 is a silicon nitride film, and it is 50 nm thick. On the other hand, the second interlayer insulating film 6035 is a silicon oxide film, and it is 950 nm thick.

The first interlayer insulating film 6034 of the silicon nitride film formed here is necessary for performing the next step of heat treatment. This film is effective to prevent the surfaces of the first and second gate electrodes 6026, 6017, gate wiring line 6027 and gate bus line 6028 from oxidizing.

The step of the heat treatment needs to be performed for activating the impurity elements which bestow the n-conductivity type and the p-conductivity type and which have been introduced at the individual concentrations. This step may be implemented by thermal annealing with an electric heating furnace, laser annealing with the excimer laser stated before, or rapid thermal annealing (RTA) with a halogen lamp. The laser annealing can activate the impurity elements at a lower substrate heating temperature, but it is difficult of activating them even in the regions concealed under the gate electrodes. Accordingly, the thermal annealing was employed here in the example. Conditions in this case are a nitrogen atmosphere, and a heating temperature of 300 through 700° C., preferably 350 through 550° C. Here in the example, the heat treatment was carried out at 450° C. for 2 hours.

At the step of the heat treatment, 3 through 90% of hydrogen may well be added into the nitrogen atmosphere beforehand. Besides, the heat treatment step should favorably be followed by the step of hydrogenization in an atmosphere containing 3~100% of hydrogen, at a temperature of 150 through 500° C., preferably 300 through 450° C., for 2 through 12 hours. Alternatively, hydrogen plasma processing may well be carried out at a substrate temperature of 150 through 500° C., preferably 200 through 450° C. With any of these contrivances, hydrogen compensated defects remaining in the semiconductor layers or at the interfaces thereof, whereby the characteristics of the TFTs could be enhanced.

Thereafter, the first interlayer insulating film 6034 and second interlayer insulating film 6035 are overlaid with predetermined resist masks by the use of a sixth photomask, and are formed by etching with contact holes which reach the source regions and drain regions of the respective TFTs. Besides, a second conductive layer is formed, and source electrodes 6036, 6037 and a drain electrode 6038 are formed by the step of patterning which employs a seventh photomask. In this embodiment, the second conductive layer for the electrodes is formed as a triple-layer structure in which a Ti film being 100 nm thick, an Al film containing Ti and being 300 nm thick, and a Ti film being 150 nm thick are consecutively formed by sputtering, though not shown.

Owing to the above steps, the p-channel TFT is formed in self-alignment, and the n-channel TFT is formed in non-self-alignment.

The n-channel TFT of the CMOS circuit is formed with the channel forming region 6042, first impurity regions 6045, 6046, and second impurity regions 6043, 6044. Here, the second impurity regions 6043, 6044 are respectively constituted by regions (GOLD regions) 6043a, 6044a that the gate electrode overlaps, and regions (LDD regions) 6043b, 6044b that the gate electrode does not overlap. Besides, the first impurity region 6045 becomes the source region, while the first impurity region 6046 becomes the drain region.

On the other hand, the p-channel TFT is formed with the channel-forming region 6039, and third impurity regions 6040, 6041. Besides, the third impurity region 6040 becomes the source region, while the third impurity region 6041 becomes the drain region (FIG. 16B).

Figure 16B:
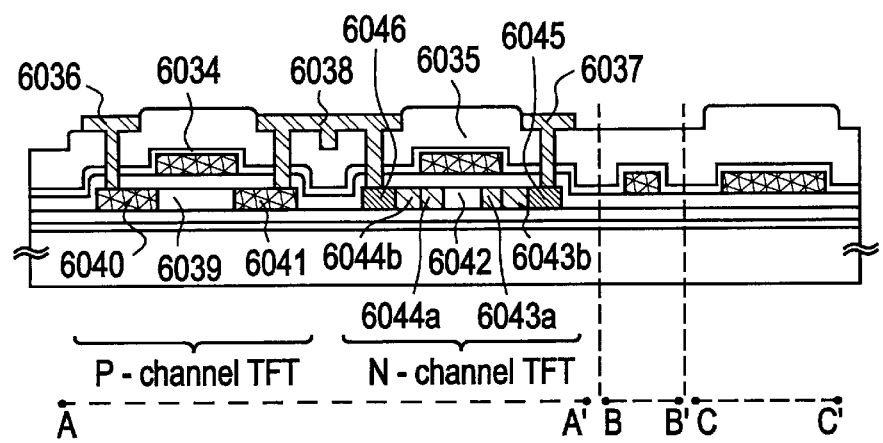
Figure 16C:
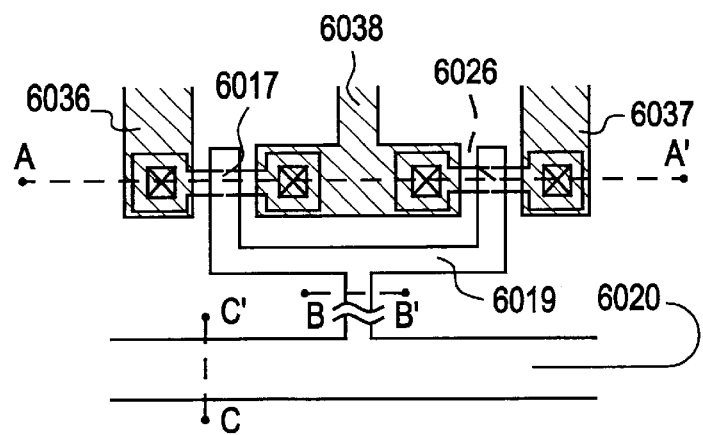

Further, FIG. 16C illustrates the top plan view of the inverter circuit, and the A–A' sectional structure of the TFT portion, the B–B' sectional structure of the gate wiring line portion, and the C–C' sectional structure of the gate bus line portion correspond to the illustration of FIG. 16B. In this embodiment, the gate electrode, gate wiring line and gate bus line are formed from the first conductive layer.

In FIGS. 15A through 15E and FIGS. 16A through 16C, the CMOS circuit in which the n-channel TFT and p-channel TFT are complementarily combined is exemplified, but an NMOS circuit, an active matrix circuit, etc. employing n-channel TFTs are similarly fabricated.

The active matrix substrate thus prepared is fabricated into the active matrix type liquid crystal display device by the same method as in Embodiment 3.

(Embodiment 5)

In the active matrix type liquid crystal display device of Embodiments 3 and 4 described above, a TN mode based on the nematic liquid crystal is employed as a display mode, but another display mode can also be employed.

Further, an active matrix type liquid crystal display device may well be constructed using a thresholdless antiferroelectric liquid crystal or ferroelectric liquid crystal of fast response time.

By way of example, it is possible to employ liquid crystals disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), pp.671–673, "Thresholdless antiferroelectricity in liquid crystals and its application to displays" by S. Inui et al.; and U.S. Pat. No. 5,594,569.

A liquid crystal exhibiting an antiferroelectric phase in a certain temperature range is termed an "antiferroelectric liquid crystal". A mixed liquid crystal having the antiferroelectric liquid crystal includes what is called a "thresholdless mixed antiferroelectric liquid crystal" exhibiting electrooptic response characteristics in which a transmittance changes continuously versus an electric field. The thresholdless mixed antiferroelectric liquid crystal includes one which exhibits so-called "V-shaped electrooptic response characteristics", and one whose drive voltage is about ±2.5 V (about 1 through 2 μm in terms of a cell thickness) has been found out.

In this regard, FIG. 24 illustrates an example showing the "optical transmittance versus applied voltage" characteristics of the thresholdless mixed antiferroelectric liquid crystal exhibitive of the V-shaped electrooptic response. The axis of ordinates of the graph shown in FIG. 24 represents the transmittance, while the axis of abscissas represents the applied voltage. By the way, the transmission axis of a polarizer on the entrance side of the liquid-crystal display device is set to be substantially parallel to that normal direction of the smectic layer of the thresholdless mixed antiferroelectric liquid crystal that is in substantial agreement with the rubbing direction of the liquid crystal display device. Besides, the transmission axis of a polarizer on the exit side of the display device is set to be substantially orthogonal to that of the polarizer on the entrance side.

As seen from FIG. 24, low-voltage drive and gradation display become possible when such a thresholdless mixed antiferroelectric liquid crystal is adopted.

Even in a case where such a thresholdless mixed antiferroelectric liquid crystal of low-voltage drive is used for the active matrix type liquid crystal display device which includes the serial-to-parallel conversion (SPC) circuit for digital data according to the present invention, the output voltage of a DAC (D/A conversion circuit) can be lowered, so that the operating supply voltage of the DAC can be lowered and that the operating supply voltage of a driver can be set low. It is consequently possible to realize the low power dissipation and high reliability of the active matrix type liquid crystal display device.

Therefore, the use of the thresholdless mixed antiferroelectric liquid crystal of low-voltage drive as stated above is effective also in case of employing a TFT whose LDD region (low-concentration impurity region) is comparatively narrow (for example, 0 nm through 500 nm or 0 nm through 200 nm).

In general, the thresholdless mixed antiferroelectric liquid crystal exhibits a spontaneous polarization of large magnitude, and it has a large dielectric constant in itself. Therefore, in the case where the thresholdless mixed antiferroelectric liquid crystal is used for the liquid crystal display device, the pixel of the display device requires a retention capacitance of comparatively large value. The thresholdless mixed antiferroelectric liquid crystal to be used should preferably have a small spontaneous polarization.

Incidentally, since the low-voltage drive is realized by employing the thresholdless mixed antiferroelectric liquid crystal as stated above, the power dissipation of the active matrix type liquid crystal display device can be lowered.

Besides, any of liquid crystals having the electrooptic characteristics as shown in FIG. 24 can be employed as the display medium of the liquid crystal display device according to the present invention.

Further, any other display medium the optical characteristics of which can be modulated in response to the applied voltage thereof may well be employed for an active matrix type semiconductor display device including the SPC circuit of the present invention. By way of example, an electroluminescent element may well be employed.

Still further, apart from the TFT, a MIM element or the like may well be employed as an active element that constitutes the active matrix circuit of the active matrix type liquid crystal display device.

Yet further, although the TFTs of top gate type have been exemplified in Embodiments 3 and 4 described before, the active matrix type semiconductor display device (typically, liquid crystal display device) including the SPC circuit of the present invention may well be constructed of TFTs of bottom gate type such as reverse stagger type.

(Embodiment 6)

The active matrix type semiconductor display device (covering the active matrix type liquid crystal display device) that adopts the serial-to-parallel conversion (SPC) circuit for digital data according to the present invention has various applications. In this embodiment, there will be described semiconductor devices or products in each of which the active matrix type semiconductor display device adopting the SPC circuit of the present invention is incorporated.

Mentioned as such semiconductor devices or products are a video camera, a still camera, a projector, a head-mounted type display, a car navigation equipment, a personal computer, a portable information terminal (such as mobile computer or portable telephone set), and so forth. Examples of them are illustrated in FIGS. 17A and 17B and FIGS. 18A through 18E.

Figure 17A:
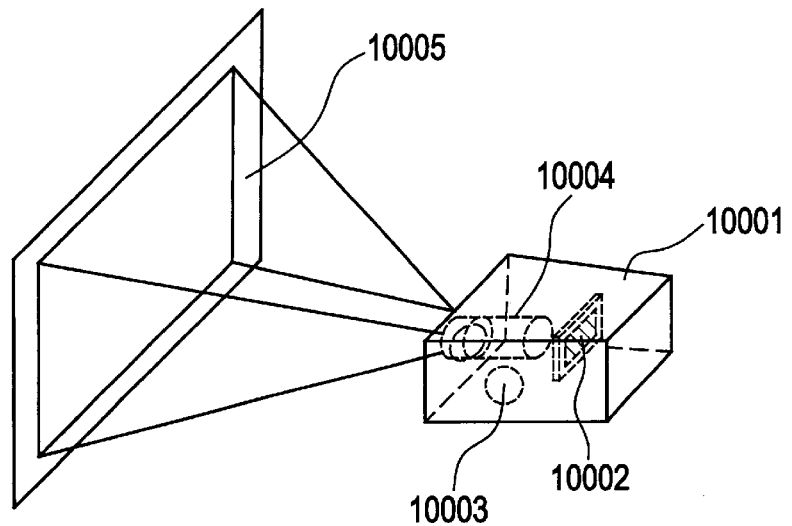
FIGS. 17A and 17B are schematic views each showing an example of a projector in which an active matrix type semiconductor display device employing the SPC circuit of the present invention is incorporated.

FIG. 17A shows a front type projector, which is configured of the body 10001, an active matrix type semiconductor display device 10002 (typically, liquid crystal display device), a light source 10003, an optical system 10004, and a screen 10005. Incidentally, although the front type projector including the single semiconductor display device is exemplified in FIG. 17(A), a front type projector of higher resolution and higher definition can be realized by incorporating three active matrix type semiconductor display devices (which correspond respectively to lights in colors R, G and B).

Figure 17B:
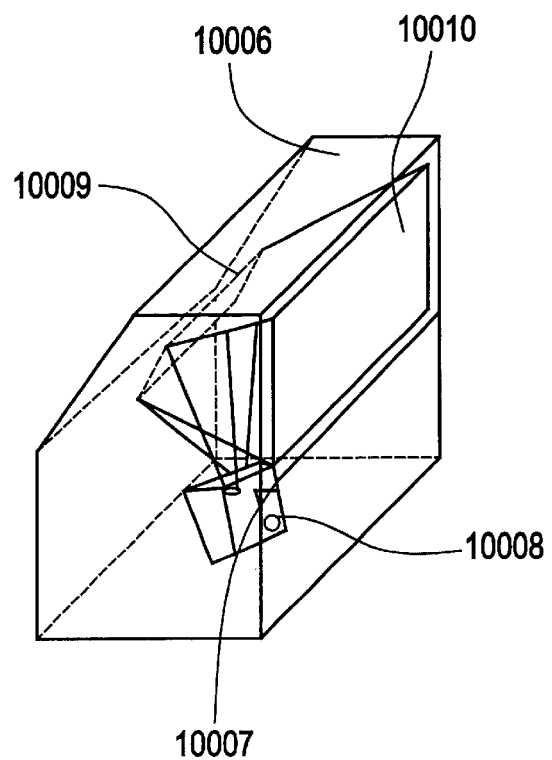

FIG. 17B shows a rear type projector, in which numeral 10006 designates the body, numeral 10007 active matrix type semiconductor display devices, numeral 10008 a light source, numeral 10009 a reflector, and numeral 10010 a screen. Here in FIG. 17B, the rear type projector includes the three active matrix type semiconductor display devices (which correspond respectively to lights in colors R, G and B).

Figure 18A:
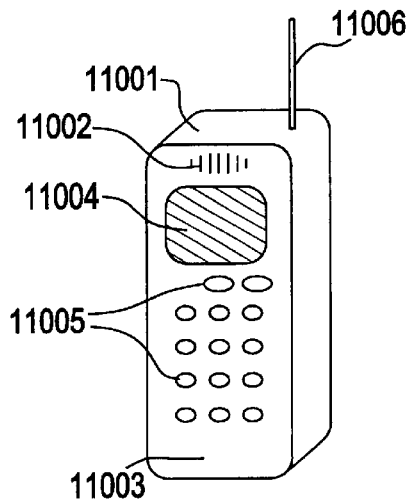
FIGS. 18A through 18E are schematic views each showing an example of an electronic equipment in which an active matrix type semiconductor display device employing the SPC circuit of the present invention is incorporated.

FIG. 18A shows a portable telephone set, which is configured of the body 11001, a voice output unit 11002, a voice input unit 11003, an active matrix type semiconductor display device 11004, operating switches 11005, and an antenna 11006.

Figure 18B:
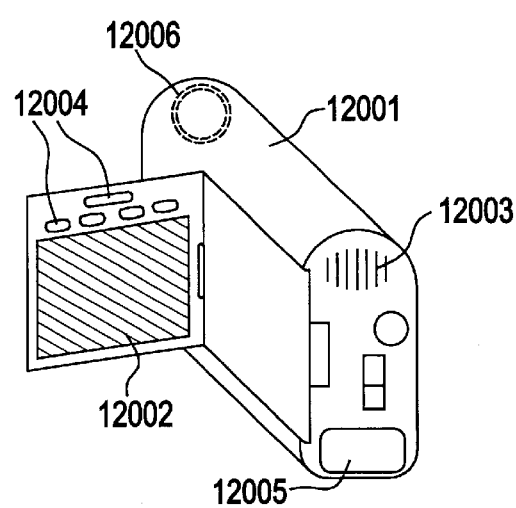

FIG. 18B shows a video camera, which is configured of the body 12001, an active matrix type semiconductor display device 12002, a sound input unit 12003, operating switches 12004, a battery 12005, and an image receiving unit 12006.

Figure 18C:
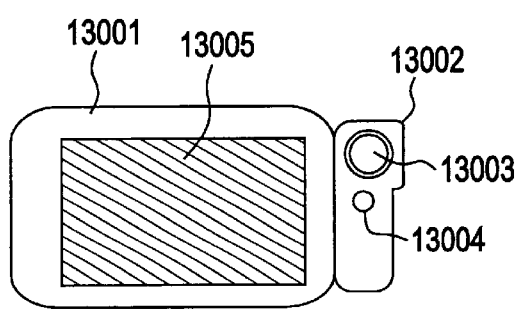

FIG. 18C shows a mobile computer, which is configured of the body 13001, a camera unit 13002, an image receiving unit 13003, an operating switch 13004, and an active matrix type semiconductor display device 13005.

Figure 18D:
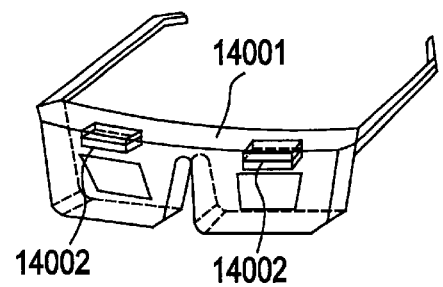

FIG. 18D shows a head-mounted type display, which is configured of the body 14001, and active matrix type semiconductor display devices 14002.

Figure 18E:
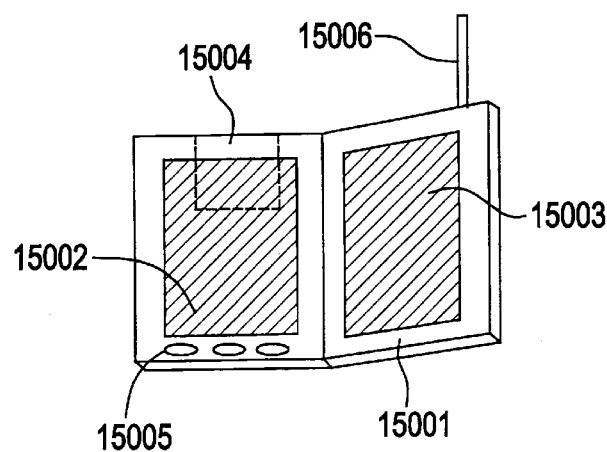

FIG. 18E shows a portable book (electronic book), which is configured of the body 15001, active matrix type semiconductor display devices 15002, 15003, a storage medium 15004, operating switches 15005, and an antenna 15006.

(Embodiment 7)

In this embodiment, there will be described another example of the fabrication of an active matrix type liquid crystal display device which includes the serial-to-parallel conversion (SPC) circuit for digital data according to the present invention. By the way, in this embodiment, substantially the same processes as in the example of fabrication explained in Embodiment 3 are applicable to parts not especially specified.

In the example of this embodiment, in the state of FIG. 11A, the whole surface of the amorphous silicon film 5003 was coated with a nickel acetate solution without employing the mask insulating film 5004, as the step of doping with a catalyst element.

After the end of the step of doping with the catalyst element, the resulting substrate is dehydrogenated at 450° C. for one hour or so. Thereafter, the amorphous silicon film 5003 is crystallized by subjecting the resulting substrate to a heat treatment at a temperature of 500 through 960° C. (typically 550 through 650° C.) in an inactive atmosphere, a hydrogen atmosphere or an oxygen atmosphere for 4 through 24 hours. In this embodiment, the heat treatment is conducted at 590° C. in a nitrogen atmosphere for 8 hours.

Thereafter, a heat treatment for gettering the catalyst element (the process for gettering the catalyst element) is conducted. In case of this embodiment, the atmosphere of the heat treatment is caused to contain a halogen element, and the effect of gettering the catalyst element by the halogen element is utilized. Herein, in order to satisfactorily attain the gettering effect based on the halogen element, the heat treatment should favorably be carried out at a temperature exceeding 700° C. At temperatures of and below 700° C., it is apprehended that a halogen compound in the treatment atmosphere will become difficult of decomposition, failing to attain the gettering effect. In this case, typically usable as a gas that contains the halogen element is at least one species selected from among halogen containing compounds such as HCl, HF, $NF_3$, HBr, $Cl_2$, $ClF_3$, $BCl_2$, $F_2$, and $Br_2$. In the example of this embodiment, the gettering process was implemented at 950° C. in an atmosphere containing $O_2$ and HCl, simultaneously with the formation of a thermal oxidation film.

Thereafter, a gate insulating film is formed. In the example of this embodiment, the thickness of the gate insulating film was set at the final thickness of about 50 nm.

Regarding the other steps, Embodiment 3 can be referred to.

The characteristics of the TFTs attained by the fabricating process of this embodiment are listed in Table 1 below.

TABLE 1

| L/W = 6.8/7.6 [µm] | Nch | Pch |
|---|---|---|
| Ion [µa] | 227 | 91.5 |
| Ioff [pA] | 3.10 | 11.8 |
| Ion/Ioff [dec.] | 7.86 | 6.89 |
| Vth [V] | 0.44 | −0.56 |
| S value [V/dec.] | 0.08 | 0.10 |

TABLE 1-continued

| L/W = 6.8/7.6 [μm] | Nch | Pch |
|---|---|---|
| μFE (max) [cm²/Vs] | 314 | 131 |
| *μFE (max) [cm²/Vs] | 425 | 262 |

In Table 1, L/W denotes (channel length/channel width), Ion (ON current), Ioff (OFF current), Ion/Ioff (common logarithm of the ratio between the ON current and the OFF current), Vth (threshold voltage), S value (sub-threshold voltage swing), and pFE (field effect mobility). Besides, *μFE denotes the μFE of a TFT whose channel length L=50 μm.

Figure 21:
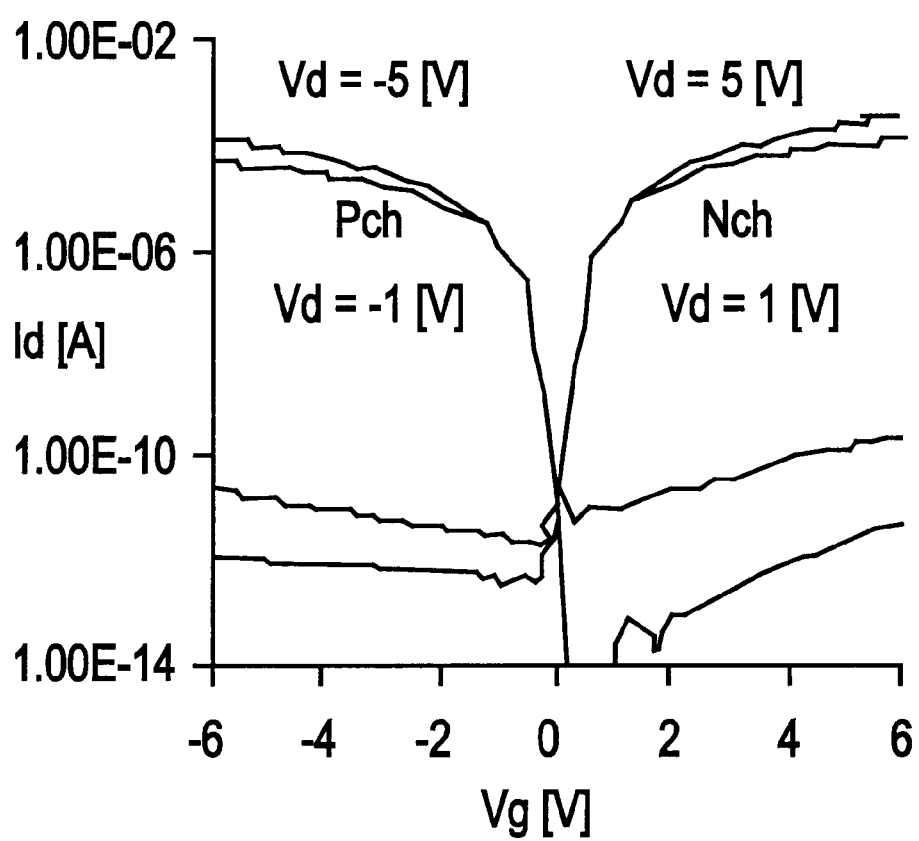
FIG. 21 is a graph showing the characteristics of TFTs.

FIG. 21 illustrates the graph of the TFT characteristics attained by the fabricating process of this embodiment. In the figure, Vg denotes a gate voltage, Id a drain current, and Vd a drain voltage.

(Embodiment 8)

In this embodiment, there will be described an example of an active matrix type liquid crystal display device which includes the serial-to-parallel conversion (SPC) circuit for digital video data according to the present invention, and which was fabricated by the inventors.

Table 2 below lists the specifications of the active matrix type liquid crystal display device including the SPC circuit of the present invention as was fabricated by the inventors.

TABLE 2

| Display diagonal size | 2.6 inches |
|---|---|
| Number of pixels | 1920 × 1080 |
| Pixel size | 30 (H) × 30 (V) μm |
| Aperture ratio | 46% |
| Input data | 8 bit |
| Power supply (Logic) | 5 V |
| Input digital data rates | 80 MHz |
| Frequency of data driver | 10 MHz |
| Frequency of scan driver | 8.1 kHz |
| Addressing mode | Column inversion |
| Contrast ratio | >100 |

"Data drivers" and "scan driver" in Table 2 signify the source signal line driver circuit and the gate signal line driver circuit, respectively. In the example of this embodiment, a source line inversion display was presented as an addressing mode.

Figure 22:
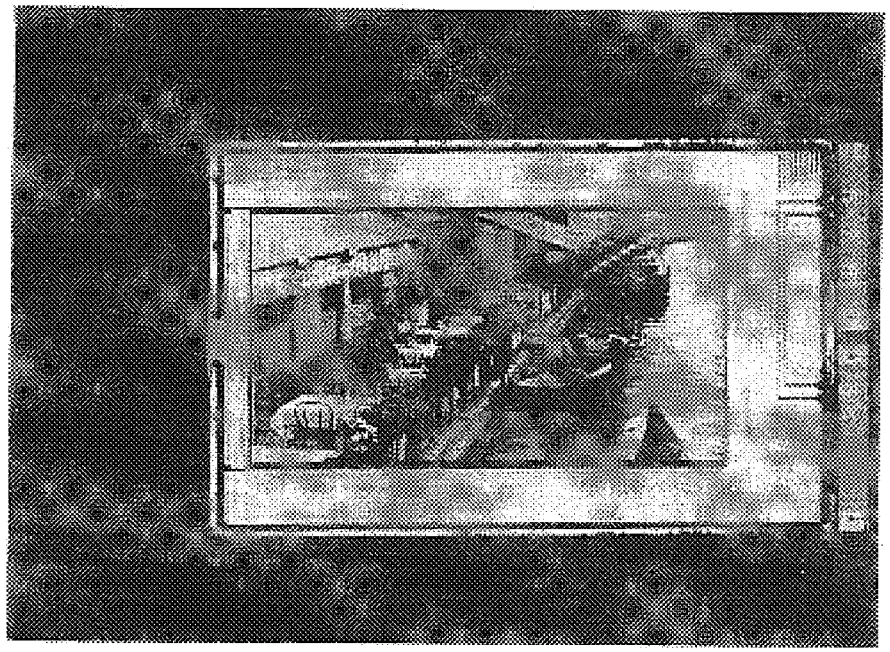
FIG. 22 illustrates a display example of an active matrix type liquid crystal display device including an SPC circuit for digital video data according to the present invention.

FIG. 22 illustrates a displayed example of the active matrix type liquid crystal display device which includes the serial-to-parallel conversion (SPC) circuit for digital video data (8 bit) according to the present invention, and which has been described in this embodiment.

Figure 23:
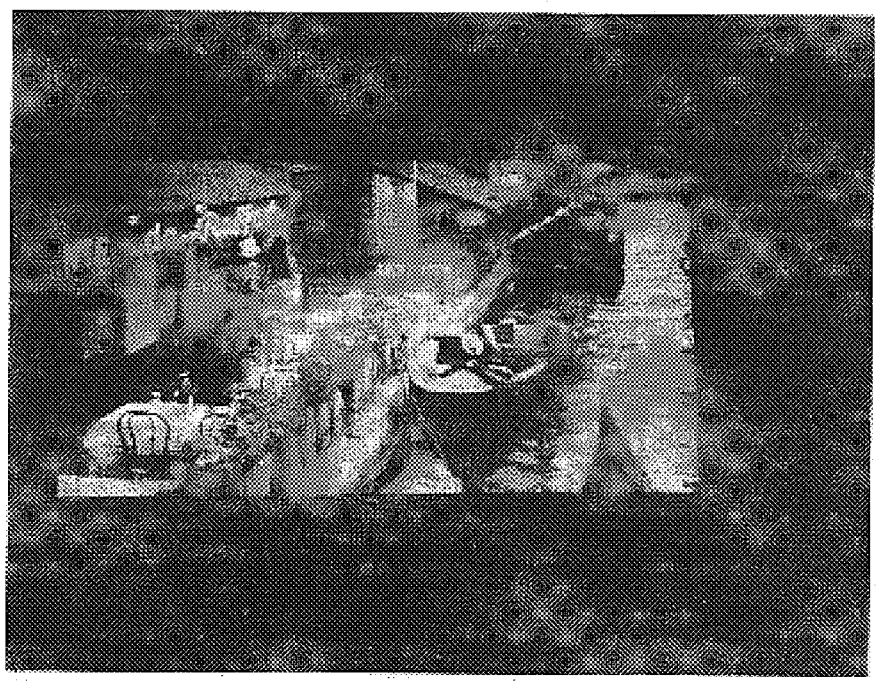
FIG. 23 illustrates a display example of a projector that employs active matrix type liquid crystal display devices each including the SPC circuit for digital video data according to the present invention.

In addition, FIG. 23 illustrates a displayed example of a front type projector employing the three active matrix type liquid crystal display devices each of which includes the SPC circuit for digital video data (8 bit) according to the present invention, and each of which has been described in this embodiment. Regarding the front type projector, refer to Embodiment 6.

It is seen from FIGS. 22 and 23 that, in spite of the high resolution of 1980×1080 pixels, the active matrix type liquid crystal display device including the SPC circuit of the present invention can realize displays of very high definition and displays of very fine gradations.

(Embodiment 9)

In this embodiment, there will be described an example in which an EL (electroluminescent) display panel was fabricated by applying the present invention.

Figure 25A:
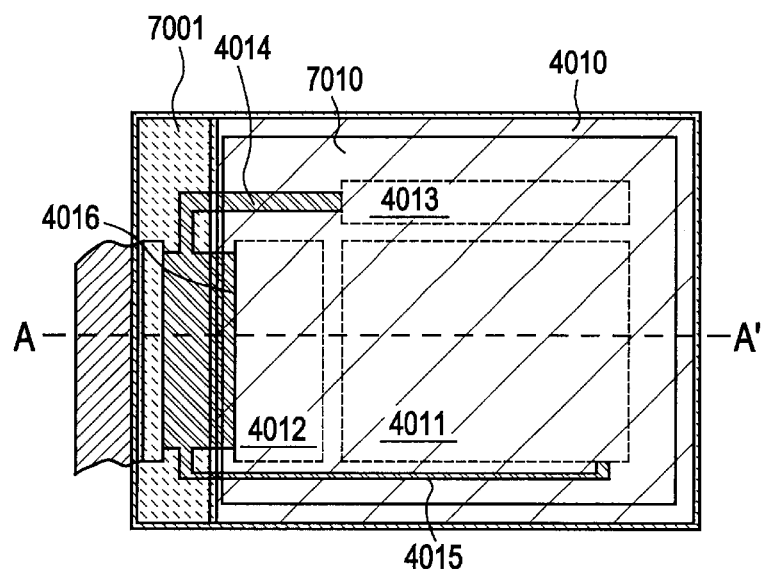
FIGS. 25A and 25B are a top plan view and a sectional view showing the construction of an example of an EL panel of active matrix type according to the present invention, respectively (Embodiment 9)

FIG. 25A is the top plan view of the EL display panel applying the present invention. Referring to FIG. 25A, numeral 4010 designates a substrate, numeral 4011 a pixel unit, numeral 4012 a source side driver circuit, and numeral 4013 a gate side driver circuit. The respective driver circuits are led to an FPC (flexible printed circuit) 4017 (refer also to FIG. 25B) via wiring lines 4014, 4015 and 4016, and are connected to an external equipment.

On this occasion, a cover member 7010, a sealing member (also termed "housing member") 7000 (FIG. 25B), and a hermetic seal member (second sealing member) 7001 are disposed so as to surround, at least, the pixel unit, and preferably, the driver circuits and the pixel unit.

Figure 25B:
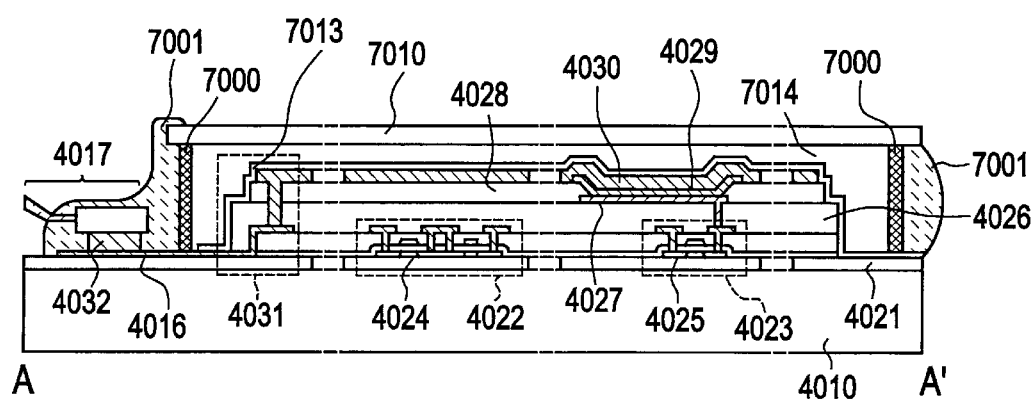

In addition, FIG. 25B illustrates the sectional structure of the EL display panel of this embodiment. TFTs for the driver circuit, 4022 (here, a CMOS circuit in which an n-channel TFT and a p-channel TFT are combined is depicted), and a TFT for the pixel unit, 4023 (here, only a TFT for controlling current toward an EL element is depicted) are formed on a substrate 4010 as well as a subbing film 4021. These TFTs may have a known structure (top-gate structure or bottom-gate structure).

The present invention can be adopted for the driver circuit TFTs 4022 and the pixel unit TFT 4023.

When the driver circuit TFTs 4022 and the pixel unit TFT 4023 have been finished up by employing the present invention, a pixel electrode 4027 which is made of a transparent conductive film and which is electrically connected with the drain of the pixel unit TFT 4023 is formed on an interlayer insulating film (a flattening film) 4026 which is made of a resin material. A compound (called "ITO") of indium oxide and tin oxide, or a compound of indium oxide and zinc oxide can be used for the transparent conductive film. Besides, after the formation of the pixel electrode 4027, an insulating film 4028 is deposited and is formed with an opening on the pixel electrode 4027.

Subsequently, an EL layer 4029 is formed. The EL layer 4029 may be constructed into a multilayer structure or a single-layer structure by optionally combining known EL materials (a hole injection layer, a hole transport layer, a luminescent layer, an electron transport layer, and an electron injection layer). The structure may be determined by known techniques. Besides, the EL materials are classified into low-molecular materials and high-molecuar (polymer) materials. In case of employing the low-molecular material, vapor deposition is relied on, whereas in case of employing the high-molecular material, a simple method such as spin coating, ordinary printing or ink jet printing can be relied on.

In this embodiment, the EL layer is formed in accordance with vapor deposition by employing a shadow mask. Luminescent layers (red luminescent layer, green luminescent layer and blue luminescent layer) capable of luminescences of different wavelengths are formed every pixel by employing the shadow mask, whereby a color display becomes possible. There are also a scheme in which color conversion measures (CCM) and color filters are combined, and a scheme in which a white luminescent layer and color filters are combined, and any of such methods may well be employed. Of course, an EL display panel of monochromatic luminescence can be constructed.

After the EL layer 4029 has been formed, it is overlaid with a cathode 4030. Moisture and oxygen to exist at the boundary between the cathode 4030 and the EL layer 4029 should desirably be excluded to the utmost beforehand. Accordingly, such a contrivance is required that the EL layer 4029 and the cathode 4030 are consecutively formed in vacuum, or that the EL layer 4029 is formed in an inactive atmosphere, followed by forming the cathode 4030 without opening the resulting substrate to the atmospheric air. In this embodiment, the film formation as explained above is incarnated by employing a film forming equipment of multichamber system (cluster tool system).

By the way, in this embodiment, the multilayer structure consisting of a LiF (lithium fluoride) film and an Al (aluminum) film is employed for the cathode 4030. More concretely, the LiF film being 1 nm thick is formed on the EL layer 4029 by vapor deposition, and it is overlaid with the Al film being 300 nm thick. It is, of course, allowed to employ an MgAg electrode that is a known cathode material. Besides, the cathode 4030 is connected to the wiring line 4016 in a region indicated by numeral 4031. The wiring line 4016 is a supply voltage feed line for applying a predetermined voltage to the cathode 4030, and it is connected to the FPC 4017 through a conductive paste material 4032.

For the purpose of electrically connecting the cathode 4030 and the wiring line 4016 in the region 4031, contact holes need to be formed in the interlayer insulating film 4026 and the insulating film 4028. They may be previously formed at the etching of the interlayer insulating film 4026 (at the formation of the contact hole for the pixel electrode) and at the etching of the insulating film 4028 (at the formation of an opening before the formation of the EL layer). Alternatively, in etching the insulating film 4028, also the interlayer insulating film 4026 may be etched in collective fashion. In this case, if the interlayer insulating film 4026 and the insulating film 4028 are made of the same resin material, the contact holes can be formed into favorable shapes.

A passivation film 7013, a filler member 7014 and a cover member 7010 are formed covering the surface of the EL element thus formed.

Further, the sealing member 7000 is disposed between the cover member 7010 and the substrate 4010 so as to surround the EL element portion, and the hermetic seal member (second sealing member) 7001 is formed outside the sealing member 7000.

On this occasion, the filler member 7014 functions also as an adhesive for bonding the cover member 7010. Usable for the filler member 7014 is PVC (polyvinyl chloride), an epoxy resin, a silicone resin, PVB (polyvinylbutylal) or EVA (ethylene vinyl acetate). When a drying agent is introduced into the filler member 7014 beforehand, favorably a hygroscopic effect can be kept.

Besides, a spacer may well be contained in the filler member 7014. On this occasion, a granular material made of BaO or the like may well be selected as the spacer, thereby to endow the spacer itself with hygroscopicity.

In the case of utilizing the spacer, the passivation film 7013 can relax a spacer pressure. It is also allowed to dispose a resin film or the like relaxing the spacer pressure, separately from the passivation film 7013.

Usable as the cover member 7010 is a glass plate, an aluminum plate, a stainless steel plate, an FRP (Fiberglass-Reinforced Plastics) plate, a PVF (polyvinyl fluoride) film, a Mylar film, a polyester film, or an acrylic film. By the way, in the case of using the substance PVB or EVA for the filler member 7014, it is favorable to employ a sheet having a structure in which an aluminum foil being several tens μm thick is sandwiched in between the PVF films or the Mylar films.

Depending upon the direction of luminescence (the radiating direction of light) from the EL element, however, the cover member 7010 needs to have a light transmitting property.

In addition, the wiring line 4016 is electrically connected to the FPC 4017 by passing through the gap between the sealing member 7000 as well as the hermetic seal member 7001 and the substrate 4010. Although the wiring line 4016 has been explained here, the other wiring lines 4014, 4015 are electrically connected to the FPC 4017 by passing under the sealing member 7000 and the hermetic seal member 7001, likewise to the wiring line 4016.

(Embodiment 10)

In this embodiment, an example in which an EL display panel in an aspect different from Embodiment 9 was fabricated by applying the present invention will be described with reference to FIGS. 26A and 26B. In these figures, the same numerals as in FIGS. 25A and 25B indicate the same portions, which shall be omitted from description.

Figure 26A:
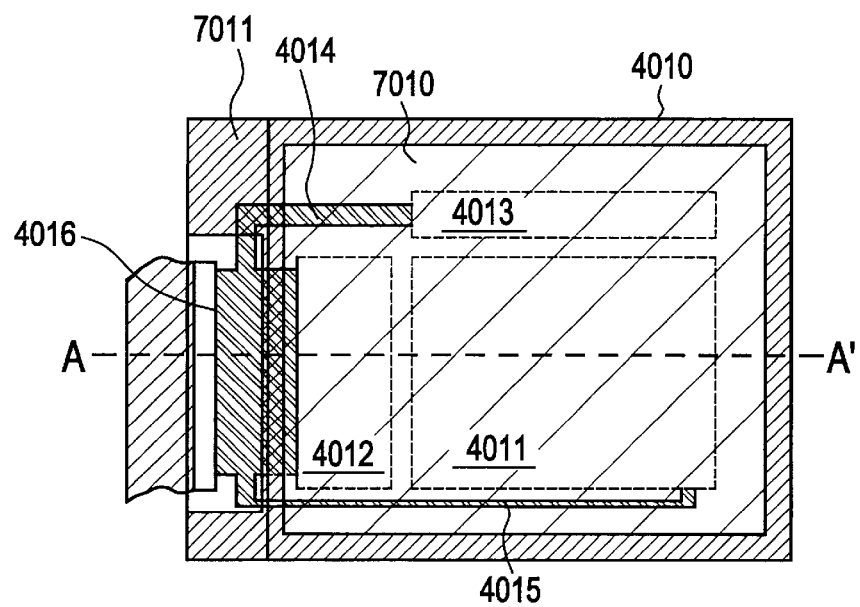
FIGS. 26A and 26B are a top plan view and a sectional view showing the construction of another example of the active matrix type EL panel of the present invention, respectively (Embodiment 10)
Figure 26B:
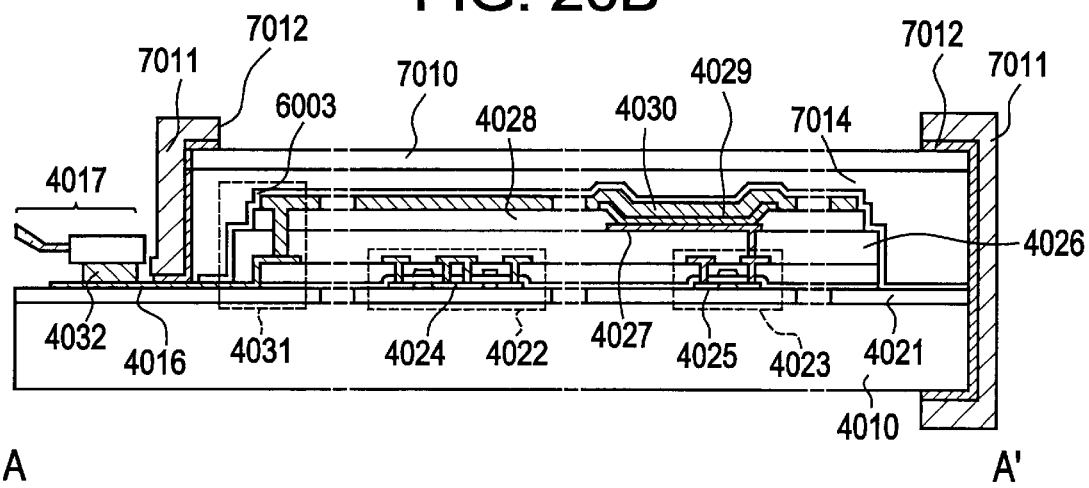

FIG. 26A is the top plan view of the EL display panel in this embodiment, and a sectional view taken along a plane A–A' indicated in FIG. 26A is illustrated in FIG. 26B.

The steps till the step of forming the passivation film 7013 so as to cover the surface of the EL element are implemented in accordance with Embodiment 9.

Further, a filler member 7014 is disposed so as to cover the EL element. The filler member 7014 functions also as an adhesive for bonding a cover member 7010. Usable for the filler member 7014 is PVC (polyvinyl chloride), an epoxy resin, a silicone resin, PVB (polyvinyl butylal) or EVA (ethylene vinyl acetate). When a drying agent is introduced into the filler member 7014 beforehand, favorably a hygroscopic effect can be kept.

Besides, a spacer may well be contained in the filler member 7014. On this occasion, a granular material made of BaO or the like may well be selected as the spacer, thereby to endow the spacer itself with hygroscopicity.

In the case of utilizing the spacer, the passivation film 7013 can relax a spacer pressure. It is also allowed to dispose a resin film or the like relaxing the spacer pressure, separately from the passivation film 7013.

Usable as the cover member 7010 is a glass plate, an aluminum plate, a stainless steel plate, an FRP (Fiberglass-Reinforced Plastics) plate, a PVF (polyvinyl fluoride) film, a Mylar film, a polyester film, or an acrylic film. By the way, in the case of using the substance PVB or EVA for the filler member 6004, it is favorable to employ a sheet having a structure in which an aluminum foil being several tens μm thick is sandwiched in between the PVF films or the Mylar films.

Depending upon the direction of luminescence (the radiating direction of light) from the EL element, however, the cover member 7010 needs to have a light transmitting property.

Subsequently, the cover member 7010 is bonded using the filler member 7014, whereupon a frame member 7011 is mounted so as to cover the side surfaces (exposed surfaces) of the filler member 7014. The frame member 7011 is bonded by a sealing member (functioning as an adhesive) 7012. On this occasion, a photosetting resin should favorably employ for the sealing member 7012. However, if allowed by the thermal resistance of the EL layer, a thermosetting resin may well be employed. Incidentally, the sealing member 7012 should desirably be of a material that prevents moisture and oxygen from permeating therethrough, to the utmost. It is also allowed to add a drying agent into the sealing member 7012.

Besides, a wiring line 4016 is electrically connected to an FPC 4017 by passing through the gap between the sealing member 6002 and a substrate 4010. Although the wiring line 4016 has been explained here, other wiring lines 4014, 4015 are electrically connected to the FPC 4017 by passing under the sealing member 7012, likewise to the wiring line 4016.

(Embodiment 11)

Figure 27:
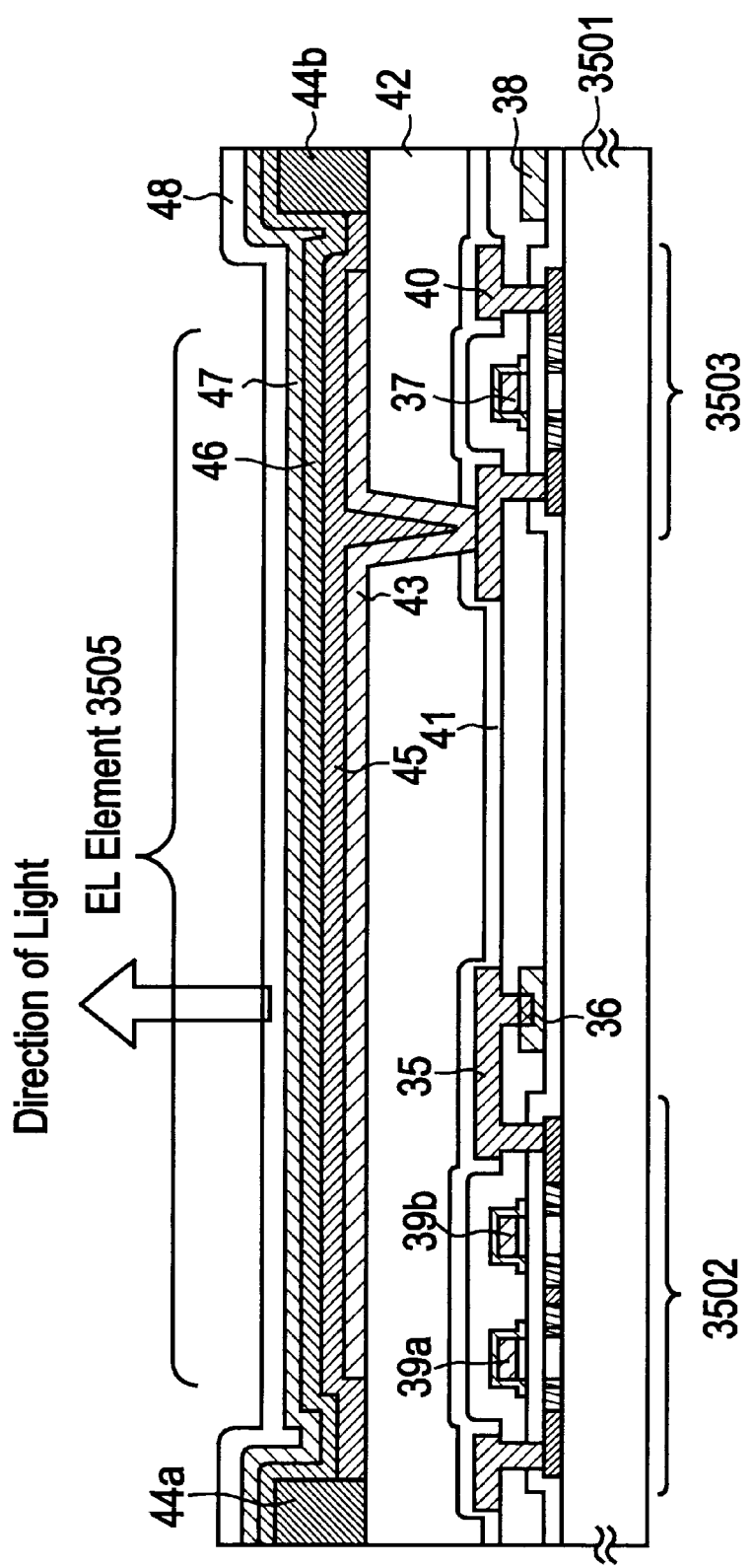
FIG. 27 is a sectional view of still another example of the active matrix type EL panel of the present invention (Embodiment 11)
Figure 28A:
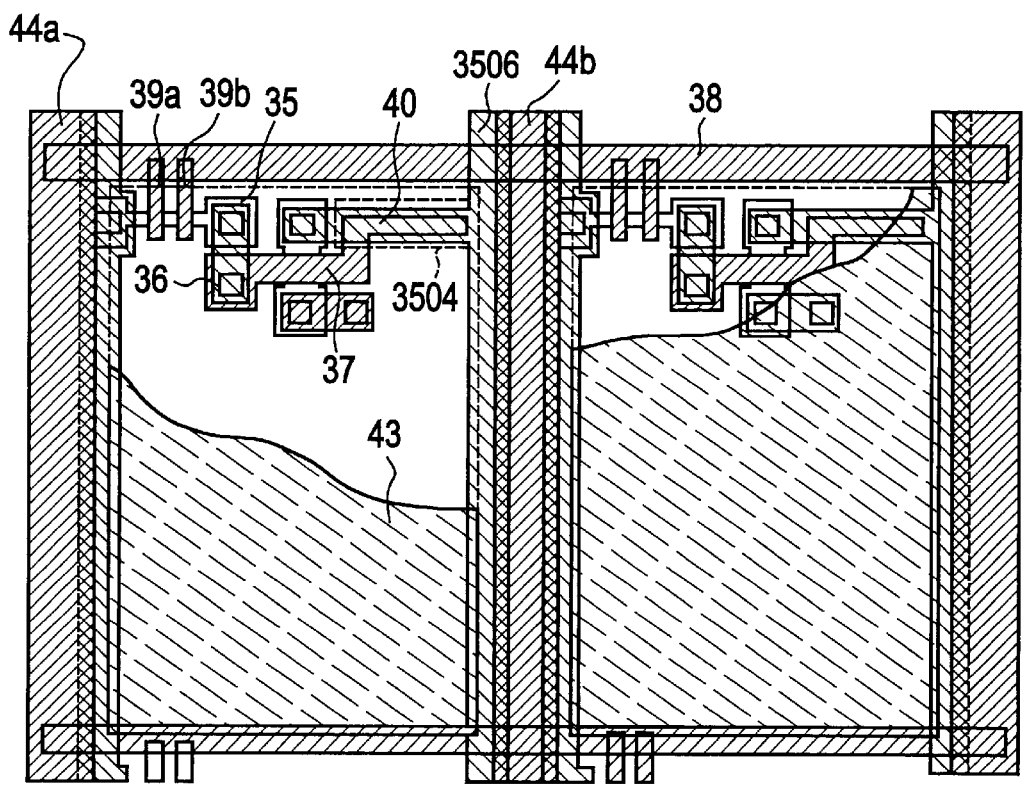
FIGS. 28A and 28B are a top plan view and a circuit diagram of the example of the active matrix type EL panel shown in FIG. 27, respectively (Embodiment 11)
Figure 28B:
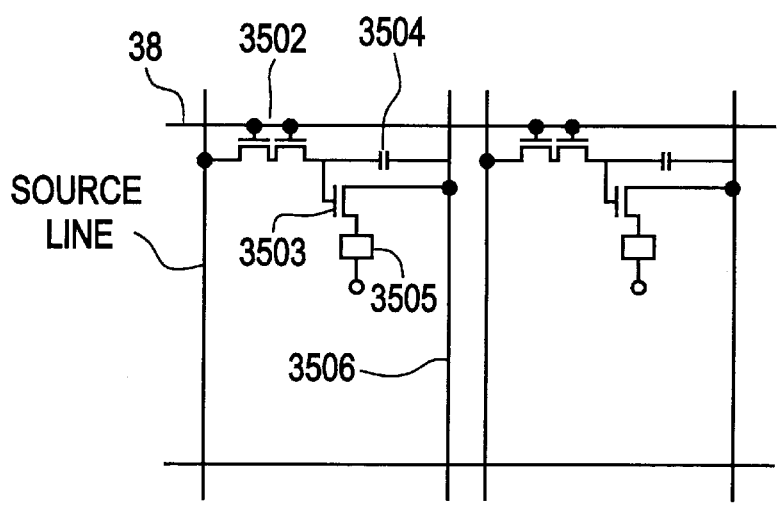

In this embodiment, the more detailed sectional structure of the pixel unit of an EL display panel is shown in FIG. 27, the top plan structure thereof is shown in FIG. 28A, and the circuit diagram is shown in FIG. 28B. Since common reference numerals are used in FIGS. 27, 28A and 28B, they may be referred to one another.

In FIG. 27, a switching TFT 3502 provided on a substrate 3501 is formed by the use of N-channel TFTS. Although a double-gate structure is employed in this embodiment, the structure itself and a fabricating process therefor do not differ greatly from the foregoing and shall not be explained more. However, the double-gate structure is, in effect, a structure in which two TFTs are connected in series, and it has the advantage that the magnitude of an OFF current can be diminished. Incidentally, the TFT 3502 has the double-gate structure in this embodiment, but it is also allowed to employ a single-gate structure or to employ a triple-gate structure or a multigate structure having a larger number of gates. Moreover, the TFT 3502 may well be formed by the use of P-channel TFTs.

Meanwhile, a current controlling TFT 3503 is formed using the N-channel TFT. On this occasion, the drain wiring line 35 of the switching TFT 3502 is electrically connected to the gate electrode 37 of the current controlling TFT 3503 by a wiring line 36. Besides, a wiring line indicated by numeral 38 is a gate wiring line that electrically connects the gate electrodes 39a, 39b of the switching TFT 3502.

Since the current controlling TFT 3503 is an element for controlling the quantity of current to flow through an EL element, a large amount of current flows through the TFT, and hence, this TFT is an element which is highly prone to degrade due to heat and hot carriers. It is therefore very effective to adopt the structure in which LDD regions are provided on the drain side of the current controlling TFT so as to be overlapped by the gate electrode through a gate insulating film.

Besides, the current controlling TFT 3503 is illustrated as a single-gate structure in this embodiment, it may well have a multigate structure in which a plurality of TFTs are connected in series. Further, it is allowed to employ a structure in which a plurality of TFTs are connected in parallel so as to, in effect, divide a channel forming region into a plurality of regions, whereby heat can be radiated at a high efficiency. Such a structure is effective as a measure against the thermal degradation.

Moreover, as shown in FIG. 28A, a wiring line to serve as the gate electrode 37 of the current controlling TFT 3503 overlaps the drain wiring line 40 of the current controlling TFT 3503 through an insulating film in a region indicated by numeral 3504. On this occasion, a capacitor is formed in the region indicated by numeral 3504. The capacitor 3504 functions to hold a voltage applied to the gate of the current controlling TFT 3503. By the way, the drain line 40 is connected to a current feedline (supply voltage line) 3506, and a predetermined voltage is always kept applied to the wiring line 40.

The switching TFT 3502 and the current controlling TFT 3503 are overlaid with a first passivation film 41, which is further overlaid with a flattening film 42 made of a resin insulating film. It is very important to flatten stepped structures ascribable to the TFTs, by the use of the flattening film 42. Since an EL layer to be formed later is very thin, it sometimes incur inferior luminescence on account of the existence of any stepped structure. Accordingly, the stepped structures should desirably be flattened before the formation of a pixel electrode so that the EL layer can be formed into the flattest possible surface.

Numeral 43 designates the pixel electrode (cathode of the EL element) which is made of a conductive film of high reflectivity, and which is electrically connected to the drain of the current controlling TFT 3503. A conductive film of low resistance, such as an aluminum alloy film, a copper alloy film or a silver alloy film, or a stacked film of such films should favorably be employed as the pixel electrode 43. It is, of course, allowed to employ a stacked structure with any other conductive film.

Besides, a luminescent layer 45 is formed in a groove (corresponding to a pixel) defined by banks 44a, 44b formed of an insulating film (preferably, of resin). Incidentally, although only one pixel is shown here, luminescent layers corresponding to the respective colors, R (red), G (green) and B (blue) may well be separately formed. An organic EL material for the luminescent layer is a $\pi$ conjugate polymer system material. Mentioned as typical polymer system materials are polyparaphenylene vinylene (PPV) system, polyvinyl carbazole (PVK) system, polyfluorene system, etc.

Incidentally, the PPV system organic EL materials include various types. It is allowed to employ any of materials stated in, for example, H. Shenk, H. Becker, O. Gelsen, E. Kluge, W. Kreuder, and H. Spreitzer: "Polymers for Light Emitting Diodes", Euro Display, Proceedings, 1999, pp.33–37, and the Japanese Patent Application Laid-open No. 10-92576 (1998).

As practicable luminescent layers, it is allowed to employ cyanopolyphenylene vinylene for the luminescent layer luminescing in red, polyphenylene vinylene for the luminescent layer luminescing in green, and polyphenylene vinylene or polyalkyl phenylene for the luminescent layer luminescing in blue. The thickness of each luminescent layer may be set at 30 through 150 nm (preferably, 40 through 100 nm).

However, the above materials are mere examples of the organic EL materials that can be employed for the luminescent layers, and the luminescent layers need not be restricted to the above materials at all. The EL layer (a layer which is caused to luminesce and to migrate carriers for the luminescence) may be formed by combining the luminescent layer, the charge transport layer and the charge injection layer at will.

By way of example, the example employing the polymer system material for the luminescent layer has been mentioned in this embodiment, but a low-molecular organic EL material may well be used. It is also possible to employ any of inorganic materials, such as silicon carbide, for the charge transport layer or the charge injection layer. Known materials can be used as the organic EL materials and the inorganic materials.

In this embodiment, the EL layer has a stacked structure in which the luminescent layer 45 is overlaid with a hole injection layer 46 made of PEDOT (polythiophene) or PAni (polyaniline). Further, the hole injection layer 46 is overlaid with an anode 47 made of a transparent conductive film. In the case of this embodiment, light generated by the luminescent layer 45 is radiated toward the upper surface side of the EL display panel (upward of the TFT), and hence, the anode must transmit the light. The compound of indium oxide and tin oxide, or the compound of indium oxide and zinc oxide can be used for the transparent conductive film. Since, however, the anode is formed after having formed the luminescent layer and the hole injection layer of low thermal resistances, it should favorably be a material that can be formed at the lowest possible temperature.

The EL element 3505 is finished up at the point of time at which the anode 47 has been formed. By the way, the expression "EL element 3505" here signifies a capacitor which is formed of the pixel electrode (cathode) 43, luminescent layer 45, hole injection layer 46 and anode 47. Since the area of the pixel electrode 43 substantially agrees with that of the pixel as illustrated in FIG. 28A, the whole pixel functions as the EL element. Accordingly, the efficiency of utilization of the luminescence is very high, and a bright image display becomes possible.

Meanwhile, in this embodiment, the anode 47 is further overlaid with a second passivation film 48. A silicon nitride film or a silicon nitride oxide film is favorable as the second passivation film 48. The second passivation film 48 is intended to isolate the EL element from the exterior, and it has both the significance of preventing the organic EL material from degrading due to oxidation, and the significance of suppressing the escape of gases from the organic EL material. Thus, the reliability of the EL display panel is enhanced.

As described above, the EL display panel according to the present invention has the pixel unit which is configured of pixels of the structure as shown in FIG. 27, and it includes the switching TFTs whose OFF currents are sufficiently low, as well as the current controlling TFTs which are immune against the injection of hot carriers. It is accordingly possible to obtain the EL display panel which has a high reliability and which is capable of presenting a good image display.

It is also effective to employ the EL display panel of this embodiment as the display unit of each of the electronic equipment in Embodiment 6.

(Embodiment 12)

Figure 29:
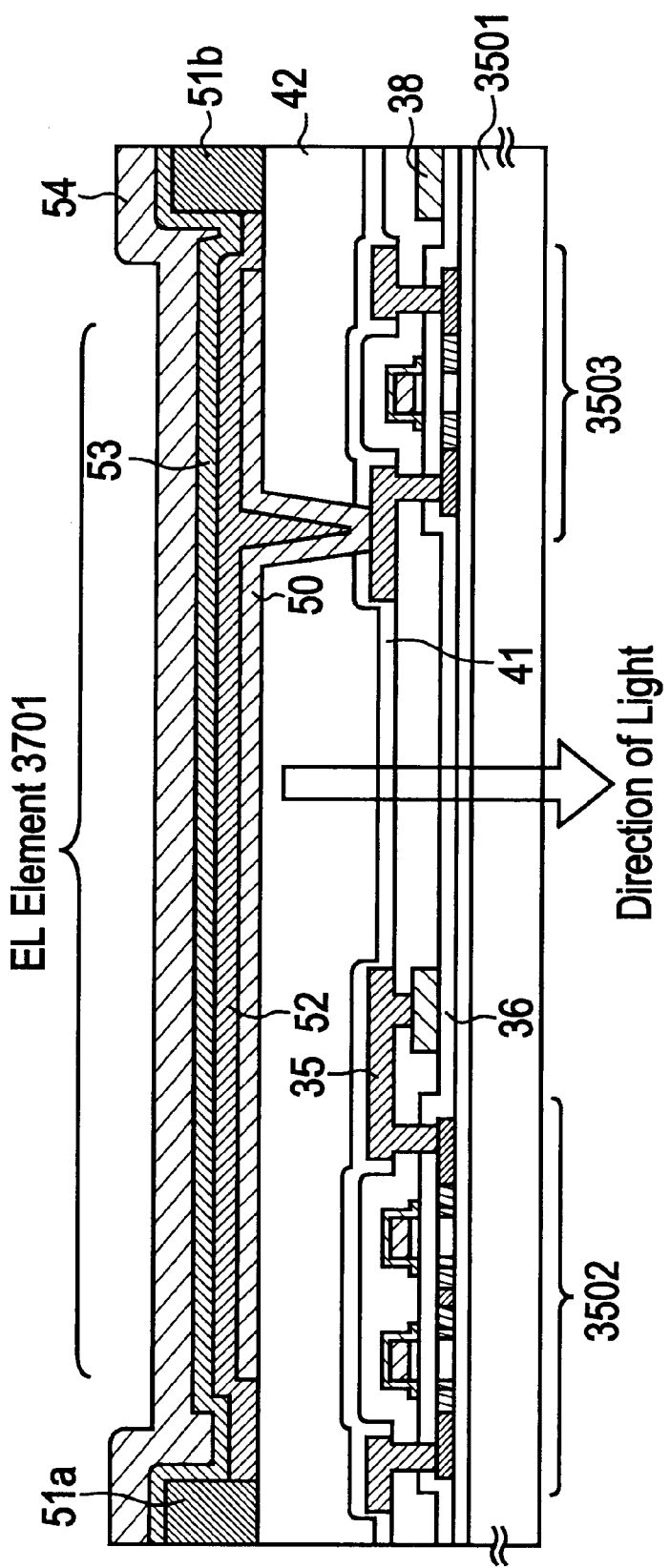
FIG. 29 is a sectional view of yet another example of the active matrix type EL panel of the present invention (Embodiment 12)

In this embodiment, there will be described a structure in which the structure of the EL element 3505 is inverted in the pixel unit explained in Embodiment 11. Reference will be had to FIG. 29. Incidentally, since the points of difference from the structure of FIG. 27 are only the portion of the EL element and the current controlling TFT, the others shall be omitted from description.

Referring to FIG. 29, the current controlling TFT 3503 is formed using the P-channel TFT.

In this embodiment, a transparent conductive film is employed as a pixel electrode (anode) 50. Concretely, the conductive film is made of the compound of indium oxide and zinc oxide. Of course, it is also allowed to employ a conductive film made of the compound of indium oxide and tin oxide.

After banks 51a, 51b made of an insulating film have been formed; a luminescent layer 52 made of polyvinyl carbazole is formed by solution coating. The luminescent layer 52 is successively overlaid with an electron injection layer 53 made of potassium acetylacetonate (expressed as "acacK"), and a cathode 54 made of an aluminum alloy. In this case, the cathode 54 functions also as a passivation film. Thus, an EL element 3701 is finished up.

In the case of this embodiment, light generated by the luminescent layer 52 is radiated toward the substrate formed with the TFTs, as indicated by an arrow.

It is also effective to employ the EL display panel of this embodiment as the display unit of each of the electronic equipment in Embodiment 6.

(Embodiment 13)

In this embodiment, examples in the case where pixels have structures different from the structure shown in the circuit diagram of FIG. 28B will be described with reference to FIGS. 30A, 30B and 30C. In this embodiment, numeral 3801 designates the source wiring line of a switching TFT 3802, numeral 3803 designates the gate wiring line of the switching TFT 3802, numeral 3804 designates a current controlling TFT, numeral 3805 designates a capacitor, numerals 3806, 3808 designate current feed lines, and numeral 3807 designates an EL element.

Figure 30A:
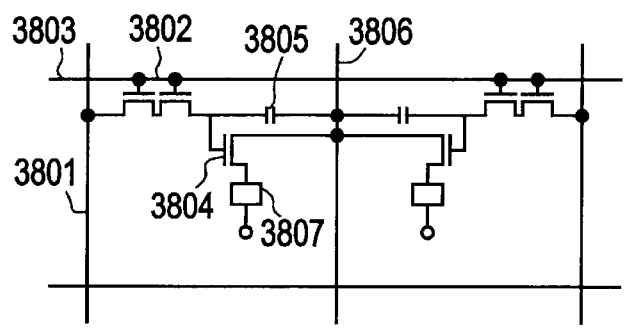
FIGS. 30A, 30B and 30C are circuit diagrams for explaining different examples of the active matrix type EL panel of the present invention, respectively (Embodiment 13).

The example shown in FIG. 30A corresponds to a case where the current feed line 3806 is shared between two pixels. That is, this example features the point that the two pixels are formed in line symmetry with respect to the current feed line 3806. In this case, the number of supply voltage feed lines can be decreased, so that the pixel unit can be made still higher in definition.

Figure 30B:
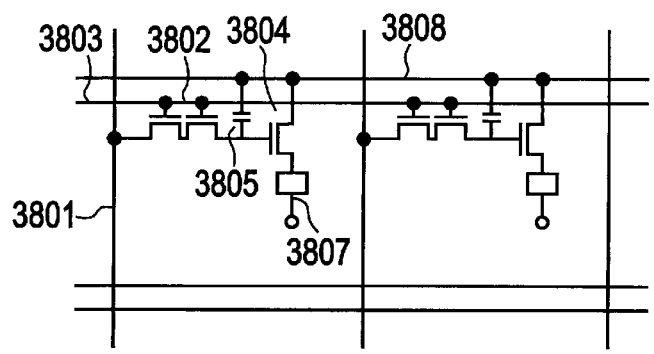

Besides, the example shown in FIG. 30B corresponds to a case where the current feed line 3808 is laid in parallel with the gate wiring line 3803. By the way, in the structure of FIG. 30B, the current feed line 3808 and the gate wiring line 3803 are laid so as not to overlap each other. However, if both the wiring lines are formed in different layers, they can be laid so as to overlap each other through an insulating film. In this case, both the supply voltage feed line 3808 and the gate wiring line 3803 can have a common occupation area, so that the pixel unit can be made still higher in definition.

Figure 30C:
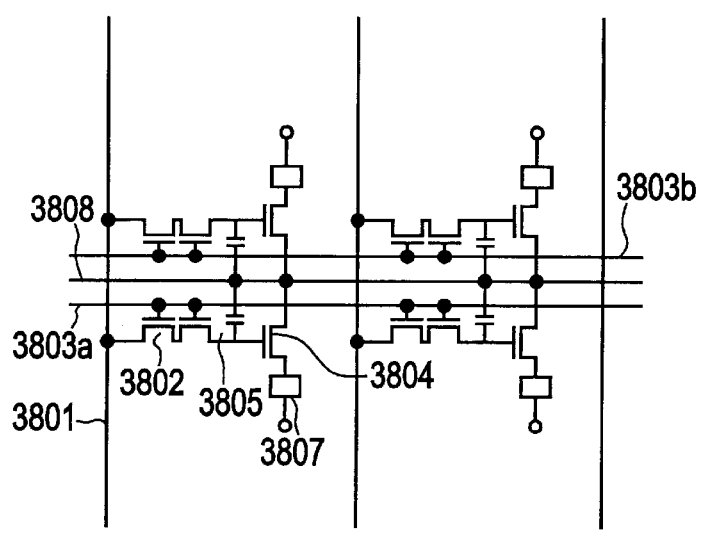

In addition, the example shown in FIG. 30C features the point that the current feed line 3808 is laid in parallel with the gate wiring line 3803 in the same manner as in the structure of FIG. 30B, and the point that two pixels are formed in line symmetry with respect to the current feed line 3808. It is also effective that the current feed line 3808 is laid so as to overlap either of the gate wiring lines 3803a, 3803b. In this case, the number of supply voltage feed lines can be decreased, so that the pixel unit can be made still higher in definition.

By the way, the construction of this embodiment can be performed in combination with the construction of Embodiment 9 or 10 at will. It is also effective to employ the EL display panel having the pixel structure of this embodiment, as the display unit of each of the electronic equipment in Embodiment 6.

(Embodiment 14)

In the structure shown in FIGS. 28A and 28B referred to in Embodiment 11, the capacitor 3504 is provided in order to hold the voltage applied to the gate of the current controlling TFT 3503, but the capacitor 3504 can be dispensed with. In the case of Embodiment 11, the current controlling TFT 3503 includes the LDD regions disposed so as to be overlapped by the gate electrode through the gate insulating film. In general, a parasitic capacitance called "gate capacitance" is formed in each of the overlapped regions. This embodiment features the point that the parasitic capacitances are positively utilized as a substitute for the capacitor 3504.

The magnitude of the parasitic capacitance depends upon the overlapping area between the gate electrode and each of the LDD regions. It is therefore determined by the length of each LDD region included in the overlapping region.

It is also possible to similarly dispense with the capacitor 3805 in each of the structures of FIGS. 30A, 30B and 30C referred to in Embodiment 13.

By the way, the construction of this embodiment can be performed in combination with the constructions of Embodiments 9 through 13 at will. It is also effective to employ the EL display panel having the pixel structure of this embodiment, as the display unit of each of the electronic equipment in Embodiment 6.

The present invention brings forth effects as mentioned by way of example below.

A serial-to-parallel conversion (SPC) circuit for digital data according to the present invention requires only clock signals at frequencies which are, at the highest, half of the frequency of the digital data to-be-inputted. Therefore, the SPC circuit of the present invention is more excellent in stability and reliability as compared with a prior-art conversion circuit.

Moreover, the SPC circuit of the present invention is smaller in the numbers of constituent elements and wiring lines and smaller in area than the serial-to-parallel conversion circuit for digital data in the prior art. It is therefore possible to make smaller the size of an active matrix type semiconductor display device that adopts the SPC circuit of the present invention.

What is claimed is:

1. A serial-to-parallel conversion circuit for digital data which converts digital data inputted serially at m Hz into $2^y$ parallel digital data of $(m \cdot 2^{-y})$ Hz and outputs the $2^y$ parallel digital data, where letter m denotes a positive number and letter y denotes a natural number;

wherein said serial-to-parallel conversion circuit for digital data operates with a plurality of clock signals and inverted clock signals of said plurality of clock signals of, at the highest (m/2) Hz, and wherein said serial-to-parallel conversion circuit for digital data is connected to a clock generator which outputs said plurality of clock signals and said inverted clock signals of, at the highest (m/2) Hz, and wherein said serial-to-parallel conversion circuit is connected to 2y digital data rearrangement switches.

2. A serial-to-parallel conversion circuit for digital data which converts digital data inputted serially at m Hz into $2^y$ parallel digital data of $(m \cdot 2^{-y})$ Hz and outputs the $2^y$ parallel digital data, where letter m denotes a positive number and letter y denotes a natural number;

wherein said serial-to-parallel conversion circuit for digital data operates with a plurality of clock signals and inverted clock signals of said plurality of clock signals of, at the highest, (m/2) Hz and at the lowest, $(m \cdot 2^{-y})$ Hz, and wherein said serial-to-parallel conversion circuit for digital data is connected to a clock generator which outputs said plurality of clock signals and said inverted clock signals of, at the highest (m/2) Hz, and wherein said serial-to-parallel conversion circuit is connected to 2y digital data rearrangement switches.

3. A serial-to-parallel conversion circuit for digital data which converts digital data of respective bits of the x-bit digital data inputted serially at m Hz into $2^y$ parallel digital data of $(m \cdot 2^{-y})$ Hz and outputs the $2^y$ parallel digital data, where letter m denotes a positive number and letters x and y denotes natural numbers;

wherein said serial-to-parallel conversion circuit for digital data comprises x SPC/bit circuits to which the digital data of the respective bits of said x-bit digital data are inputted, wherein each of said SPC/bit circuits includes first through y-th stage circuits, and wherein the y-th stage circuit lowers a frequency of $2^{y-1}$ digital data inputted serially to ½ and converts the $2^{y-1}$ digital data into $2^y$ parallel digital data, and wherein said serial-to-parallel conversion circuit for digital data is connected to a clock generator which outputs a plurality of clock signals and inverted clock signals of said plurality of clock signals of, at the highest (m/2) Hz, and wherein said serial-to-parallel conversion circuit is connected to 2y digital data rearrangement switches.

4. A serial-to-parallel conversion circuit for digital data which converts digital data of respective bits of the x-bit digital data inputted serially at m Hz into $2^y$ parallel digital data of $(m \cdot 2^{-y})$ Hz and outputs the $2^y$ parallel digital data, where letter m denotes a positive number and letters x and y denotes natural numbers;

wherein said serial-to-parallel conversion circuit for digital data comprises x SPC/bit circuits to which the digital data of the respective bits of said x-bit digital data are inputted, wherein each of said SPC/bit circuits includes basic units in a number indicated by Formula (1) given below, and wherein each of said basic units in the number indicated by Formula (1) lowers a frequency of digital data inputted serially to ½ and converts the digital data inputted serially into two parallel digital data, and $$\sum_{k=1}^{y} 2^{k-1} \tag{1}$$

wherein said serial-to-parallel conversion circuit for digital data is connected to a clock generator which outputs a plurality of clock signals and inverted clock signals of said plurality of clock signals of, at the highest (m/2) Hz, and wherein said serial-to-parallel conversion circuit is connected to 2y digital data rearrangement switches.

5. A semiconductor display device comprising:

an active matrix circuit in which pixel TFTs are arranged in a matrix shape;

a source signal line driver circuit and a gate signal line driver circuit for driving the active matrix circuit; and a serial-to-parallel conversion circuit for digital data which converts the digital data inputted serially at m Hz into $2^y$ parallel digital data of $(m \cdot 2^{-y})$ Hz and outputs the $2^y$ parallel digital data, where letter m denotes a positive number and letter y denotes a natural number;

wherein said semiconductor display device operates with a plurality of clock signals and inverted clock signals of said plurality of clock signals of, at the highest, (m/2) Hz, wherein said serial-to-parallel conversion circuit for digital data is connected to a clock generator which outputs said plurality of clock signals and inverted clock signals of, at the highest (m/2) Hz, and wherein said serial-to-parallel conversion circuit is connected to the source signal line driver circuit through 2y digital data rearrangement switches.

6. A semiconductor display device comprising:

an active matrix circuit in which pixel TFTs are arranged in a matrix shape, a source signal line driver circuit and a gate signal line driver circuit for driving the active matrix circuit; and a serial-to-parallel conversion circuit for digital data which converts the digital data inputted serially at m Hz into $2^y$ parallel digital data of $(m \cdot 2^{-y})$ Hz and outputs the $2^y$ parallel digital data, where letter m denotes a positive number and letter y denotes a natural number;

wherein said semiconductor display device operates with a plurality of clock signals and inverted clock signals of said plurality of clock signals of, at the highest (m/2) Hz and at the lowest, $(m \cdot 2^{-y})$ Hz, and wherein said serial-to-parallel conversion circuit for digital data is connected to a clock generator which outputs said plurality of clock signals and inverted clock signals of, at the highest (m/2) Hz, wherein said serial-to-parallel conversion circuit is connected to the source signal line driver circuit through 2y digital data rearrangement switches.

7. A semiconductor display device comprising:

an active matrix circuit in which pixel TFTs are arranged in a matrix shape, a source signal line driver circuit and a gate signal line driver circuit for driving the active matrix circuit, and a serial-to-parallel conversion circuit for digital data which converts digital data of respective bits of the x-bit digital data inputted serially at m Hz into $2^y$ parallel digital data of $(m \cdot 2^{-y})$ Hz and outputs the $2^y$ parallel digital data, where letter m denotes a positive number and letters x and y denote natural numbers;

wherein said serial-to-parallel conversion circuit for digital data includes x SPC/bit circuits to which the digital data of the respective bits of said x-bit digital data are inputted, wherein each of said SPC/bit circuits includes first through y-th stage circuits, and wherein the y-th stage circuit lowers a frequency of $2^{y-1}$ digital data inputted serially to ½ and converts the $2^{y-1}$ digital data inputted serially into the $2^y$ parallel digital data, and wherein said serial-to-parallel conversion circuit for digital data is connected to a clock generator which outputs a plurality of clock signals and inverted clock signals of said plurality of clock signals of, at the highest (m/2) Hz, and wherein said serial-to-parallel conversion circuit is connected to the source signal line driver circuit through 2y digital data rearrangement switches.

8. A semiconductor display device comprising:

an active matrix circuit in which pixel TFTs are arranged in a matrix shape;

a source signal line driver circuit and a gate signal line driver circuit for driving the active matrix circuit, and a serial-to-parallel conversion circuit for digital data which converts digital data of respective bits of the x-bit digital data inputted serially at m Hz into $2^y$ parallel digital data of $(m \cdot 2^{-y})$ Hz outputs the $2^y$ parallel digital data, where letter m denotes a positive number and letters x and y denote natural numbers;

said serial-to-parallel conversion circuit for digital data including x SPC/bit circuits to which the digital data of the respective bits of said x-bit digital data are inputted, each of said SPC/bit circuits including basic units in a number indicated by Formula (1) given below, and each of said basic units in the number indicated by Formula (1) lowering a frequency of digital data inputted serially to ½ and converts the digital data inputted serially into two parallel digital data, and $$\sum_{k=1}^{y} 2^{k-1} \qquad (1)$$

wherein said serial-to-parallel conversion circuit for digital data is connected to a clock generator which outputs a plurality of clock signals and inverted clock signals of said plurality of clock signals of, at the highest (m/2) Hz, and wherein said serial-to-parallel conversion circuit is connected to the source signal line driver circuit 2y digital data rearrangement switches.

* * * * *

UNITED STATES PATENT AND TRADEMARK OFFICE
CERTIFICATE OF CORRECTION

PATENT NO. : 6,750,792 B2
DATED : June 15, 2004
INVENTOR(S) : Munehiro Azami et al.

It is certified that error appears in the above-identified patent and that said Letters Patent is hereby corrected as shown below:

Column 14,
Line 32, please replace "FIGS. 13A-13E" with -- FIGS. 13A-13C --.

Signed and Sealed this

Twenty-first Day of June, 2005

JON W. DUDAS
*Director of the United States Patent and Trademark Office*